United States Patent
Li et al.

(10) Patent No.: US 8,535,566 B2
(45) Date of Patent: Sep. 17, 2013

(54) SILICON CARBIDONITRIDE BASED PHOSPHORS AND LIGHTING DEVICES USING THE SAME

(75) Inventors: Yuanqiang Li, Plainsboro, NJ (US); Michael Dennis Romanelli, North Plainfield, NJ (US); Yongchi Tian, Princeton Junction, NJ (US)

(73) Assignee: Lightscape Materials, Inc., Princeton, NJ (US)

( * ) Notice: Subject to any disclaimer, the term of this patent is extended or adjusted under 35 U.S.C. 154(b) by 165 days.

(21) Appl. No.: 13/164,623

(22) Filed: Jun. 20, 2011

(65) Prior Publication Data

US 2012/0062105 A1  Mar. 15, 2012

Related U.S. Application Data

(60) Provisional application No. 61/381,862, filed on Sep. 10, 2010, provisional application No. 61/441,977, filed on Feb. 11, 2011.

(51) Int. Cl.
*C09K 11/08* (2006.01)
*C09K 11/66* (2006.01)

(52) U.S. Cl.
USPC .............................. 252/301.4 F; 252/301.6 F

(58) Field of Classification Search
USPC ........ 252/301.4 R, 301.6 R, 301.6 F, 301.4 F, 252/301.4 H
See application file for complete search history.

(56) References Cited

U.S. PATENT DOCUMENTS

| | | | |
|---|---|---|---|
| 7,138,756 B2 | 11/2006 | Gotoh et al. | |
| 7,252,788 B2 | 8/2007 | Nagatomi et al. | |
| 7,258,816 B2 | 8/2007 | Tamaki et al. | |
| 7,273,568 B2 | 9/2007 | Nagatomi et al. | |
| 7,902,564 B2 | 3/2011 | Mueller-Mach et al. | |
| 7,964,113 B2 | 6/2011 | Tamaki et al. | |
| 8,007,683 B2 | 8/2011 | Starick et al. | |
| 8,105,502 B2 * | 1/2012 | Fukuda et al. | 252/301.4 R |
| 8,119,028 B2 | 2/2012 | Le Toquin | |
| 8,148,887 B2 | 4/2012 | Hirosaki et al. | |
| 8,159,126 B2 | 4/2012 | Schmidt et al. | |
| 8,206,611 B2 | 6/2012 | Hirosaki et al. | |
| 2007/0007494 A1 | 1/2007 | Hirosaki et al. | |
| 2009/0072195 A1 * | 3/2009 | Fukuda et al. | 252/301.4 F |
| 2009/0283721 A1 | 11/2009 | Liu et al. | |
| 2009/0309485 A1 * | 12/2009 | Tamaki et al. | 313/503 |
| 2010/0213489 A1 | 8/2010 | Kim et al. | |
| 2010/0288972 A1 * | 11/2010 | Roesler et al. | 252/301.4 F |
| 2011/0204769 A1 | 8/2011 | Fukuda et al. | |
| 2011/0279016 A1 | 11/2011 | Li et al. | |
| 2011/0279017 A1 | 11/2011 | Li et al. | |

OTHER PUBLICATIONS

Copending U.S. Appl. No. 13/557,613.
Copending U.S. Appl. No. 13/548,492.
Copending U.S. Appl. No. 13/597,633.
Copending U.S. Appl. No. 13/597,739.
Copending U.S. Appl. No. 13/601,489.

\* cited by examiner

*Primary Examiner* — Emily Le
*Assistant Examiner* — Lynne Edmondson
(74) *Attorney, Agent, or Firm* — Thomas S. Deibert

(57) ABSTRACT

Disclosed herein are novel families of silicon carbidonitride phosphor compositions. In certain embodiments, optimal ranges of carbon content have been identified which provide excellent luminescence and thermal stability characteristics.

47 Claims, 44 Drawing Sheets

US 8,535,566 B2

SILICON CARBIDONITRIDE BASED PHOSPHORS AND LIGHTING DEVICES USING THE SAME

CLAIM OF PRIORITY

This application claims priority to U.S. Provisional Application No. 61/381,862, filed Sep. 10, 2010, and U.S. Provisional Application No. 61/441,977, filed Feb. 11, 2011, the disclosures of which are hereby incorporated by reference in their entireties.

GOVERNMENT FUNDING

This invention was made with U.S. Government support under Department of Energy grant number DE-EE0003245. The U.S. Government may have certain rights in this invention.

STATEMENT REGARDING REFERENCES

All patents, publications, and non-patent references referred to herein shall be considered incorporated by reference into this application in their entireties.

BACKGROUND OF INVENTION

In recent years, R&D efforts have been intense on both LED chip and phosphors for phosphor-converted LED (pcLED), with the result that both efficient high-power LEDs and efficient phosphors have been demonstrated. However, a unique aspect of the phosphors operating in pcLED is that the phosphors are in close vicinity of the LED chip, and the LEDs operate at high temperatures. Typical junction temperatures of high power LEDs are in the range of 100° C.-150° C. At these temperatures, the crystal of the phosphor is at a high vibrationally excited state, causing the excitation energy to be directed to heat emission through lattice relaxation rather than to the desired luminescence emission. Moreover, these lattice relaxations produce heating with vibrational excitation, and thereby further reduce the luminescence emission efficiency. This is a vicious cycle that precludes successful applications of existing phosphor materials. The pcLED lamp for general illumination application requires high optical energy flux (e.g., higher than 1 Watt/mm$^2$), which causes additional heating by a Stokes shift generated inside the phosphor crystals. Successful development of pcLED lamps for general illumination, therefore, requires phosphors that can operate highly efficiently at temperatures of 100° C.-150° C. The risk is that it is difficult both to achieve 90% quantum yield at room temperature and to have high thermal stability at 100° C.-150° C. The thermal stability of a phosphor's luminescence is an intrinsic property of the phosphor which is determined by the composition and the structure of the crystalline material.

Nitride and oxynitride phosphors have been used in pcLEDs because of their excellent luminescence performance at the high temperature range mentioned above. Prominent examples include metal silicon nitride based phosphors and the sialon-based phosphors. The host crystals of these phosphor materials consist mainly of chemical bonds of Si—N, Al—N, Si—O and Al—O, as well as hybrid bonds thereof, as the backbone of the structure. While these bonds are stable, the chemical bond between silicon and carbon (Si—C) has a thermal and chemical stability superior to them. Furthermore, carbon forms very stable chemical bond with many metal atoms.

The introduction of carbon or carbide into crystalline phosphor materials, however, has previously been considered detrimental in luminescence performance. The often dark body color of various metal carbides may be a source of absorption or quenching of emission light. Also, residual unreacted carbon or carbide that remains in a phosphor preparation utilizing carbon or carbide as a precursor can hinder the emission intensity of the phosphor.

Carbidonitride phosphors can be comprised of carbon, silicon, germanium, nitrogen, aluminum, boron and other metals in the host crystal and one or more metal dopants as a luminescent activator. This class of phosphors has recently emerged as a color converter capable of converting near UV (nUV) or blue light to other light in the visible spectral range, e.g., blue, green, yellow, orange and red light. The host crystal of carbidonitride phosphors is comprised of —N—Si—C—, —N—Si—N—, and —C—Si—C— networks in which the strong covalent bonds of Si—C and Si—N serve as the main building blocks of the structure. Generically, the network structure formed by Si—C bonds has a strong absorption in the entire visible light spectral region, and therefore has been previously considered unsuitable for use in host materials for high efficiency phosphors.

It has now been discovered in this invention that in certain carbidonitride phosphor compositions, carbon actually enhances, rather than quenches, the luminescence of a phosphor, in particular at relatively high temperatures (e.g. 200° C.-400° C.). The invention demonstrates that the reflectance of certain silicon carbidonitride phosphors in the wavelength range of the desired emission spectrum increases as the amount of carbon increases within certain preferred ranges. These carbidonitride phosphors have excellent thermal stability of emission and high emission efficiency.

SUMMARY OF INVENTION

In certain embodiments, the present invention is directed to a novel family of silicon carbidonitride phosphors expressed by:

$$Sr_2Si_5N_{8-[(4x/3)+z]}C_xO_{3z/2}:A \qquad (1)$$

wherein $0<x\leq5$, $0\leq z\leq3$, and $[(4x/3)+z]<8$. A comprises a luminescence activator doped in the host crystal lattice at a concentration level from about 0.0001 mol % to about 50 mol %, preferably from about 0.001 mol % to about 20 mol %, relative to the mole amount of Sr. A can comprise at least one metal ion selected from the group including Ce, Pr, Nd, Sm, Eu, Gd, Tb, Dy, Er, Tm, Yb, Lu, Mn, Bi, Sb, or a combination thereof, preferably $Eu^{2+}$, $Ce^{3+}$, $Tb^{3+}$, $Yb^{2+}$ and $Mn^{2+}$, or a combination thereof.

In certain embodiments, the present invention is directed to a composition comprising a silicon carbidonitride phosphor of formula (1) above. In certain embodiments, the composition further comprises one or more additional phosphors. In certain embodiments, the phosphor comprises a crystal of an orthorhombic or monoclinic system.

In certain embodiments, the present invention is directed to a novel family of silicon carbidonitride phosphors expressed by:

$$M(II)_2Si_5N_{8-[(4x/3)+z]}C_xO_{3z/2}:A \qquad (2)$$

wherein $0<x\leq5$, $0\leq z\leq3$, and $[(4x/3)+z]<8$. M(II) comprises at least one divalent cation, and may be selected from, but not limited to, the group including Be, Mg, Ca, Sr, Ba, Cu, Co, Ni, Pd, Zn, Cd and other divalent transition metal ions, or a combination thereof, preferably from the group including Ca, Sr, Ba and other alkaline earth metal ions, or a combination thereof. In certain embodiments, M(II) comprises two or more divalent cations. A comprises a luminescence activator doped in the host crystal lattice at a concentration level from about 0.0001 mol % to about 50 mol %, preferably from about 0.001 mol % to about 20 mol %, relative to the mole amount of M(II). A can comprise at least one metal ion selected from the group including Ce, Pr, Nd, Sm, Eu, Gd, Tb, Dy, Ho, Er, Tm, Yb, Lu, Mn, Bi, Sb, or a combination thereof, preferably $Eu^{2+}$, $Ce^{3+}$, $Tb^{3+}$, $Yb^{2+}$ and $Mn^{2+}$, or a combination thereof.

In certain embodiments, the present invention is directed to a composition comprising a silicon carbidonitride phosphor of formula (2) above. In certain embodiments, the composition comprises one or more additional phosphors. In certain embodiments, the phosphor comprises a crystal of an orthorhombic or monoclinic system.

In certain embodiments, the present invention is directed to a novel family of silicon carbidonitride phosphors expressed by:

$$M(II)_{2-w}M(I)_{2w}Si_5N_{8-[(4x/3)+z]}C_xO_{3z/2}:A \qquad (3)$$

wherein $0<x\leq5$, $0\leq w\leq0.6$, $0\leq z\leq3$, and $[(4x/3)+z]<8$. M(II) comprises at least one divalent cation, and may be selected from, but not limited to, the group including Be, Mg, Ca, Sr, Ba, Cu, Co, Ni, Pd, Zn, Cd and other divalent transition metal ions, or a combination thereof, preferably from the group including Ca, Sr, Ba and other alkaline earth metal ions, or a combination thereof. In certain embodiments, M(II) comprises two or more divalent cations. M(I) comprises at least one monovalent cation, and may be selected from, but not limited to, the group including Li, Na, K, Rb, Cu, Ag and Au, or a combination thereof, preferably from the group including Li, Na, and K, or a combination thereof. In certain embodiments, M(I) comprises two or more monovalent cations. In order to compensate for the evaporation of M(I) at high temperature in firing processes, extra M(I) has been designed in this formulation. A comprises a luminescence activator doped in the host crystal lattice at the concentration level, from about 0.0001 mol % to about 50 mol %, preferably from about 0.001 mol % to about 20 mol %, relative to total mole amount of M(II) and M(I). A can comprise at least one metal ion selected from the group including Ce, Pr, Nd, Sm, Eu, Gd, Tb, Dy, Ho, Er, Tm, Yb, Lu, Mn, Bi, Sb, or a combination thereof, preferably $Eu^{2+}$, $Ce^{3+}$, $Tb^{3+}$, $Yb^{2+}$ and $Mn^{2+}$, or a combination thereof.

In certain embodiments, the present invention is directed to a composition comprising a silicon carbidonitride phosphor of formula (3) above. In certain embodiments, the composition comprises one or more additional phosphors. In certain embodiments, the phosphor comprises a crystal of an orthorhombic or monoclinic system.

In certain embodiments, the present invention is directed to a novel family of silicon carbidonitride phosphors expressed by:

$$M(II)_{2-w}M(I)_{2w}Si_{5-m}M(III)_mN_{8-[(4x/3)+z+m]}C_x\\O_{(3z/2)+m}:A \qquad (4)$$

wherein $0<x\leq5$, $0\leq w\leq0.6$, $0\leq z\leq3$, $0\leq m<2$, and $[(4x/3)+z+m]<8$. M(II) comprises at least one divalent cation, and may be selected from, but not limited to, the group including Be, Mg, Ca, Sr, Ba, Cu, Co, Ni, Pd, Zn, Cd and other divalent transition metal ions, or a combination thereof, preferably from the group including Ca, Sr, Ba and other alkaline earth metal ions, or a combination thereof. In certain embodiments, M(I) comprises two or more divalent cations. M(I) comprises at least one monovalent cation, and may be selected from, but not limited to, the group including Li, Na, K, Rb, Cu, Ag and Au, or a combination thereof, preferably from the group including Li, Na, and K, or a combination thereof. In certain embodiments, M(I) comprises two or more monovalent cations. In order to for compensate the evaporation of M(I) at high temperature in firing processes, extra M(I) has been designed in this formulation. M(III) comprises at least one trivalent cation, and may be selected from, but not limited to, the group including B, Al, Ga, In, Sc, Y, or a combination thereof, preferably from the group including Al, Ga, and B, or a combination thereof. In certain embodiments, M(III) comprises two or more trivalent cations. A comprises a luminescence activator doped in the host crystal lattice at the concentration of from 0.0001 mol % to about 50 mol %, preferably from about 0.001 mol % to about 20 mol %, relative to the total mole amount of M(II) and M(I). A can comprise at least one metal ion selected from the group including Ce, Pr, Nd, Sm, Eu, Gd, Tb, Dy, Ho, Er, Tm, Yb, Lu, Mn, Bi, and Sb, or a combination thereof, preferably $Eu^{2+}$, $Ce^{3+}$, $Tb^{3+}$, $Yb^{2+}$ and $Mn^{2+}$, or a combination thereof.

In certain embodiments, the present invention is directed to a composition comprising a silicon carbidonitride phosphor of formula (4) above. In certain embodiments, the composition comprises one or more additional phosphors. In certain embodiments, the phosphor comprises a crystal of an orthorhombic or monoclinic system.

In certain embodiments, the present invention is directed to a novel family of carbidonitride phosphors expressed by:

$$M(II)_aM(I)_bM(III)_cD_dE_eC_fF_gH_h:A \qquad (5)$$

wherein $0<a<2$, $0\leq b\leq0.6$, $0\leq c<2$, $0<d\leq5$, $0<e\leq8$, $0<f\leq5$, $0\leq g<2.5$, and $0\leq h<0.5$. M(II) comprises at least one divalent cation, and may be selected from, but not limited to, the group including Be, Mg, Ca, Sr, Ba, Cu, Co, Ni, Pd, Zn, Cd and other divalent transition metal ions, or a combination thereof, preferably from the group including Ca, Sr, Ba and other alkaline earth metal ions, or a combination thereof. In certain embodiments, M(II) comprises two or more divalent cations. M(I) comprises at least one monovalent cation, and may be selected from, but not limited to, the group including Li, Na, K, Rb, Cu, Ag and Au, or a combination thereof, preferably from the group including Li, Na, and K, or a combination thereof. In certain embodiments, M(I) comprises two or more monovalent cations. M(III) comprises at least one trivalent cation, and may be selected from, but not limited to, the group including B, Al, Ga, In, Sc, Y, or a combination thereof, preferably from the group including Al, Ga, and B, or a combination thereof. In certain embodiments, M(III) comprises two or more trivalent cations. A comprises a luminescence activator doped in the host crystal lattice at the concentration of from 0.0001 mol % to about 50 mol %, preferably from about 0.001 mol % to about 20 mol %, relative to the total mole amount of M(II) and M(I). A can comprise at least one metal ion selected from the group including Ce, Pr, Nd, Sm, Eu, Gd, Tb, Dy, Ho, Er, Tm, Yb, Lu, Mn, Bi, and Sb, or a combination thereof, preferably $Eu^{2+}$, $Ce^{3+}$, $Tb^{3+}$, $Yb^{2+}$ and $Mn^{2+}$, or a combination thereof. D comprises at least one tetravalent cation selected from the group consisting of C, Si, Ge, Sn, Pb, Ti, Zr, and Hf. In preferred embodiments, D comprises Si. E comprises at least one trivalent anion selected from the group consisting of N, P, As, Sb, and Bi. In preferred embodiments, E comprises N. C comprises a tetravalent anion of carbon. F comprises at least one divalent anion selected from the group consisting of O, S, Se, and Te. In preferred embodiments, F comprises O. H comprises at least one monovalent anion selected from the group consisting of F, Cl, Br, and I. In preferred embodiments, H comprises F.

In certain embodiments, the present invention is directed to a composition comprising a phosphor of formula (5) above.

In certain embodiments, the composition comprises one or more additional phosphors. In certain embodiments, the phosphor comprises a crystal of an orthorhombic or monoclinic system.

In certain embodiments, the phosphors of the present invention emit light having a peak in wavelength range from about 400 nm to about 700 nm when excited by light having a peak in wavelength range from about 250 nm to about 500 nm.

In certain embodiments, the present invention is directed to a light emitting device comprising a light source emitting a first luminescence spectrum and a phosphor composition, which, when irradiated with light from the light source, emits light having a second luminescence spectrum. The phosphor composition of the light emitting device of the present invention can comprise at least one phosphor having a formula selected from formulas (1), (2), (3), (4) and (5) as described above.

In certain embodiments, the first luminescence spectrum has a peak in wavelength range from about 250 nm to about 700 nm. In certain embodiments, the first luminescence spectrum has a peak in wavelength range from about 400 nm to about 550 nm.

In certain embodiments, the light source is a light emitting diode or a laser diode.

In certain embodiments, the light emitting device further comprises one or more additional phosphors. In certain embodiments, the additional phosphor emits red, orange, yellow, green, or blue light when excited by a light source.

In certain embodiments, the light emitting device further comprises a second phosphor having a formula selected from the group consisting of $Ca_{1-x}Sr_xGa_2S_4:Eu^{2+}$ ($0 \leq x \leq 1$), $Ca_{1-x-y-z}Mg_xSr_yBa_zSiO_4:Eu^{2+}$ ($0 \leq x > 1$, $0 \leq y \leq 1$, $0 \leq z \leq 1$, $x+y+z \leq 1$), $BaMgAl_{10}O_{17}:Eu^{2+}$, $Mn^{2+}$, $MYSi_4N_7:Eu^{2+}$ (M=Ca, Sr, Ba), β-sialon:$Eu^{2+}$, $MSi_2O_2N_2:Eu^{2+}$ (M=Mg, Ca, Sr, Ba), $Ba_3Si_6O_{12}N_2:Eu^{2+}$, $M_2Si_5N_8:Ce^{3+}$ (M=Ca, Sr, Ba), $Y_2Si_4N_6C:Ce^{3+}$, α-sialon:$Yb^{2+}$ $(MSiO_3)_m.(SiO_2)_n:Eu^{2+}$, X (M=Mg, Ca, Sr, Ba; X=F, Cl, Br, I), where m is 1 or 0, and either (i) n>3 if m=1 or (ii) n=1 if m=0, $MAl_2O_4:Eu^{2+}$ (M=Mg, Ca, Sr, Ba), $BaMgAl_{10}O_{17}:Eu^{2+}$, $Y_3Al_5O_{12}:Ce^{3+}$, and α-sialon:$Eu^{2+}$.

In certain embodiments, the light emitting device further comprises a second phosphor having a formula selected from the group consisting of:

(a) $M(II)_aSi_bO_cN_dC_e:A$, wherein $6<a<8$, $8<b<14$, $13<c<17$, $5<d<9$, $0<e<2$;

(b) $M(II)_7Al_{12-x-y}Si_{x+y}O_{25-x}N_{x-y}C_y:A$, wherein $0<x \leq 12$, $0<y<x$, and $0<x+y \leq 12$;

(c) $M(II)_7M(III)_{12-x-y}Si_{x+y}O_{25-x}N_{x-y}C_y:A$, wherein $0<x<12$, $0 \leq x+y \leq 12$, and $0<y<x$;

(d) $M(II)_7M(III)_{12-x-y}Si_{x+y}O_{25-x \pm 3\delta/2}N_{x \mp \delta-y}C_y:A$, wherein $0<x<12$, $0 \leq y<x$, $0<x+y \leq 12$, $0<\delta \leq 3$, and $\delta<x+y$;

(e) $M(II)_7M(III)_{12-x-y}Si_{x+y}O_{25-x \pm \delta/2}N_{x \mp \delta-y}C_{y \pm \delta/2}:A$, wherein $0<x<12$, $0 \leq y<x$, $0<x+y \leq 12$, $0<\delta \leq 3$, and $\delta<x+y$;

(f) $M(II)_{7-y}M(I)_yM(III)_{12-x-y-z}Si_{x+y+z}O_{25-x \pm 3\delta/2}N_{x \mp \delta-z}C_z:A$, wherein $0<x<12$, $0 \leq y<x$, $0<z<x$, $0<x+y+z \leq 12$, $z<x+\delta$, and $0<\delta \leq 3$;

(g) $M(II)_{7-y}M(I)_yM(III)_{12-x-y-z}Si_{x+y+z}O_{25-x \pm \delta/2}N_{x \mp \delta-z}C_{z \pm \delta/2}:A$, wherein $0<x<12$, $0 \leq y<x$, $0<z<x$, $0<x+y+z \leq 12$, $z<x+\delta$, and $0<\delta \leq 3$;

(h) $M(II)_{7-y}M(I)_yM(III)_{12-x-y-z}Si_{x+y+z}O_{25-x \pm 3\delta/2-v/2}N_{x \mp \delta-z}C_zH_v:A$, wherein $0<x<12$, $0 \leq y<1$, $0<z<x$, $z<x+\delta$, $0<\delta \leq 3$, $0 \leq v<1$, and $0<x+y+z \leq 12$; and (i) $M(II)_{7-y}M(I)_yM(III)_{12-x-y-z}Si_{x+y+z}O_{25-x \pm 3\delta/2-v/2}N_{x \mp \delta-z}C_{z \pm \delta/2}H_v:A$, wherein $0<x<12$, $0 \leq y<1$, $0<z<x$, $z<x+\delta$, $0<\delta \leq 3$, $0 \leq v<1$, and $0<x+y+z \leq 12$;

wherein:
M(II) comprises at least one divalent cation;
M(I) comprises at least one monovalent cation;
M(III) comprises at least one trivalent cation;
H comprises at least one monovalent anion; and
A comprises a luminescence activator doped in the host crystal.

In certain embodiments, the light emitting device of the present invention comprises at least two additional phosphors. In certain embodiments, the light emitting device of the present invention further comprises at least one additional phosphor that emits light having a peak in wavelength range from about 350 nm to about 700 nm. In certain embodiments, the light emitting device of the present invention further comprises at least one additional phosphor that emits light having a peak in wavelength range from about 480 nm to about 640 nm. In certain embodiments, the light emitting device of the present invention further comprises at least one additional phosphor that emits light having a peak in wavelength range from about 520 nm to about 600 nm.

In certain embodiments, the light emitting device of the present invention emits white light. In certain embodiments, the light emitting device of the present invention emits cool white light. In certain embodiments, the light emitting device of the present invention emits warm white light. In certain embodiments, the light emitting device of the present invention emits light having a peak in wavelength range from about 400 nm to about 600 nm. In certain embodiments, the light emitting device of the present invention emits light having a peak in wavelength range from about 520 nm to about 600 nm. In certain embodiments, the light emitting device of the present invention emits light having a peak in wavelength range from about 380 nm to about 750 nm. In certain embodiments, the light emitting device of the present invention emits light having a peak in wavelength range from about 400 nm to about 700 nm.

DEFINITIONS

As used herein, "activator" refers to the atomic or ionic species that emits light with the support of the host crystal. The activator may be doped in the host crystal in a very small amount, as further described herein. The activator can comprise a single element, such as, for example and without limitation, $Eu^{2+}$, or can comprise multiple elements (i.e. co-activators), such as, for example and without limitation, a combination of two or more of $Eu^{2+}$, $Ce^{3+}$, $Tb^{3+}$, $Yb^{2+}$ and $Mn^{2+}$.

As used herein, "co-activator" refers to an additional activator in the same host crystal.

As used herein, "dopant" refers to an atomic or ionic species that is doped in a host crystal.

As used herein, "grain" refers to an agglomeration, aggregation, polycrystalline or polymorph of phosphor particles, where the particles are not easily separated as compared to phosphor particles of a powder.

As used herein, "light source" refers to any source of light capable of exciting or irradiating the phosphors of the present invention, including without limitation a Group III-V semiconductor quantum well-based light emitting diode, a laser diode, or a phosphor other than the phosphor of a light emitting device of the present invention. The light source of the present invention can either excite/irradiate the phosphor directly, or excite another system to thereby provide the excitation energy for the phosphor indirectly.

As used herein, "particle" refers to an individual crystal of phosphor.

As used herein, the term "phosphor" refers to a phosphor in any appropriate form, such as a phosphor particle, a phosphor grain, or phosphor powder comprised of phosphor particles, grains, or a combination thereof.

As used herein, a "phosphor composition" refers to a composition comprising a phosphor having the ratio of atoms specified for the particular phosphor. It may or may not be stoichiometric proportions. Impurities and one or more crystalline phases may be present in the composition.

As used herein, the term "pure" means higher than 98% pure for a particular crystalline phase, i.e., no more than 2% of a secondary phase.

"White light," as used herein, is light of certain chromaticity coordinate values (e.g., Commission Internationale de l'Éclairage (CIE)), which are well-known in the art. Correlated color temperature of a light source is the temperature of an ideal black-body radiator that radiates light of comparable hue to that light source. Higher color temperatures (5,000K or more) are called cool colors (or "cool white"); lower color temperatures (2,700-3,000K) are called warm colors (or "warm white").

Temperatures described herein for processes involving a substantial gas phase are of the oven or other reaction vessel in question, not of the reactants per se.

Throughout the specification, reference may be made to M(I), M(II), and M(III), where M(I) is at least one monovalent cation, M(II) is at least one divalent cation, and M(III) is at least one trivalent cation. In addition to any values for these variables that may be given with respect to a particular formulation, M(II) may be selected from the group consisting of Be, Mg, Ca, Sr, Ba, Cu, Co, Ni, Pd, Zn, and Cd; M(I) may be selected from the group consisting of Li, Na, K, Rb, Cu, Ag and Au; and M(III) is selected from the group consisting of B, Al, Ga, In, Sc, Y, La and Gd.

For the purposes of the examples described herein, the quantum efficiency (QE) was measured against the same internal standard sample.

Unless defined otherwise, all technical and scientific terms used herein have the same meaning as commonly understood by one of ordinary skill in the art to which this invention belongs. All technical and scientific terms used herein have the same meaning when used. It must be noted, that, as used herein and in the appended claims, the singular forms "a", "and", and "the" include plural references unless the context clearly dictates otherwise.

In the description of phosphor compositions, a conventional notation is used, wherein the chemical formula for the host crystal is given first, followed by a colon and the formula for the activator and co-activator(s). In certain instances in this specification where the structure of a phosphor's host crystal is discussed, the activator(s) may not be included when referencing the phosphor's formulation.

DETAILED DESCRIPTION

Figure 1:
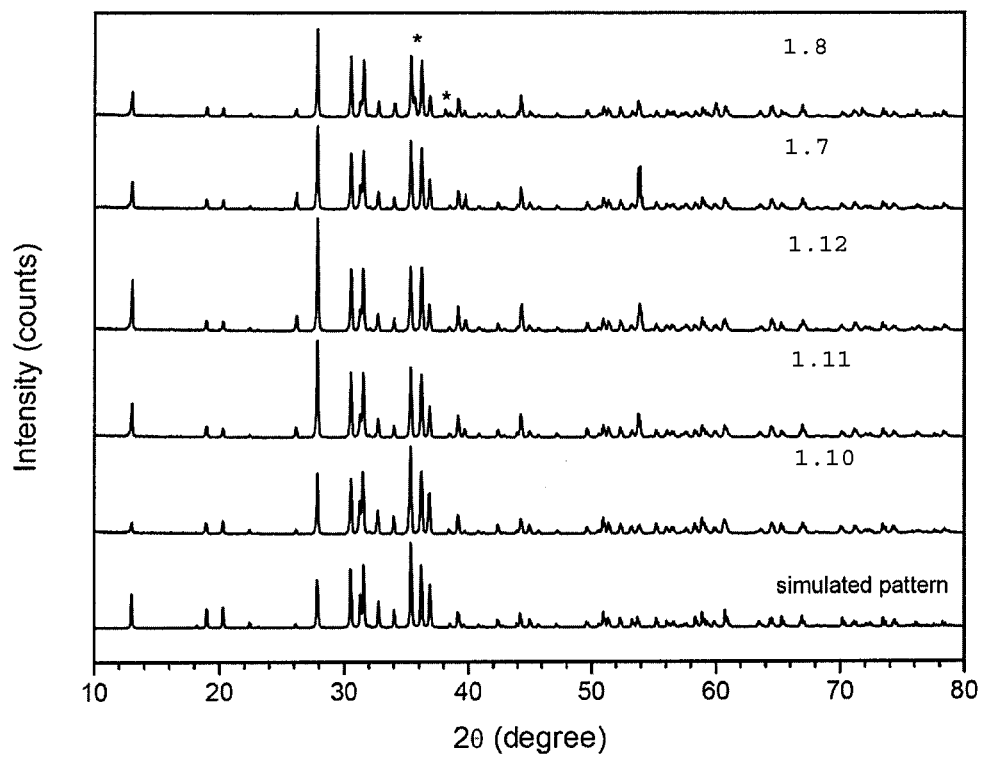
FIG. 1 depict the x-ray diffraction (XRD) patterns of samples 1.8, 1.7, 1.12, 1.11, and 1.10 of phosphor composition (1). The bottom-most simulated pattern is for $Sr_2Si_5N_8$. The asterisk in the upper-most pattern indicates SiC as a second phase in sample 1.8.

In certain embodiments, the present invention is directed to a novel family of silicon carbidonitride phosphors expressed by:

$$Sr_2Si_5N_{8-[(4x/3)+z]}C_xO_{3z/2}:A \qquad (1)$$

wherein $0 < x \leq 5$, $0 \leq z \leq 3$, and $[(4x/3)+z]<8$. A comprises a luminescence activator doped in the host crystal lattice at a concentration level from about 0.0001 mol % to about 50 mol %, preferably from about 0.001 mol % to about 20 mol %, relative to the mole amount of Sr. A can comprise at least one metal ion selected from the group including Ce, Pr, Nd, Sm, Eu, Gd, Tb, Dy, Ho, Er, Tm, Yb, Lu, Mn, Bi, Sb, or a combination thereof, preferably $Eu^{2+}$, $Ce^{3+}$, $Tb^{3+}$, $Yb^{2+}$ and $Mn^{2+}$, or a combination thereof.

In certain embodiments, the present invention is directed to a novel family of silicon carbidonitride phosphors expressed by:

$$M(II)_2Si_5N_{8-[(4x/3)+z]}C_xO_{3z/2}:A \qquad (2)$$

wherein $0 < x \leq 5$, $0 \leq z \leq 3$, and $[(4x/3)+z]<8$. M(II) comprises at least one divalent cation, and may be selected from, but not limited to, the group including Be, Mg, Ca, Sr, Ba, Cu, Co, Ni, Pd, Zn, Cd and other divalent transition metal ions, or a combination thereof, preferably from the group including Ca, Sr, Ba and other alkaline earth metal ions, or a combination thereof. A comprises a luminescence activator doped in the host crystal lattice at a concentration level from about 0.0001 mol % to about 50 mol %, preferably from about 0.001 mol % to about 20 mol %, relative to the mole amount of M(II). A can comprise at least one metal ion selected from the group including Ce, Pr, Nd, Sm, Eu, Gd, Tb, Dy, Ho, Er, Tm, Yb, Lu, Mn, Bi, Sb, or a combination thereof, preferably $Eu^{2+}$, $Ce^{3+}$, $Yb^{2+}$ and $Mn^{2+}$, or a combination thereof.

In certain embodiments, the present invention is directed to a novel family of silicon carbidonitride phosphors expressed by:

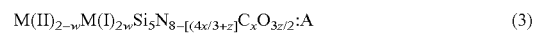

$$M(II)_{2-w}M(I)_{2w}Si_5N_{8-[(4x/3+z]}C_xO_{3z/2}:A \qquad (3)$$

wherein $0 < x \leq 5$, $0 \leq w \leq 0.6$, $0 \leq z \leq 3$, and $[(4x/3)+z]<8$. M(II) comprises at least one divalent cation, and may be selected from, but not limited to, the group including Be, Mg, Ca, Sr, Ba, Cu, Co, Ni, Pd, Zn, Cd and other divalent transition metal ions, or a combination thereof, preferably from the group including Ca, Sr, Ba and other alkaline earth metal ions, or a combination thereof. M(I) comprises at least one monovalent cation, and may be selected from, but not limited to, the group including Li, Na, K, Rb, Cu, Ag and Au, or a combination thereof, preferably from the group including Li, Na, and K, or a combination thereof. In order to compensate for the evaporation of M(I) at high temperature in firing processes, extra M(I) has been designed in this formulation. A comprises a luminescence activator doped in the host crystal lattice at a concentration level from about 0.0001 mol % to about 50 mol %, preferably from about 0.001 mol % to about 20 mol %, relative to total mole amount of M(II) and M(I). A can comprise at least one metal ion selected from the group including Ce, Pr, Nd, Sm, Eu, Gd, Tb, Dy, Ho, Er, Tm, Yb, Lu, Mn, Bi, Sb, or a combination thereof, preferably $Eu^{2+}$, $Ce^{3+}$, $Tb^{3+}$, $Yb^{2+}$ and $Mn^{2+}$, or a combination thereof.

In certain embodiments, the present invention is directed to a novel family of silicon carbidonitride based phosphors expressed by:

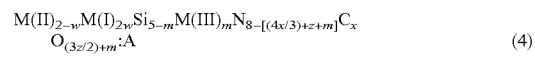

$$M(II)_{2-w}M(I)_{2w}Si_{5-m}M(III)_mN_{8-[(4x/3)+z+m]}C_xO_{(3z/2)+m}:A \qquad (4)$$

wherein $0 < x \leq 5$, $0 \leq w \leq 0.6$, $0 \leq m < 2$, and $[(4x/3)+z+m]<8$. M(II) comprises at least one divalent cation, and may be selected from, but not limited to, the group including Be, Mg, Ca, Sr, Ba, Cu, Co, Ni, Pd, Zn, Cd and other divalent transition metal ions, or a combination thereof, preferably from the group including Ca, Sr, Ba and other alkaline earth metal ions, or a combination thereof. M(I) comprises at least one monovalent cation, and may be selected from, but not limited to, the group including Li, Na, K, Rb, Cu, Ag and Au, or a combination thereof, preferably from the group including Li, Na, and K, or a combination thereof. In order to compensate for the evaporation of M(I) at high temperature in firing processes, extra M(I) has been designed in this formulation. M(III) comprises at least one trivalent cation, and may be selected from, but not limited to, the group including B, Al, Ga, In, Sc, Y, or a combination thereof, preferably from the group including Al and B, or a combination thereof. A comprises a luminescence activator doped in the host crystal lattice at the concentration of from 0.0001 mol % to about 50 mol %, preferably from about 0.001 mol % to about 20 mol %, relative to the total mole amount of M(II) and M(I). A can comprise at least one metal ion selected from the group including Ce, Pr, Nd, Sm, Eu, Gd, Tb, Dy, Ho, Er, Tm, Yb, Lu, Mn, Bi, and Sb, or a combination thereof, preferably $Eu^{2+}$, $Ce^{3+}$, $Tb^{3+}$, $Yb^{2+}$ and $Mn^{2+}$, or a combination thereof.

In certain embodiments, the present invention is directed to a novel family of silicon carbidonitride based phosphors expressed by

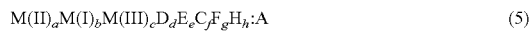

$$M(II)_aM(I)_bM(III)_cD_dE_eC_fF_gH_h:A \quad (5)$$

wherein $0<a<2$, $0 \leq b \leq 0.6$, $0 \leq c<2$, $0<d \leq 5$, $0<e \leq 8$, $0<f \leq 5$, $0 \leq g<2.5$, and $0 \leq h<0.5$; M(II) comprises at least one divalent cation selected from the group consisting of Be, Mg, Ca, Sr, Ba, Cu, Mn, Co, Ni, Zn, and Cd, preferably Ca, Sr, and Ba; M(I) comprises at least one monovalent cation selected from the group consisting of Li, Na, K, Rb, Cs, Ag, and Au, preferably Li, Na, and K; M(III) comprises at least one trivalent cation selected from the group consisting of B, Al, Ga, In, Ti, Sc, Y, and La, preferably B, Al, and Ga; D comprises at least one tetravalent cation selected from the group consisting of C, Si, Ge, Sn, Pb, Ti, Zr, and Hf, preferably Si; E comprises at least one trivalent anion selected from the group consisting of N, P, As, Sb, and Bi, preferably N; C comprises a tetravalent anion of carbon; F comprises at least one divalent anion selected from the group consisting of O, S, Se, and Te, preferably O; H comprises at least one monovalent anion selected from the group consisting of F, Cl, Br, and I, preferably F; and A comprises a luminescence activator doped in the host crystal of the phosphor. In certain embodiments, carbon is present in two different states, as both a tetravalent anion as well as a tetravalent cation.

In certain embodiments, at least one of the phosphor compositions of the present invention is used as a wavelength converter for a light emitting device. The light emitting device has a first illuminant which emits light having a peak in wavelength range from about 300 nm to about 750 nm, and a second illuminant which emits a visible light upon irradiation with light from the first illuminant, wherein the second illuminant contains at least one phosphor of the present invention. The first illuminant can, for example, emit light having a peak in wavelength range from about 300 nm to about 750 nm, preferably from about 400 nm to 670 nm or from about 350 nm to about 480 nm, and more preferably from about 420 nm to about 660 nm. In certain embodiments, the first illuminant is a laser diode or a light emitting diode (LED). When the second illuminant containing one or more phosphor compositions of the invention is irradiated with light from the first illuminant, it can, for example, emit light with a peak in wavelength range from about 460 nm to about 660 nm, preferably from about 480 nm to about 660 nm, and more preferably from about 500 nm to about 650 nm.

In certain embodiments, the second illuminant comprises at least one additional phosphor. The additional phosphor or phosphors can, for example, emit light having a peak in wavelength range from about 480 nm to about 660 nm, preferably from about 500 nm to about 650 nm.

In the phosphor compositions of the present invention, luminescence activator A can be doped in the host crystal of the phosphor either substitutionally or interstitially at a concentration level from about 0.0001 mol % to about 50 mol % relative to the total mol % of the respective divalent or divalent and monovalent cations. In certain embodiments, A is doped in the host crystal of the phosphor at a concentration level from about 0.001 mol % to about 20 mol % relative to the total mol % of the divalent or divalent and monovalent cations. In some embodiments, A is doped in the host crystal of the phosphor at a concentration level from about 0.01 mol % to about 7 mol % relative to the total mol % of the divalent or divalent and monovalent cations. In other embodiments, A is doped in the host crystal of the phosphor at a concentration level from about 0.01 mol % to about 10 mol % relative to the total mol % of the divalent or divalent and monovalent cations.

In certain embodiments, A comprises at least one co-activator. The co-activator may be selected from, but not limited to, the group including Ce, Pr, Nd, Sm, Eu, Gd, Tb, Dy, Ho, Er, Yb, Lu, Mn, Bi, Sb, preferably $Eu^{2+}$, $Ce^{3+}$, $Tb^{3+}$, $Yb^{2+}$ and $Mn^{2+}$, and the group including halogen anions, F, Cl, Br and I. The concentration level of the co-activator can be from about 0.0001% to about 50% relative to the activator. In certain embodiments, the concentration level of the co-activator is from about 0.001 mol % to about 20 mol % relative to the activator. In some embodiments, the co-activator is doped in the host crystal lattice of the phosphor at a concentration level from about 0.01 mol % to about 7 mol % relative to the activator. In other embodiments, A is doped in the host crystal lattice at a concentration level from about 0.01 mol % to about 10 mol % relative to the activator.

In certain embodiments, the phosphor compositions of the present invention maintain at least 60% of their relative emission intensity at temperatures up to 250° C. In other embodiments, the phosphor compositions of the present invention maintain at least 85% of their relative emission intensity at temperatures up to 250° C. In other embodiments, the phosphor compositions of the present invention maintain at least 90% of their relative emission intensity at temperatures up to 250° C. In certain embodiments, the phosphor compositions of the present invention maintain at least 60% of their relative emission intensity at temperatures up to 200° C. In certain embodiments, the phosphor compositions of the present invention maintain at least 85% of their relative emission intensity at temperatures up to 200° C. In other embodiments, the phosphor compositions of the present invention maintain at least 90% of their relative emission intensity at temperatures up to 200° C. In certain embodiments, the phosphor compositions of the present invention maintain at least 60% of the relative emission intensity at temperatures up to 150° C. In certain embodiments, the phosphor compositions of the present invention maintain at least 85% of the relative emission intensity at temperatures up to 150° C. In further embodiments, the phosphor compositions of the present invention maintain at least 90% of the relative emission intensity at temperatures up to 150° C. In other embodiments, the phosphor compositions of the present invention maintain at least 95% of their relative emission intensity at temperatures up to 150° C.

In certain embodiments, the shape of the phosphor particles can be spherical and/or rod-shaped. In some embodiments, the median diameter of the phosphor particles of the present invention can be from about 2 to about 50 microns, preferably from about 4 to about 30 microns, and more preferably from about 5 to about 20 microns. In further embodiments, the phosphor particles of the present invention can be from about 2 to about 10 microns in diameter, or from about 3 to about 9 microns in diameter. In some embodiments, the phosphor is a grain. In other embodiments, the phosphor is a particle.

In certain embodiments, the present invention further provides a light emitting device comprising: a light source emitting light of having a peak in wavelength range from about 200 to about 600 nm, preferably from about 350 to about 490 nm; and at least one phosphor composition of the present invention, where the phosphor composition is positioned to absorb at least a portion of the light output from the light source and effectively modifies the color of the light absorbed from the light source, resulting in an emission of a longer wavelength than that of the light absorbed from the light source. For example, the phosphor compositions of the present invention can be mixed with a silicone resin to form a slurry. The phosphor-filled silicone can be applied to a LED chip as shown in FIGS. 36-39. The LED can, for example, emit light in the near ultraviolet (nUV) range (e.g., about 405 nm) or the blue range (e.g., about 450 nm).

Figure 38:
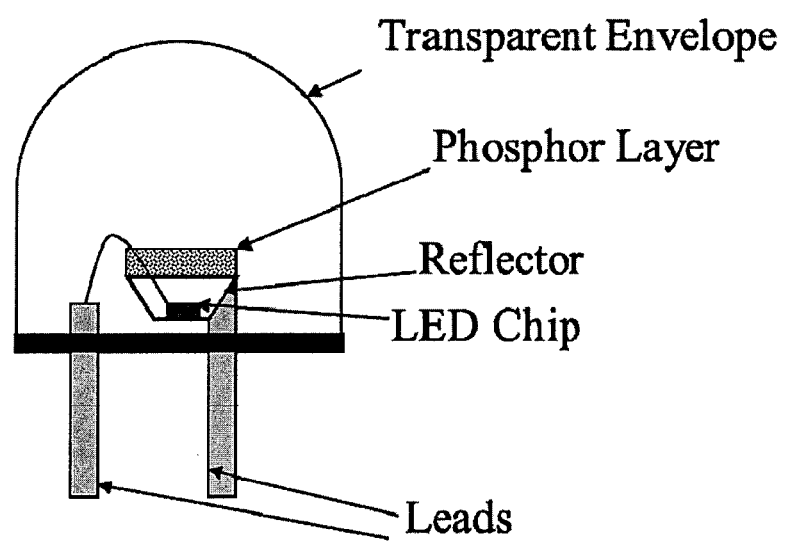
FIG. 38 depicts an embodiment of the light emitting device of the present invention.

The light source used in the present invention, can, for example, comprise a gallium nitride-based LED with a light-emitting layer comprising a quantum well structure. The light emitting device can include a phosphor of the present invention and a reflector located so as to direct light from the LED or the phosphor (see FIG. 36). The phosphor of the present invention can be located on the surface of the LED (FIGS. 36 and 37) or separated therefrom (FIG. 38). The light emitting device can further include a translucent material encapsulating the LED and the phosphor as seen in FIGS. 36-39.

In certain embodiments, the light emitting device of the present invention comprises a light source, such as a LED, to either create excitation energy, or to excite another system to thereby provide the excitation energy for the phosphor of the present invention. Devices using the present invention can include, for example, and without limitation, white light producing light emitting devices, indigo light producing light emitting devices, blue light producing light emitting devices, green light producing light emitting devices, yellow light producing light emitting devices, orange light producing light emitting devices, pink light producing light emitting devices, red light producing light emitting devices, or light emitting devices with an output chromaticity defined by the line between the chromaticity of a phosphor of the present invention and that of at least one second light source. Headlights or other navigation lights for vehicles can be made with the light emitting devices of the present invention. The light emitting devices can be output indicators for small electronic devices, such as cell phones and personal digital assistants (PDAs). The light emitting devices of the present invention also can be the backlights of the liquid crystal displays for TV, cell phones, PDAs and laptop computers. Luminaires for general illumination purpose can also be made with the lighting devices of the present invention. Given appropriate power supplies, room lighting can be based on devices of the invention. The warmth (i.e., amount of yellow/red chromaticity) of light emitting devices of the present invention can be manipulated by selection of the ratio of light from a phosphor of the present invention to light from a second source (including, a second phosphor). Semiconductor light source-based white light devices can be used, for example, in a self-emission type display for displaying a predetermined pattern or a graphic design on a display portion of an audio system, a household appliance, a measuring instrument, a medical appliance, and the like. Such semiconductor light source-based light devices also can be used, for example, and without limitation, as light sources of a back-light for a liquid crystal diode (LCD) display, a printer head, a facsimile, a copying apparatus, and the like. The light emitting devices of the present invention can emit light having a peak in wavelength range from about 350 nm to about 750 nm. The light emitting device can, for example, emit light having a peak in wavelength range of at least 350 nm, or at least 355 nm, or at least 340 nm, and so on in increments of 5 up to at least 750 nm. The light emitting device can, for example, emit light having a peak in wavelength range of at most 750 nm, or at most 745 nm, or at most 740 nm, and so on in increments of 5 down to at most 350 nm. Exemplary ranges for the peak in emission of the light emitting device of the present invention include, without limitation, from about 500 nm to about 650 nm, or from about 530 nm to about 560 nm, or from about 550 nm to about 600 nm, or from about 580 nm to about 660 nm.

Suitable semiconductor light sources for use in the present invention also are any that create light that excites the phosphor compositions of the present invention, or that excites a different phosphor that in turn excites the phosphors of the present invention. Such semiconductor light sources can be, for example, and without limitation, light sources including: GaN (gallium nitride) type semiconductor light sources; In—Al—Ga—N type semiconductor light sources, such as $In_iAl_jGa_kN$, where i+j+k=about 1, and where one or more of i, j and k can be 0; BN; SiC; ZnSe; $B_iAl_jGa_kN$, where i+j+k=about 1, and where one or more of i, j, and k can be 0; and $B_iIn_jAl_kGa_lN$, where i+j+k+l=about 1, and where one or more of i, j, k, and l can be 0; and other such similar light sources. The semiconductor light source (e.g., a semiconductor chip) can be based, for example, on III-V or II-VI quantum well structures (meaning structures comprising compounds that combine elements of the periodic table of the chemical elements from Group III with those from Group V or elements from Group II with those from Group VI). In certain embodiments, a blue or a near ultraviolet (nUV) emitting semiconductor light source is used.

In certain embodiments, the phosphor compositions of the present invention can be excited by light from a primary light source, such as, for example, a semiconductor light source (e.g., a LED) emitting light having a peak in wavelength range of about 300 to about 500 nm, from about 350 nm to about 480 nm or about 330 nm to about 390 nm, or from a secondary light source, such as, emissions from other phosphor(s) that emit light having a peak in wavelength range of about 300 nm to about 500 nm or about 350 nm to about 420 nm. Where the excitation light is secondary, in relation to the phosphor compositions of the present invention, the excitation-induced light is the relevant source light. Devices that use the phosphor compositions of the present invention can include, for example, and without limitation, mirrors, such as, dielectric mirrors, which direct light produced by the phosphor compositions of the present invention to the light output, rather than direct such light to the interior of the device (such as, the primary light source).

The light source (e.g., a LED) can, in certain embodiments, emit light having a peak in wavelength of at least about 200 nm, at least about 250 nm, at least about 255 nm, at least about 260 nm, and so on in increments of 5 nm up to at least about 600. In some embodiments, the light source emits light having a peak in wavelength of over 600 nm. The light source can, in certain embodiments, emit light having a peak in wavelength of at most about 600 nm, at most about 595 nm, at most about 590 nm, and so on in increments of 5 nm down to or less than about 200 nm. In some embodiments, the light source emits light at less than 200 nm. In certain embodiments, the light source is a semiconductor light source. When LED chips are used, the LED chips are advantageously filled with a transparent encapsulant with a dome-like shape as shown in FIGS. 36-39. The encapsulant provides the mechanical protection on one hand, and the encapsulant further improves the optical property on the other hand (improved light emission of the LED die).

The phosphor composition may be dispersed in an encapsulant. By the encapsulant, the LED chips disposed on the substrate and a polymer lens are bonded without containing a gas as much as possible. The LED die can be sealed directly by the encapsulant. However, it is also possible that the LED die is sealed with a transparent encapsulant (i.e., in this case, there are the transparent encapsulant and the encapsulant to contain the phosphor composition). Owing to the refraction indices close to each other, there is little loss of reflection at the interface.

In structural modifications, one or more LED chips are disposed on a substrate in a reflection mirror and the phosphor composition is dispersed in a lens disposed on the reflection mirror. Alternatively, one or more LED chips may be disposed on a substrate in a reflection mirror and the phosphor coated on the reflection mirror.

Figure 39:
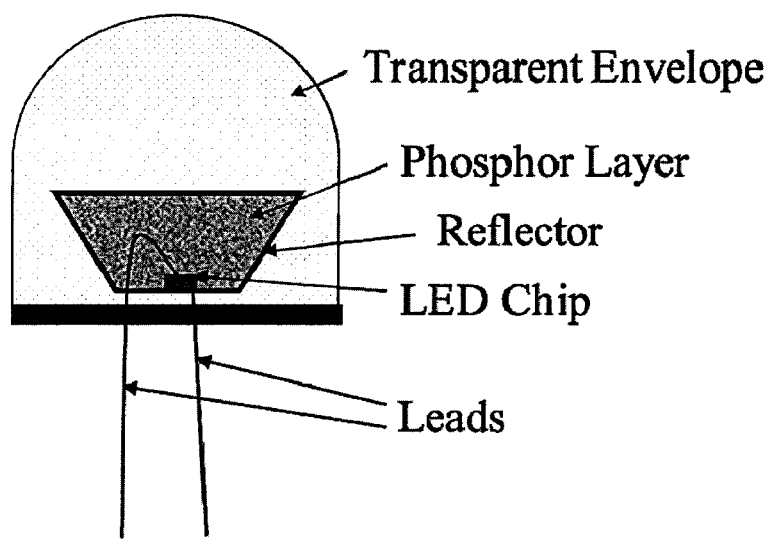
FIG. 39 depicts an embodiment of the light emitting device of the present invention.

In certain embodiments, the phosphor compositions of the present invention may be dispersed in an encapsulant such as silicone and epoxy resin. The phosphor-mixed encapsulant composition may be disposed on to the LED chip which is mounted on a substrate. The structure of the LED combined with the phosphor-mixed encapsulant composition can be sealed by a transparent encapsulant as protective layer. In certain embodiments, the outer transparent encapsulant layer is shaped in a dome shape for directing and distributing the output light (FIGS. 36-39). In an alternative device structure, one or more LED chips are mounted on a substrate and the phosphor-mixed encapsulant composition is disposed onto the multiple-chip device (FIG. 39).

In certain embodiments, the phosphor compositions of the present invention can be dispersed in the light emitting device with a binder, a solidifier, a dispersant, a filler or the like. The binder can be, for example, and without limitation, a light curable polymer, such as an acrylic resin, an epoxy resin, a polycarbonate resin, a silicone resin, a glass, a quartz and the like. The phosphor of the present invention can be dispersed in the binder by methods known in the art. For example, in some cases, the phosphor can be suspended in a solvent with the polymer suspended, thus forming a phosphor-containing slurry composition, which then can be applied on the light emitting device and the solvent evaporated therefrom. In certain embodiments, the phosphor can be suspended in a liquid, such as, a pre-cured precursor to the resin to form a slurry, the slurry then can be dispersed on the light emitting device and the polymer (resin) cured thereon. Curing can be, for example, by heat, UV, or a curing agent (such as, a free radical initiator) mixed with the precursor. As used herein "cure" or "curing" refers to, relates to or is a process for polymerizing or solidifying a substance or mixture thereof, often to improve stability or usability of the substance or mixture thereof. In certain embodiments, the binder used to disperse the phosphor particles in a light emitting device can be liquefied with heat, thereby forming a slurry, and then the slurry is dispersed on the light emitting device and allowed to solidify in situ. Dispersants (meaning a substance that promotes the formation and stabilization of a mixture (e.g., a suspension) of one substance into another) include, for example, and without limitation, titanium oxides, aluminum oxides, barium titanates, silicon oxides, and the like.

In certain embodiments, at least one of the additional phosphors is selected from the following: (1) one or more phosphor compositions that emit green light, including, for example and not limited to, $Ca_{1-x}Sr_xGa_2S_4:Eu^{2+}$ ($0 \leq x \leq 1$), $Ca_{1-x-y-z}Mg_xSr_yBa_zSiO_4:Eu^{2+}$ ($0 \leq x \leq 1$, $0 \leq y \leq 1$, $0 \leq z \leq 1$, $x+y+z \leq 1$), $BaMgAl_{10}O_{17}:Eu^{2+},Mn^{2+}$, $MYSi_4N_7:Eu^{2+}$ (M=Ca, Sr, Ba), β-sialon:$Eu^{2+}$, $MSi_2O_2N_2:Eu^{2+}$ (M=Mg, Ca, Sr, Ba), $Ba_3Si_6O_{12}N_2:Eu^{2+}$, $M_2Si_5N_8:Ce^{3+}$ (M=Ca, Sr, Ba), $Y_2Si_4N_6C:Ce^{3+}$, and α-sialon:$Yb^{2+}$, (2) one or more phosphor compositions that emit blue light, including, for example and not limited to, $(MSiO_3)_m \cdot (SiO_2)_n:Eu^{2+}$, X (M=Mg, Ca, Sr, Ba; X=F, Cl, Br, I), where m is 1 or 0, and either (i) n>3 if m=1 or (ii) n=1 if m=0, $MAl_2O_4:Eu^{2+}$ (M=Mg, Ca, Sr, Ba), and $BaMgAl_{10}O_{17}:Eu^{2+}$, (3) one or more phosphor compositions that emit yellow light, including, for example and not limited to, $Y_3Al_5O_{12}:Ce^{3+}$ and other cerium-doped garnet type phosphors, and α-sialon:$Eu^{2+}$, and (4) one or more phosphor compositions that emit red light, including, for example and not limited to, $Ca_{1-x}Sr_xS:Eu^{2+}$ ($0 \leq x \leq 1$), $3.5MgO \cdot 0.5MgF_2 \cdot GeO_2:Mn^{4+}$, $Y_2O_2S:Eu^{3+}$, $M_2Si_5N_8:Eu^{2+}$ (M=Ca, Sr, Ba), $MAlSiN_3:Eu^{2+}$ (M=Ca, Sr), $Y_2Si_4N_6C:Eu^{2+}$, and $CaSiN_2:Eu^{2+}$.

In certain embodiments, one or more additional phosphor compositions are added to the phosphor compositions of the present invention to make, for example and without limitation, white light LED lamps. The compositions of such additional phosphors can be, without limitation, as follows:

(a) $Ca_{1-x}Al_{x-xy}Si_{1-x+xy}N_{2-x-xy}C_{xy}:A$;

(b) $Ca_{1-x-z}Na_zM(III)_{x-xy-z}Si_{1-x+xy+z}N_{2-x-xy}C_{xy}:A$;

(c) $M(II)_{1-x-z}M(I)_zM(III)_{x-xy-z}Si_{1-x+xy+z}N_{2-x-xy}C_{xy}:A$;

(d) $M(II)_{1-x-z}M(I)_zM(III)_{x-xy-z}Si_{1-x+xy+z}N_{2-x-xy-2w/3}C_{xy}O_{w-v/2}H_v:A$; and (e) $M(II)_{1-x-z}M(I)_zM(III)_{x-xy-z}Si_{1-x+xy+z}N_{2-x-xy-2w/3-v/3}C_{xy}O_wH_v:A$;

wherein:

$0<x<1$, $0<y<1$, $0 \leq z<1$, $0 \leq v<1$, $0<w<1$, $x+z<1$, $x>xy+z$, $v/2 \leq w$, $x-xy-2w/3-v/3<2$, and $0<x-xy-z<1$;

M(II) is at least one divalent cation;

M(I) is at least one monovalent cation;

M(III) is at least one trivalent cation;

H is at least one monovalent anion; and

A is a luminescence activator.

In certain embodiments, one or more additional phosphor compositions are added to the phosphor compositions of the present invention to make, for example and without limitation, white light LED lamps. The compositions of such additional phosphors can be, without limitation, as follows:

(a) $M(II)_aSi_bO_cN_dC_e:A$, wherein $6<a<8$, $8<b<14$, $13<c<17$, $5<d<9$, $0<e<2$;

(b) $M(II)_7Al_{12-x-y}Si_{x+y}O_{25-x}N_{x-y}C_y:A$, wherein $0<x \leq 12$, $0<y<x$, and $0<x+y \leq 12$;

(c) $M(II)_7M(III)_{12-x-y}Si_{x+y}O_{25-x \pm 3\delta/2}N_{x \mp \delta-y}C_y:A$, wherein $0<x \leq 12$, $0<x+y \leq 12$, and $0<y<x$;

(d) $M(II)_7M(III)_{12-x-y}Si_{x+y}O_{25-x \pm 3\delta/2}N_{x \mp \delta-y}C_y:A$, wherein $0<x<12$, $0 \leq y<x$, $0<x+y \leq 12$, $0<\delta \leq 3$, and $\delta<x+y$;

(e) $M(II)_7M(III)_{12-x-y}Si_{x+y}O_{25-x \pm \delta/2}N_{x \mp \delta-y}C_{y \pm \delta/2}:A$, wherein $0<x<12$, $0 \leq y<x$, $0<x+y \leq 12$, $0\delta \leq 3$, and $\delta<x+y$;

(f) $M(II)_{7-y}M(I)_yM(III)_{12-x-y-z}Si_{x+y+z}O_{25-x \pm 3\delta/2}N_{x \mp \delta-z}C_z:A$, wherein $0<x<12$, $0 \leq y<x$, $0<z<x$, $0<x+y+z \leq 12$, $z<x+\delta$, and $0<\delta \leq 3$;

(g) $M(II)_{7-y}M(I)_yM(III)_{12-x-y-z}Si_{x+y+z}O_{25-x \pm \delta/2}N_{x \mp \delta-z}C_{z \pm \delta/2}:A$, wherein $0<x<12$, $0 \leq y<x$, $0<z<x$, $0<x+y+z<12$, $z<x+\delta$, and $0<\delta \leq 3$;

(h) $M(II)_{7-y}M(I)_yM(III)_{12-x-y-z}Si_{x+y+z}O_{25-x \pm 2\delta/2-v/2}N_{x \mp \delta-z}C_zH_v:A$, wherein $0<x<12$, $0 \leq y<1$, $0<z<x$, $z<x+\delta$, $0<\delta \leq 3$, $0 \leq v<1$, and $0<x+y+z \leq 12$; and (i) $M(II)_{7-y}M(I)_yM(III)_{12-x-y-z}Si_{x+y+z}O_{25-x\pm\delta/2-v/2}N_{x\mp\delta-z}C_{z\pm\delta/2}H_v$:A, wherein $0<x<12$, $0\leq y<1$, $0<z<x$, $z<x+\delta$, $0<\delta\leq 3$, $0\leq v<1$, and $0<x+y+z\leq 12$;

wherein:

M(II) comprises at least one divalent cation;

M(I) comprises at least one monovalent cation;

M(III) comprises at least one trivalent cation;

H comprises at least one monovalent anion; and

A comprises a luminescence activator doped in the host crystal lattice.

In is noted that any of phosphors described herein may be used to create a light emitting device of the present invention. In the case that multiple phosphor compositions are used, it may be advantageous that the multiple phosphor compositions are suspended in each matrix, and, in that case, these matrices can be disposed back and forth in the light propagation direction. Thereby, the matrix concentration can be reduced compared with the case that the different phosphor compositions are dispersed and mixed together.

EXAMPLES

Preparation and Processes

The phosphor samples were prepared by a solid state reaction with the starting materials of silicon nitride, silicon carbide, metal oxides, metal halides, metal nitrides and/or metals in molar ratios designed for each of the target phosphor compositions. Metal nitrides and europium nitride were prepared by the nitridation of the respective metal beforehand. Certain elements constituting the invented phosphor compositions and their source materials used in the preparation of the following examples are exemplified in Table 1. In the preparations, the source materials in powder form were weighed out, mixed and grinded in a glovebox under dried $N_2$ protection. The powder mixture was subsequently heated for 8-12 hrs in a temperature range of 1600-1850° C. in a high temperature furnace under $N_2/H_2$ atmosphere. The resultant phosphor products were pulverized, sieved and washed. The phosphor products were tested and analyzed by X-ray diffraction, luminescence spectroscopy and optical reflectance technique.

TABLE 1

Source materials for the preparation of alkaline earth silicon carbidonitride phosphors

| Elements | Source materials |
|---|---|
| Alkaline earth (Ca, Sr, Ba, Mg) | Nitride, metal, silicide, alloy, carbide, amide and azide, oxide or carbonate |
| Silicon (Si) | Silicon nitride ($Si_3N_4$), silicon oxynitride, Si, silicon carbide, silicide, silicon amide, silicon carbodiimide, silicon oxide |
| Aluminum (Al) | Aluminum nitride, aluminum oxynitride, aluminum oxide, aluminum carbide, aluminum carbonitride, Al metal, aluminum halide |
| Boron (B) | Nitride (BN), boron carbide, boron oxide, boric acid |
| Nitrogen (N) | Nitride, nitrogen or ammonia gas, amide, azide |
| Carbon (C) | Carbide, carbon, carbidonitride, Si, C- and N-organic precursors, amide and azide, e.g., $Si(NCN)_2$, $C_2N_2H_4$, $C_2N_2(NH)$, $C_3N_3(NH_2)_3$, $CN_x$ |
| Alkali (Li, Na, K) | Metal, nitride, silicide, amide and azide, halide, carbide, oxide or carbonate |
| Rare earth (Eu, Ce, Tb etc.) | Rare earth nitride, rare earth oxide, rare earth metal, rare earth halide, rare earth hydride, rare earth amide and azide |

Example 1

Preparation and properties of phosphor compositions of family (1) $Sr_2Si_5N_{8-[(4x/3)+z]}C_xO_{3z/2}$:$Eu^{2+}$

Example 1.1

$Sr_2Si_5N_{8-[(4x/3)+z]}C_xO_{3z/2}$:$Eu_y^{2+}$ (z=0). Samples of phosphor composition $Sr_2Si_5N_{8-(4x/3)}C_x$:$Eu_y^{2+}$ (i.e., composition (1) $Sr_2Si_5N_{8-[(4x/3)+z]}C_xO_{3z/2}$:$Eu^{2+}$ where z=0) were synthesized by a solid state reaction with the starting materials of strontium nitride ($Sr_2N$ or $Sr_3N_2$), silicon nitride ($\alpha$—$Si_3N_4$ or $\beta$—$Si_3N_4$), silicon carbide ($\alpha$—SiC or $\beta$—SiC), europium nitride (EuN) in designed ratios listed in Table 2. The preparations followed the procedure of high temperature and post-firing treatments described above. The luminescence properties of the phosphor products along with the target chemical composition are listed in Table 3. It is observed that the luminescence efficiency measured by quantum efficiency is enhanced by addition of carbon in certain range in the composition.

TABLE 2

Weight amount of the raw materials for preparing composition $Sr_2Si_5N_{8-(4x/3)}C_x$:$Eu_y^{2+}$

| | Weight of raw materials (g) | | | |
|---|---|---|---|---|
| Example | $Sr_2N$ | $Si_3N_4$ | SiC | EuN |
| 1.1 | 1.2371 | 1.4653 | 0.1396 | 0.1156 |
| 1.2 | 1.2456 | 1.3892 | 0.2102 | 0.1160 |
| 1.3 | 1.2505 | 1.3126 | 0.2814 | 0.1165 |
| 1.4 | 1.2554 | 1.2354 | 0.3531 | 0.1169 |
| 1.5 | 1.2603 | 1.1576 | 0.4254 | 0.1174 |
| 1.6 | 1.2703 | 1.0001 | 0.5717 | 0.1183 |
| 1.7 | 1.2869 | 0.6774 | 0.8713 | 0.1202 |
| 1.8 | 1.3059 | 0.3443 | 1.1808 | 0.1222 |
| 1.9 | 1.2688 | 1.4741 | 0.1404 | 0.0698 |
| 1.10 | 1.2788 | 1.3206 | 0.2831 | 0.0703 |
| 1.11 | 1.2889 | 1.1646 | 0.4280 | 0.0709 |
| 1.12 | 1.2991 | 1.0062 | 0.5752 | 0.0714 |
| 1.13 | 1.6083 | 0.8894 | 1.1440 | 0.3157 |

TABLE 3

Composition coefficients and luminescence properties for $Sr_2Si_5N_{8-(4x/3)}C_x$:$Eu_y^{2+}$

| | Composition Coefficient | | Luminescence Characteristics ($\lambda_{exc}$ = 453 nm) | | | |
|---|---|---|---|---|---|---|
| Example | x | y | QE (%) | EM (%) | FWHM (nm) | $\lambda_{em}$ (nm) |
| 1.1 | 0.5 | 0.1 | 91.9 | 101.4 | 101 | 632 |
| 1.2 | 0.75 | 0.1 | 94.4 | 101.9 | 103 | 630 |
| 1.3 | 1.0 | 0.1 | 92.8 | 97.3 | 95 | 620 |
| 1.4 | 1.25 | 0.1 | 97 | 106.8 | 102 | 629 |
| 1.5 | 1.5 | 0.1 | 99.2 | 110.7 | 104 | 632 |
| 1.6 | 2.0 | 0.1 | 74.7 | 70.2 | 101 | 627 |
| 1.7 | 3.0 | 0.1 | 88.1 | 96.4 | 104 | 630 |
| 1.8 | 4.0 | 0.1 | 57.7 | 62.8 | 96 | 627 |
| 1.9 | 0.5 | 0.06 | 95.2 | 101.3 | 92 | 625 |
| 1.10 | 1.0 | 0.06 | 96 | 108.3 | 98 | 625 |
| 1.11 | 1.5 | 0.06 | 95.2 | 101.3 | 92 | 625 |
| 1.12 | 2.0 | 0.06 | 94.6 | 104.2 | 99 | 628 |
| 1.13 | 3.0 | 0.20 | 71.9 | 82.1 | 109 | 641 |

FIG. 1 shows the XRD patterns of exemplary $Sr_2Si_5N_{8-(4x/3)}C_x$:$Eu^{2+}$ phosphors. The diffraction patterns are arranged in order of the carbon content in the composition of the phosphors, i.e., the pattern for the sample 1.8 in the top position contains the highest amount of carbon (x=4.0) in the composition, while the pattern for the sample 1.10 in the lowest position contains the lowest amount of carbon (x=1.0) in the composition. The simulated diffraction pattern for the crystalline compound $Sr_2Si_5N_8$ is presented at the bottom position as reference. The XRD patterns of the phosphors with low carbon content, for example 1.10, have similar diffraction patterns with that of $Sr_2Si_5N_8$ compound. Analyses of the observed XRD patterns indicate that the sample phosphors $Sr_2Si_5N_{8-(4x/3)}C_x:Eu^{2+}$ are isotypical to $Sr_2Si_5N_8$. As the carbon content in the composition of $Sr_2Si_5N_{8-(4x/3)}C_x:Eu^{2+}$ increases, the diffraction peaks render systematic displacement to lower diffraction angles (2θ) due to the incorporation of carbon in the lattice of $Sr_2Si_5N_8$. In the samples with carbon content less than nitrogen content, the XRD patterns show pure single crystalline phase. When the carbon content surpasses the nitrogen content, (i.e., the molar ratio of C/N≧1) however, a small amount of the secondary phase of SiC is present, as seen in a XRD pattern of sample 1.8 in FIG. 1. Furthermore, in comparison with $Sr_2Si_5N_8:Eu^{2+}$, the carbidonitride phosphors of $Sr_2Si_5N_{8-(4x/3)}C_x:Eu^{2+}$ show strong preferred orientation due to the morphology of particles being rod-like, particularly at high carbon content. As a typical example, the crystal structure data of strontium silicon carbidonitride phosphor of $Sr_2Si_5N_{8-(4x/3)}C_x:Eu^{2+}$ (x=3, $Eu^{2+}$=5 mol %) are summarized in Table 4. It is worth noting that the carbon atoms can also distribute statistically on all N($N^{[3]}$ and $N^{[2]}$) in the structure of the phosphor. Therefore, the crystal structure data are not limited by the results given in the Tables.

TABLE 4

Crystallographic data for sample 1.7, $Sr_2Si_5N_{8-(4x/3)}C_x:Eu^{2+}$ (x = 3, Eu = 5 mol %)

| | |
|---|---|
| Chemical formula | $Sr_{1.9}Eu_{0.1}Si_5N_4C_3$ |
| Crystal system | Orthorhombic |
| Space group | $Pmn2_1$ (No. 31) |
| Z | 2 |
| Lattice parameters (Å) | a = 5.6998(1), b = 6.7954(1), c = 9.3269(1) |
| Unit cell volume (Å$^3$) | 361.25(1) |

| Atom | x/a | y/b | z/c | $U_{iso}$ * 100 | Site | S.O.F |
|---|---|---|---|---|---|---|
| Sr1 | 0 | 0.86917 | 0.00283 | 1.22 | 2a | 0.950 |
| Eu1 | 0 | 0.86917 | 0.00283 | 1.22 | 2a | 0.050 |
| Sr2 | 0 | 0.87990 | 0.37045 | 1.68 | 2a | 0.950 |
| Eu2 | 0 | 0.87990 | 0.37045 | 1.68 | 2a | 0.050 |
| Si1 | 0.25376 | 0.66434 | 0.69046 | 1.19 | 4b | 1.000 |
| Si2 | 0 | 0.05694 | 0.67381 | 1.20 | 2a | 1.000 |
| Si3 | 0 | 0.41839 | 0.45801 | 0.95 | 2a | 1.000 |
| Si4 | 0 | 0.40723 | 0.90012 | 1.04 | 2a | 1.000 |
| N1 | 0 | 0.18867 | 0.52982 | 0.07 | 2a | 0.750 |
| N2 | 0.25322 | 0.90975 | 0.68894 | 0.06 | 4b | 0.750 |
| N3 | 0.24933 | 0.44692 | 0.01302 | 0.07 | 4b | 0.250 |
| C3 | 0.24933 | 0.44692 | 0.01302 | 0.07 | 4b | 0.750 |
| N4 | 0 | 0.58515 | 0.77643 | 0.06 | 2a | 0.250 |
| C4 | 0 | 0.58515 | 0.77643 | 0.06 | 2a | 0.750 |
| N5 | 0 | 0.16888 | 0.85014 | 0.07 | 2a | 0.750 |
| N6 | 0 | 0.42266 | 0.27020 | 0.04 | 2a | 0.250 |
| C6 | 0 | 0.42266 | 0.27020 | 0.04 | 2a | 0.750 |

Figure 2A:
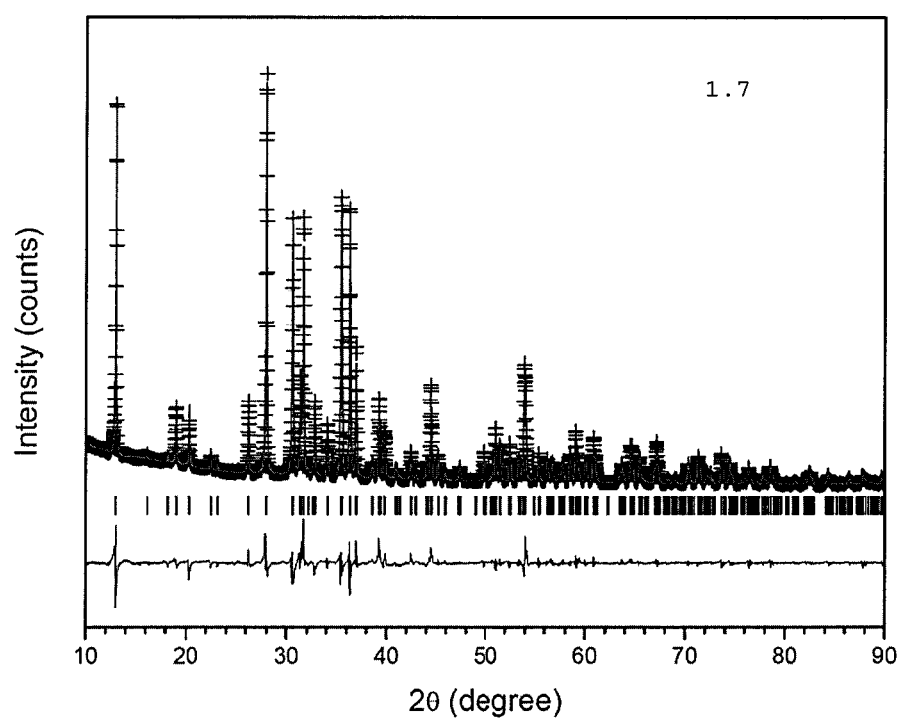
FIG. 2A depicts the Rietveld Refinement of the XRD powder diffraction for $Sr_2Si_5N_{8-(4x/3)}C_x$:$Eu^{2+}$ (sample 1.7).
Figure 2B:
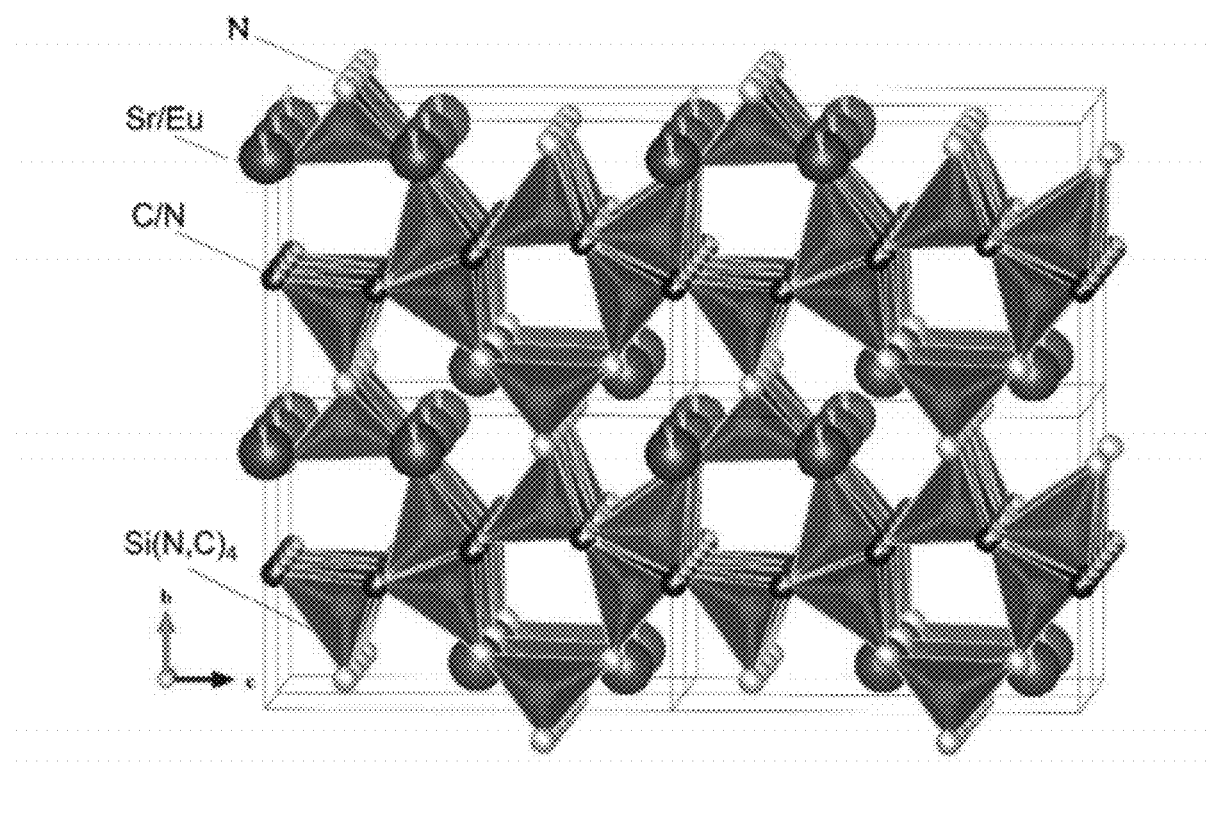
FIG. 2B depicts the projected crystal structure of $Sr_2Si_5N_{8-(4x/3)}C_x$:$Eu^{2+}$ (sample 1.7).
Figure 3:
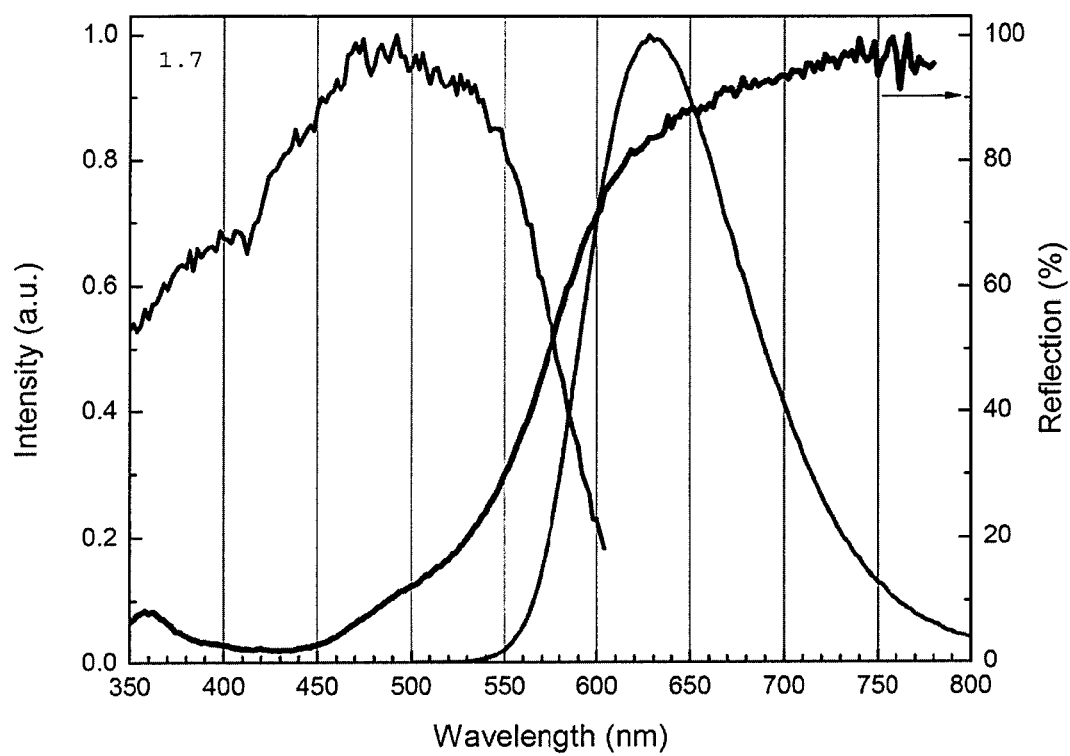
FIG. 3 depicts excitation and emission spectra (under excitation at 453 nm), as well as the optical reflection profile, of sample 1.7 of phosphor composition (1) ($Sr_2Si_5N_{8-(4x/3)}C_x$:$Eu^{2+}$ (x=3.0)).

FIGS. 2A and 2B show the Rietveld Refinement and the projected crystal structure of sample 1.7. FIG. 3 shows the representative luminescence excitation and emission spectra and optical reflection profile for sample 1.7. The excitation and reflectance spectra indicate that the phosphor absorbs, and is efficiently excited by, light in the range from 350 nm to 600 nm. The phosphor emits red light peaking at about 630 nm in the spectral range of 500 to 800 nm.

Figure 4:
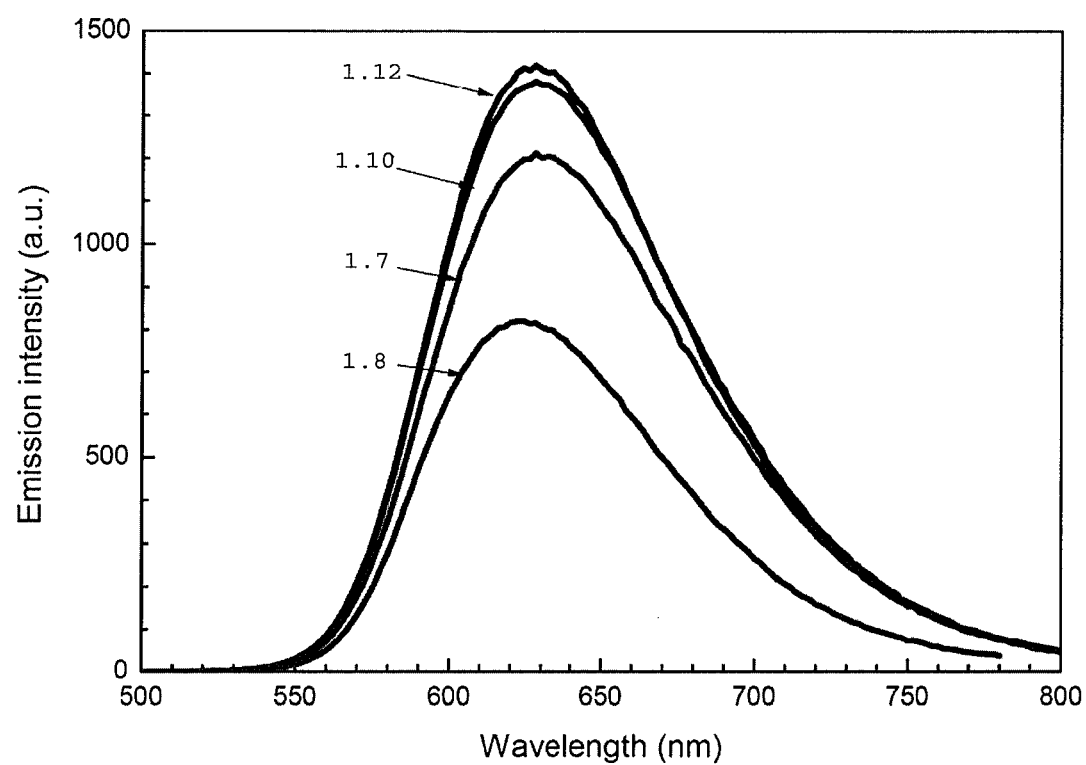
FIG. 4 depicts the effect of carbon content on emission spectra of samples 1.10, 1.12, 1.7, and 1.8 of phosphor composition (1) ($Sr_2Si_5N_{8-(4x/3)}C_x$:$Eu^{2+}$) under blue excitation at 453 nm.
Figure 5:
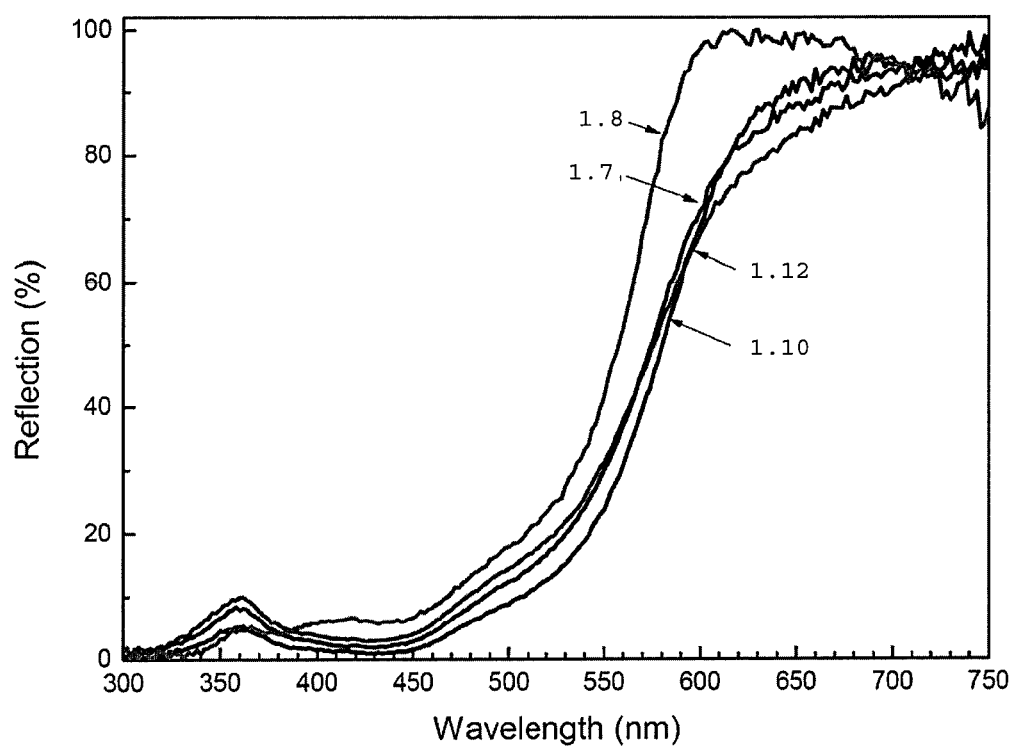
FIG. 5 depicts reflectance spectra of samples 1.8, 1.7, 1.12, and 1.10 of phosphor composition (1).
Figure 6:
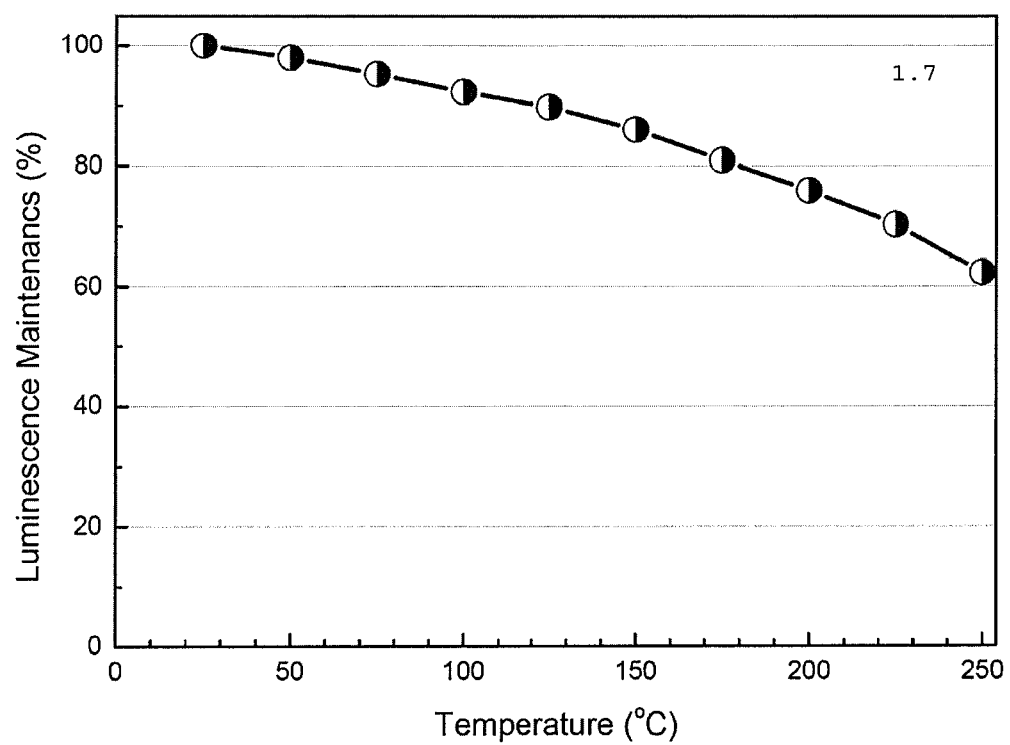
FIG. 6 depicts thermal stability of sample 1.7 under blue excitation at 453 nm.

As the carbon content is increased in the phosphor composition $Sr_2Si_5N_{8-(4x/3)}C_x:Eu^{2+}$, the emission band shifts toward shorter wavelengths as shown in FIG. 4 for 1.10 vs. 1.12 and 1.7 vs. 1.8, while the absorption edge of $Eu^{2+}$ is blue shifted as shown in FIG. 5. The relative emission intensity is plotted in FIG. 6 as a function of the temperature, which demonstrates the silicon carbidonitride phosphors have high thermal stability, e.g., the lumen maintenance is about 90% at 150° C.

Example 1.2

$Sr_2Si_5N_{8-[(4x/3)+z]}C_xO_{3z/2}:Eu_y^{2+}$ (z>0). Samples of phosphor composition $Sr_2Si_5N_{8-[(4x/3)+z]}C_xO_{3z/2}:Eu_y^{2+}$ (i.e., composition (1) where z>0) were synthesized by a solid state reaction with the starting materials of strontium nitride ($Sr_2N$ or $Sr_3N_2$), silicon nitride (α—$Si_3N_4$ or β—$Si_3N_4$), silicon carbide (α—SiC or β—SiC), europium oxide ($Eu_2O_3$) in designed ratios listed in Table 5. The preparations followed the procedure of high temperature and post-firing treatments described above. The luminescence properties of the phosphor products along with the target chemical composition are listed in Table 6. It is observed that the luminescence efficiency measured by quantum efficiency is enhanced by addition of carbon in certain range in the composition. For example, in the group of 1.14, 1.15, 1.16, 1.17, 1.18, 1.19, 1.20, 1.21 and 1.22 in which the composition $Sr_2Si_5N_{8-[(4x/3)+z]}C_xO_{3z/2}:Eu_y^{2+}$ is comprised of the same amount of Eu and varied amount of carbon (x), luminescence emission reached the highest level of QE=104% and Em Int=119% at x=1.0.

TABLE 5

Weight amount of the raw materials for preparing composition $Sr_2Si_5N_{8-[(4x/3)+z]}C_xO_{3z/2}:Eu_y^{2+}$

| | Weight of raw materials (g) | | | |
|---|---|---|---|---|
| Example | $Sr_2N$ | $Si_3N_4$ | SiC | $Eu_2O_3$ |
| 1.14 | 1.2276 | 1.4540 | 0.1385 | 0.1216 |
| 1.15 | 1.2304 | 1.2954 | 0.2777 | 0.1219 |
| 1.16 | 1.2333 | 1.1361 | 0.4175 | 0.1222 |
| 1.17 | 1.2361 | 0.9761 | 0.5580 | 0.1224 |
| 1.18 | 1.2390 | 0.8153 | 0.6991 | 0.1227 |
| 1.19 | 1.2419 | 0.6537 | 0.8409 | 0.1230 |
| 1.20 | 1.2448 | 0.4915 | 0.9833 | 0.1233 |
| 1.21 | 1.3027 | 0.3434 | 1.1779 | 0.1292 |
| 1.22 | 1.3244 | 0 | 1.4968 | 0.1314 |
| 1.23 | 1.2670 | 1.4720 | 0.1402 | 0.0739 |
| 1.24 | 1.2770 | 1.3187 | 0.2827 | 0.0744 |
| 1.25 | 1.2870 | 1.1630 | 0.4274 | 0.0750 |
| 1.26 | 1.2973 | 1.0048 | 0.5744 | 0.0756 |
| 1.27 | 1.7091 | 0.9011 | 1.1590 | 0.1695 |
| 1.28 | 1.6762 | 1.9559 | 0.1863 | 0.1308 |
| 1.29 | 1.6893 | 1.7522 | 0.3756 | 0.1319 |
| 1.30 | 1.7161 | 1.3350 | 0.7631 | 0.1340 |
| 1.31 | 1.7437 | 0.9043 | 1.1631 | 0.1361 |
| 1.32 | 1.2477 | 0.3284 | 1.1264 | 0.1236 |

TABLE 6

Composition coefficients and luminescence properties for $Sr_2Si_5N_{8-[(4x/3)+z]}C_xO_{3z/2}:Eu_y^{2+}$

| Composition | | | Luminescence Characteristics ($\lambda_{exc}$ = 453 nm) | | | |
|---|---|---|---|---|---|---|
| | coefficient | | | Emission | FWHM | |
| Example | x | y | z | QE (%) | (%) | (nm) | $\lambda_{em}$ (nm) |
| 1.14 | 0.5 | 0.1 | 0.1 | 88.2 | 98.6 | 106 | 630 |
| 1.15 | 1.0 | 0.1 | 0.1 | 104.3 | 119.5 | 110 | 638 |

TABLE 6-continued

Composition coefficients and luminescence properties for $Sr_2Si_5N_{8-[(4x/3)+z]}C_xO_{3z/2}:Eu_y^{2+}$

| | Composition coefficient | | | Luminescence Characteristics ($\lambda_{exc}$ = 453 nm) | | | |
|---|---|---|---|---|---|---|---|
| Example | x | y | z | QE (%) | Emission (%) | FWHM (nm) | $\lambda_{em}$ (nm) |
| 1.16 | 1.5 | 0.1 | 0.1 | 98.3 | 111.8 | 109 | 638 |
| 1.17 | 2.0 | 0.1 | 0.1 | 93.1 | 106.7 | 112 | 638 |
| 1.18 | 2.5 | 0.1 | 0.1 | 87.8 | 100.1 | 112 | 638 |
| 1.19 | 3.0 | 0.1 | 0.1 | 94.2 | 106.4 | 98 | 631 |
| 1.20 | 3.5 | 0.1 | 0.1 | 90.3 | 102.6 | 101 | 632 |
| 1.21 | 4.0 | 0.1 | 0.1 | 66.7 | 74.6 | 94 | 626 |
| 1.22 | 5.0 | 0.1 | 0.1 | 54.7 | 60.1 | 96 | 628 |
| 1.23 | 0.5 | 0.06 | 0.06 | 101.2 | 114.3 | 99 | 626 |
| 1.24 | 1.0 | 0.06 | 0.06 | 97.3 | 108.8 | 95 | 629 |
| 1.25 | 1.5 | 0.06 | 0.06 | 89.1 | 98.4 | 92 | 622 |
| 1.26 | 2.0 | 0.06 | 0.06 | 98.6 | 100.9 | 91 | 622 |
| 1.27 | 3.0 | 0.1 | 0.1 | 89.0 | 93.6 | 97 | 625 |
| 1.28 | 0.5 | 0.08 | 0.08 | 106.8 | 119.6 | 90 | 624 |
| 1.29 | 1.0 | 0.08 | 0.08 | 103.7 | 113.6 | 90 | 625 |
| 1.30 | 2.0 | 0.08 | 0.08 | 94.7 | 99.7 | 93 | 624 |
| 1.31 | 3.0 | 0.08 | 0.08 | 87.5 | 94.2 | 92 | 621 |
| 1.32 | 4.0 | 0.1 | 0.1 | 82.3 | 93.9 | 103 | 635 |

Figure 7:
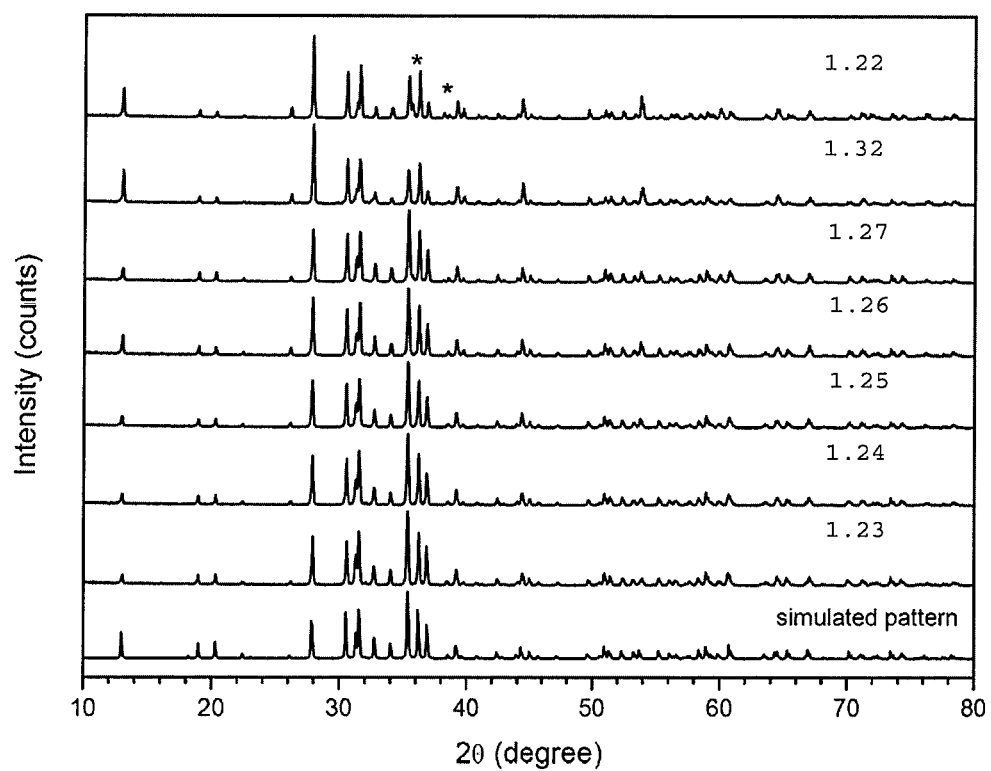
FIG. 7 depicts XRD patterns of samples 1.22, 1.32, 1.27, 1.26, 1.25, 1.24, and 1.23 of phosphor composition (1). The bottom-most simulated pattern is for $Sr_2Si_5N_8$ and is shown for reference. The asterisk in the upper-most pattern indicates SiC as a second phase in sample 1.22.
Figure 8:
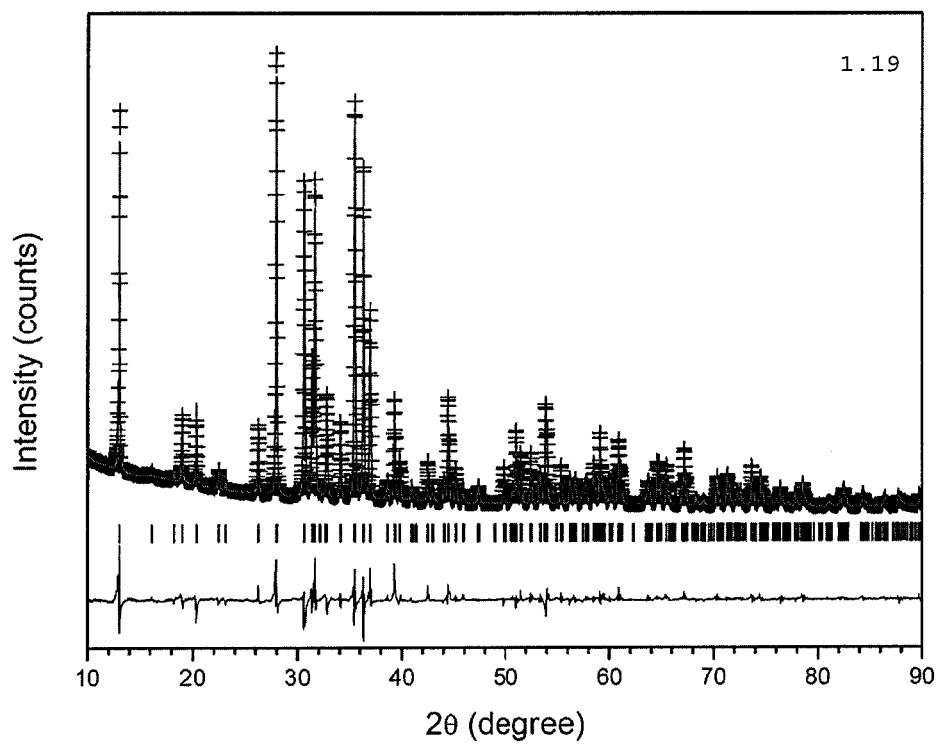
FIG. 8 depicts the Rietveld Refinement of the XRD pattern for $Sr_2Si_5N_{8-[(4x/3)+z]}C_xO_{3z/2}$:$Eu^{2+}$ (sample 1.19).
Figure 9:
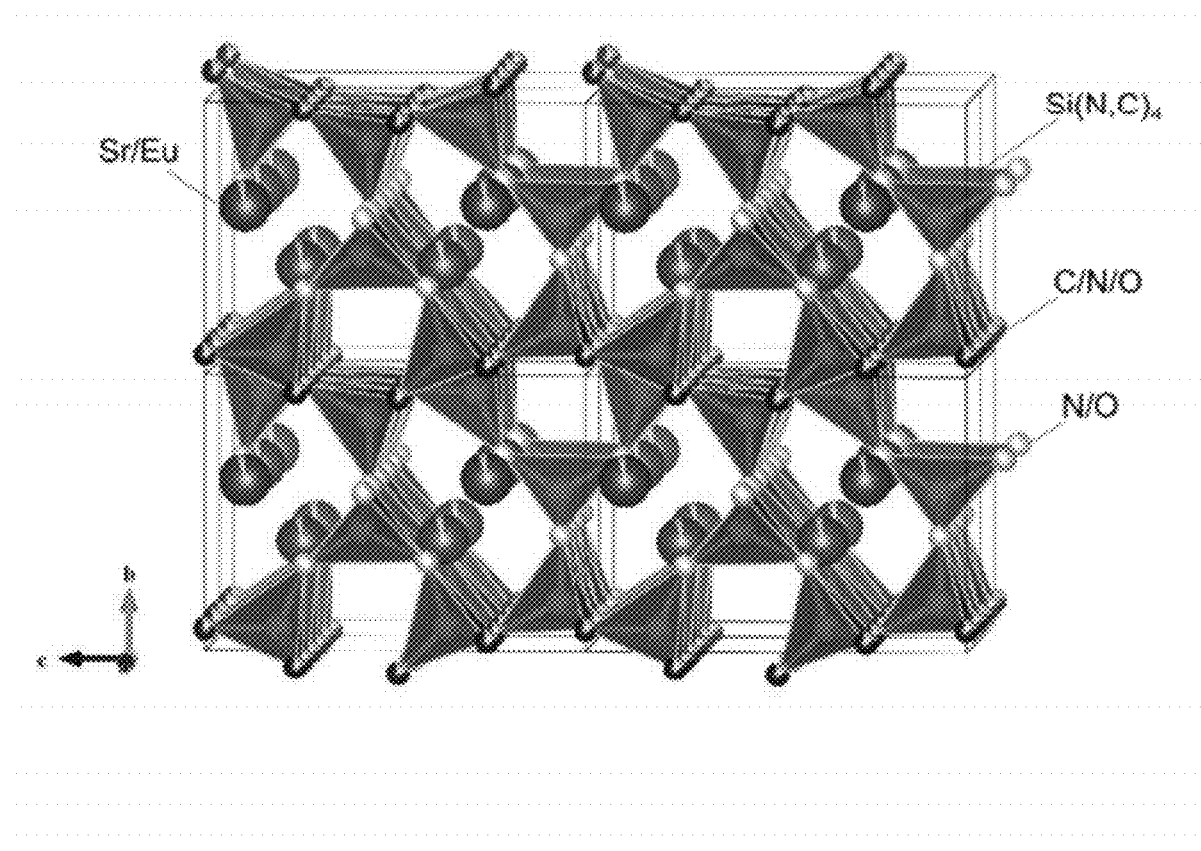
FIG. 9 depicts the projected crystal structure of sample 1.19 for $Sr_2Si_5N_{8-[(4x/3)+z]}C_xO_{3z/2}$:$Eu^{2+}$.

FIG. 7 illustrates the XRD patterns of the phosphors with varying amounts of carbon in the composition $Sr_2Si_5N_{8-(4x/3)+z}C_xO_{3z/2}:Eu^{2+}$. The diffraction patterns in FIG. 7 are arranged in order of the carbon content in the composition of the phosphors, i.e., the pattern for the sample 1.22 in the top position contains the highest amount of carbon (x=5.0) in the composition whereas the diffraction pattern for the sample 1.23 in the lowest position contains the lowest amount of carbon (x=0.5) in the composition. The simulated diffraction pattern for the crystalline compound $Sr_2Si_5N_8$ is presented at the bottom position as reference. The XRD patterns for the phosphors with low carbon content, for examples 1.23 and 1.24, are similar to that of $Sr_2Si_5N_8$ compound. Analyses of the observed XRD patterns indicate that the phosphors $Sr_2Si_5N_{8-(4x/3)+z}C_xO_{3z/2}:Eu^{2+}$ are isotypical to $Sr_2Si_5N_8$. As the carbon content increases, the diffraction pattern is changed, as observed for the samples 1.25, 1.26, 1.27, 1.32 and 1.22. In the phosphors with carbon content of x<4, the XRD patterns show pure single crystalline phase. When the carbon content increases to x>4, however, the diffractions from SiC crystalline phase appear in a XRD pattern of 1.22 in FIG. 7. FIGS. 8 and 9 depict the Reitveld Refinement and projected crystal structure of sample 1.19. The detailed crystal structure of the phosphors is summarized in Table 7. Here, it is worth noting that the carbon atoms can also distribute statistically on all N ($N^{[3]}$ and $N^{[2]}$) in the structure of the phosphor. Therefore, the crystal structure data are not limited by the results given in the tables.

TABLE 7

Crystallographic data for sample 1.19, $Sr_2Si_5N_{8-[(4x/3)+z]}C_xO_{3z/2}:Eu^{2+}$ (x = 3, Eu = 5 mol %)

| Chemical formula | $Sr_{1.9}Eu_{0.1}Si_5N_{3.9}C_3O_{0.15}$ |
|---|---|
| Crystal system | Orthorhombic |
| Space group | $Pmn2_1$ (No. 31) |
| Z | 2 |
| Lattice parameters (Å) | a = 5.6990(1), b = 6.7949(1), c = 9.3241(2) |
| Unit cell volume (Å³) | 361.07(1) |

| Atom | x/a | y/b | z/c | $U_{iso}$ * 100 | Site | S.O.F |
|---|---|---|---|---|---|---|

TABLE 7-continued

Crystallographic data for sample 1.19, $Sr_2Si_5N_{8-[(4x/3)+z]}C_xO_{3z/2}:Eu^{2+}$ (x = 3, Eu = 5 mol %)

| Sr1 | 0 | 0.87148 | 0.00080 | 1.51 | 2a | 0.950 |
|---|---|---|---|---|---|---|
| Eu1 | 0 | 0.87148 | 0.00080 | 1.51 | 2a | 0.050 |
| Sr2 | 0 | 0.87842 | 0.36869 | 1.45 | 2a | 0.950 |
| Eu2 | 0 | 0.87842 | 0.36869 | 1.45 | 2a | 0.050 |
| Si1 | 0.25363 | 0.66456 | 0.68498 | 1.35 | 4b | 1.000 |
| Si2 | 0 | 0.05557 | 0.67242 | 1.40 | 2a | 1.000 |
| Si3 | 0 | 0.41657 | 0.45568 | 1.38 | 2a | 1.000 |
| Si4 | 0 | 0.40949 | 0.89819 | 1.55 | 2a | 1.000 |
| N1 | 0 | 0.18900 | 0.52570 | 0.95 | 2a | 0.750 |
| O1 | 0 | 0.18900 | 0.52570 | 0.95 | 2a | 0.019 |
| N2 | 0.24872 | 0.91124 | 0.68790 | 0.84 | 4b | 0.750 |
| O2 | 0.24872 | 0.91124 | 0.68790 | 0.84 | 4b | 0.019 |
| N3 | 0.24781 | 0.45131 | 0.01017 | 0.59 | 4b | 0.213 |
| C3 | 0.24781 | 0.45131 | 0.01017 | 0.59 | 4b | 0.750 |
| O3 | 0.24781 | 0.45131 | 0.01017 | 0.59 | 4b | 0.019 |
| N4 | 0 | 0.58328 | 0.76932 | 0.51 | 2a | 0.213 |
| C4 | 0 | 0.58328 | 0.76932 | 0.51 | 2a | 0.750 |
| O4 | 0 | 0.58328 | 0.76932 | 0.51 | 2a | 0.019 |
| N5 | 0 | 0.17728 | 0.84570 | 0.43 | 2a | 0.750 |
| O5 | 0 | 0.17728 | 0.84570 | 0.43 | 2a | 0.019 |
| N6 | 0 | 0.42109 | 0.26456 | 0.71 | 2a | 0.213 |
| C6 | 0 | 0.42109 | 0.26456 | 0.71 | 2a | 0.750 |
| O6 | 0 | 0.42109 | 0.26456 | 0.71 | 2a | 0.019 |

Figure 10:
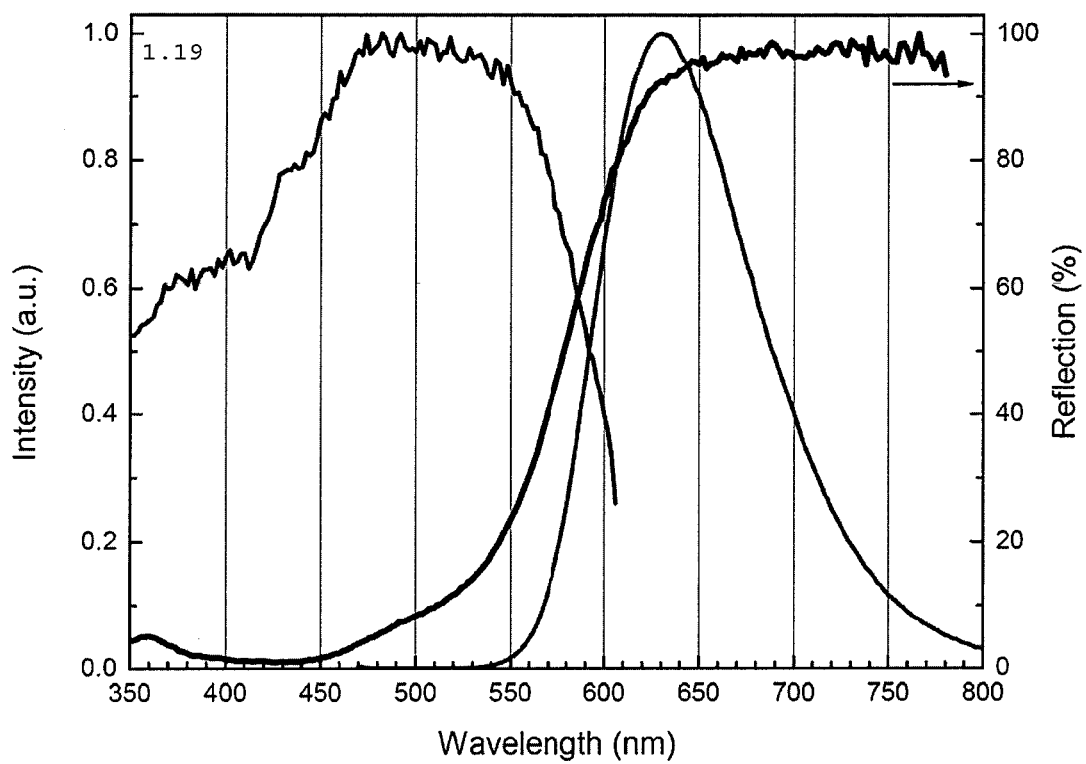
FIG. 10 depicts the luminescence excitation and emission spectra of sample 1.19 of composition (1) ($Sr_2Si_5N_{8-[(4x/3)+z]}C_xO_{3z/2}$:$Eu^{2+}$) under blue excitation at 453 nm.
Figure 11:
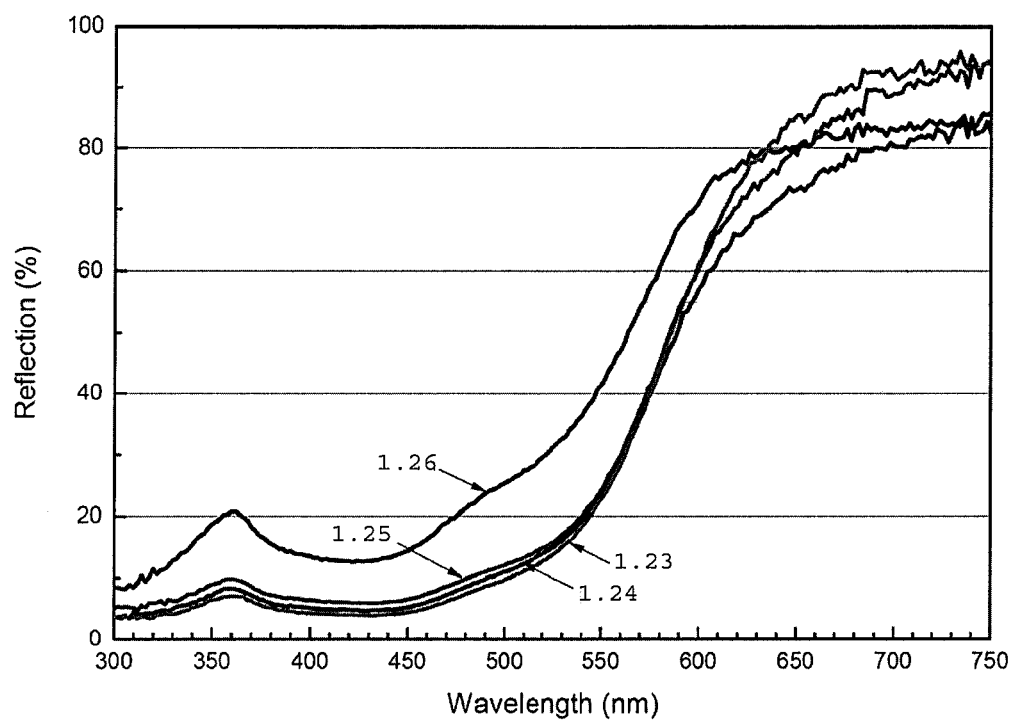
FIG. 11 depicts the reflectance spectra of samples 1.23, 1.24, 1.25, and 1.26 for phosphor composition (1) ($Sr_2Si_5N_{8-[(4x/3)+z]}C_xO_{3z/2}$:$Eu^{2+}$).
Figure 12:
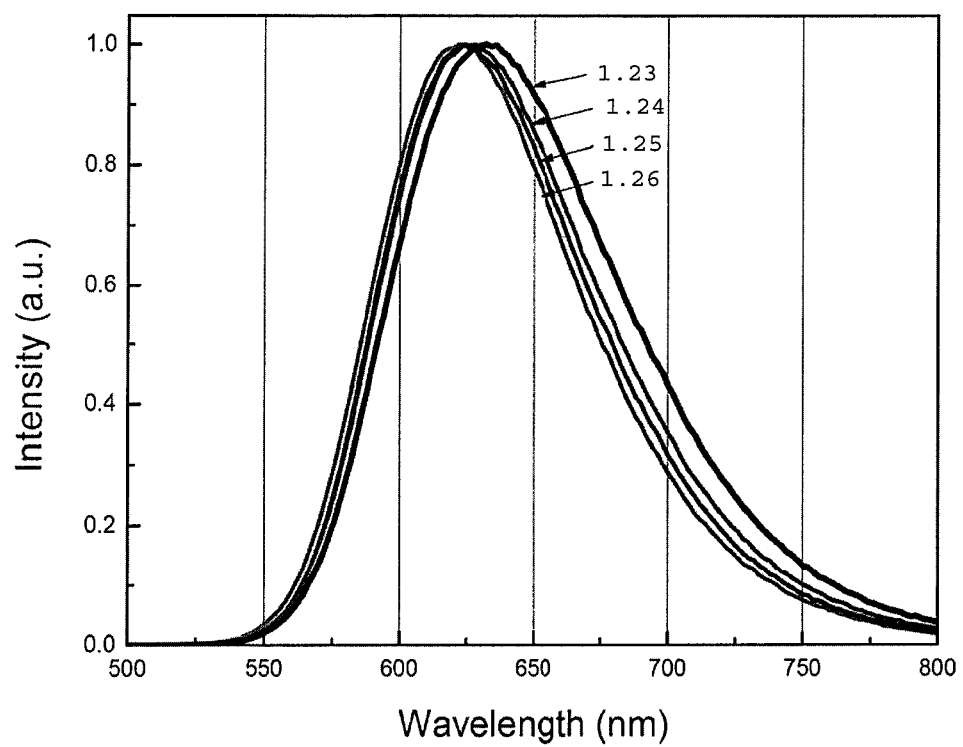
FIG. 12 depicts the effect of carbon content on the emission spectra of samples 1.23, 1.24, 1.25, and 1.26 of phosphor composition (1) ($Sr_2Si_5N_{8-[(4x/3)+z]}C_xO_{3z/2}$:$Eu^{2+}$) under blue excitation at 453 nm.
Figure 13:
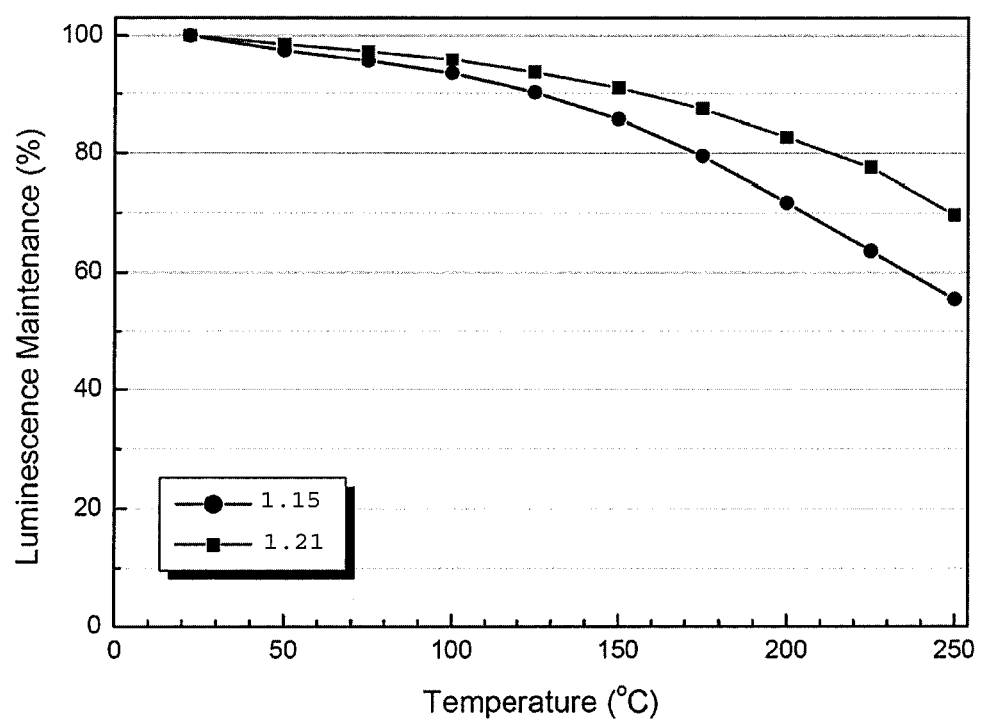
FIG. 13 depicts the thermal stability of samples 1.15 and 1.21 of phosphor composition (1) $Sr_2Si_5N_{8-[(4x/3)+z]}C_xO_{3z/2}$:$Eu^{2+}$ under blue excitation at 453 nm.

FIG. 10 depicts the luminescence excitation and emission spectra representative of the phosphors of the composition of $Sr_2Si_5N_{8-[(4x/3)+z]}C_xO_{3z/2}:Eu^{2+}$, as demonstrated by sample 1.19. The excitation profile shows an efficient excitation in the range from 350 nm to 550 nm. Meanwhile the reflectance profile in FIG. 11 shows a strong absorption in the same wavelength regime. Under near-UV and blue light excitation, the phosphor emits a red light at about 630 nm with a high quantum efficiency (~94.2%). Moreover, the emission bands can be tuned not only by the $Eu^{2+}$ concentration but also by the carbon content, as demonstrated in FIG. 12. The blue shift of the emission band can be ascribed to the incorporation of carbon in the nitride lattice which results in the expansion of the host lattice evidenced by the displacement of the XRD toward lower angle in FIG. 7. The blue shift of the emission peak is accompanied by the blue shift of the absorption edge of $Eu^{2+}$ as shown in FIG. 11. The lumen maintenance of the phosphors is more than 85% at 150° C. and both low (sample 1.15, x=1.0) and high (sample 1.21, x=4.0) carbon content phosphors show high thermal stability as shown in FIG. 13.

Example 2

Preparation and properties of phosphor compositions of family (2) $M(II)_2Si_5N_{8-[(4x/3)+z]}C_xO_{3z/2}:Eu^{2+}$ Samples of phosphor composition $M(II)_2Si_5N_{8-[(4x/3)+z]}C_xO_{3z/2}:Eu_y^{2+}$ (i.e., composition (2)) were made by a solid state reaction with the starting materials of strontium nitride ($Sr_2N$ or $Sr_3N_2$), calcium nitride ($Ca_3N_2$), barium nitride ($Ba_3N_2$), silicon nitride ($\alpha$—$Si_3N_4$ or $\beta$—$Si_3N_4$), silicon carbide ($\alpha$—SiC or $\beta$—SiC), europium nitride (EuN) in designed ratios listed in Table 8. The preparations followed the procedure of high temperature and post-firing treatments described above. The luminescence properties of the phosphor products along with the target chemical composition are listed in Table 9. Specific examples are further discussed below.

TABLE 8

Weight amount of the raw materials for preparing composition $M(II)_2Si_5N_{8-[(4x/3)+z]}C_xO_{3z/2}:Eu_y^{2+}$ (M(II) = Ba, Ca, Sr or mixtures thereof)

| | Weight of raw materials (g) | | | | | |
|---|---|---|---|---|---|---|
| Example | $Ba_3N_2$ | $Ca_3N_2$ | $Sr_2N$ | $Si_3N_4$ | SiC | EuN |
| 2.1 | 1.5889 | 0 | 0 | 1.0751 | 0.2305 | 0.0954 |
| 2.2 | 2.1656 | 0 | 0 | 1.4351 | 0.3076 | 0.0764 |
| 2.3 | 1.6419 | 0 | 0 | 1.0769 | 0.2309 | 0.0382 |
| 2.4 | 0.1898 | 0 | 1.0978 | 1.2842 | 0.2753 | 0.1140 |
| 2.5 | 2.2012 | 0 | 0 | 1.0902 | 0.6232 | 0.0774 |
| 2.6 | 0 | 0.1835 | 1.3948 | 1.8274 | 0.3917 | 0.1622 |
| 2.7 | 0 | 1.1762 | 0 | 1.7212 | 0.9839 | 0.1222 |

TABLE 9

Composition coefficient and luminescence properties of the phosphors composition $M(II)_2Si_5N_{8-[(4x/3)+z]}C_xO_{3z/2}:Eu_y^{2+}$ (M(II) = Ba, Ca, Sr or mixtures thereof)

| | Composition coefficient | | | Luminescence Characteristics ($\lambda_{exc}$ = 453 nm) | | | |
|---|---|---|---|---|---|---|---|
| Example | x | y | z | QE (%) | Emission (%) | FWHM (nm) | $\lambda_{em}$ (nm) |
| 2.1 | 1.0 | 0.1 | 0.1 | 66.2 | 74.3 | 109 | 626 |
| 2.2 | 1.0 | 0.06 | 0.06 | 72.8 | 75.3 | 98 | 594 |
| 2.3 | 1.0 | 0.04 | 0.04 | 66.1 | 69.0 | 88 | 585 |
| 2.4 | 1.0 | 0.1 | 0.1 | 90.3 | 100.6 | 98 | 631 |
| 2.5 | 2.0 | 0.06 | 0 | 59.3 | 63.8 | 112 | 625 |
| 2.6 | 1.0 | 0.1 | 0.1 | 93.2 | 100.6 | 114 | 647 |
| 2.7 | 2.0 | 0.06 | 0 | 20.6 | 21.6 | 97 | 608 |

Example 2.1

Figure 14A:
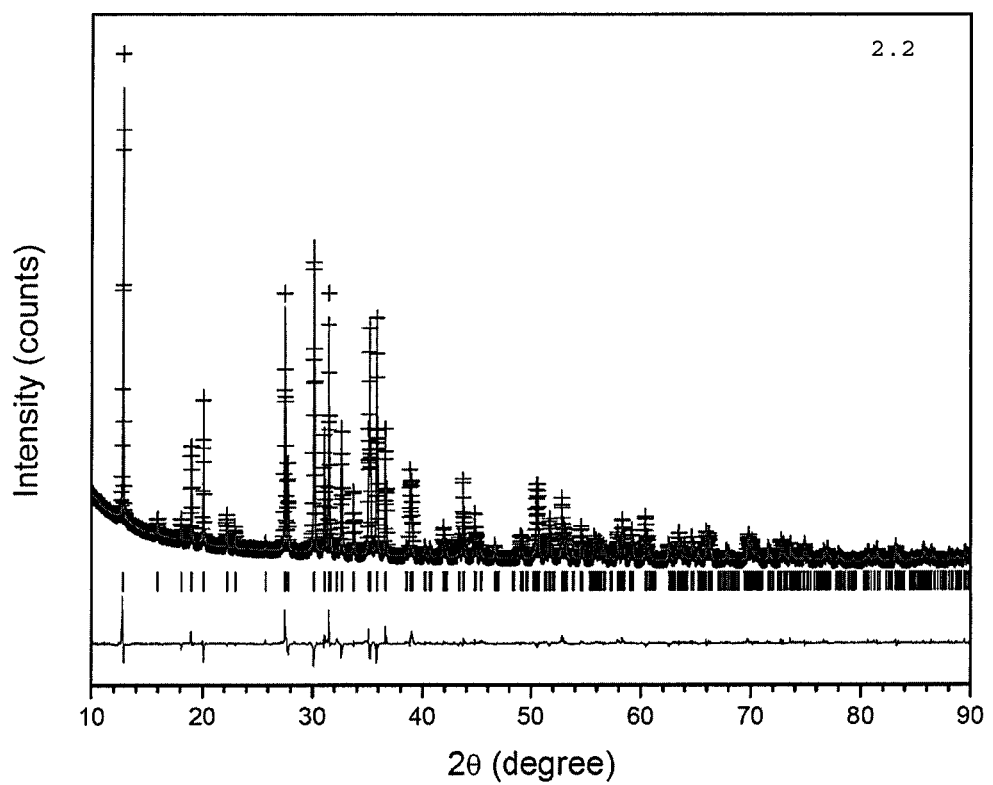
FIG. 14A depicts the Rietveld Refinement of the XRD pattern of sample 2.2 for phosphor composition $Ba_2Si_5N_{8-(4x/3)}C_x$:$Eu^{2+}$.
Figure 14B:
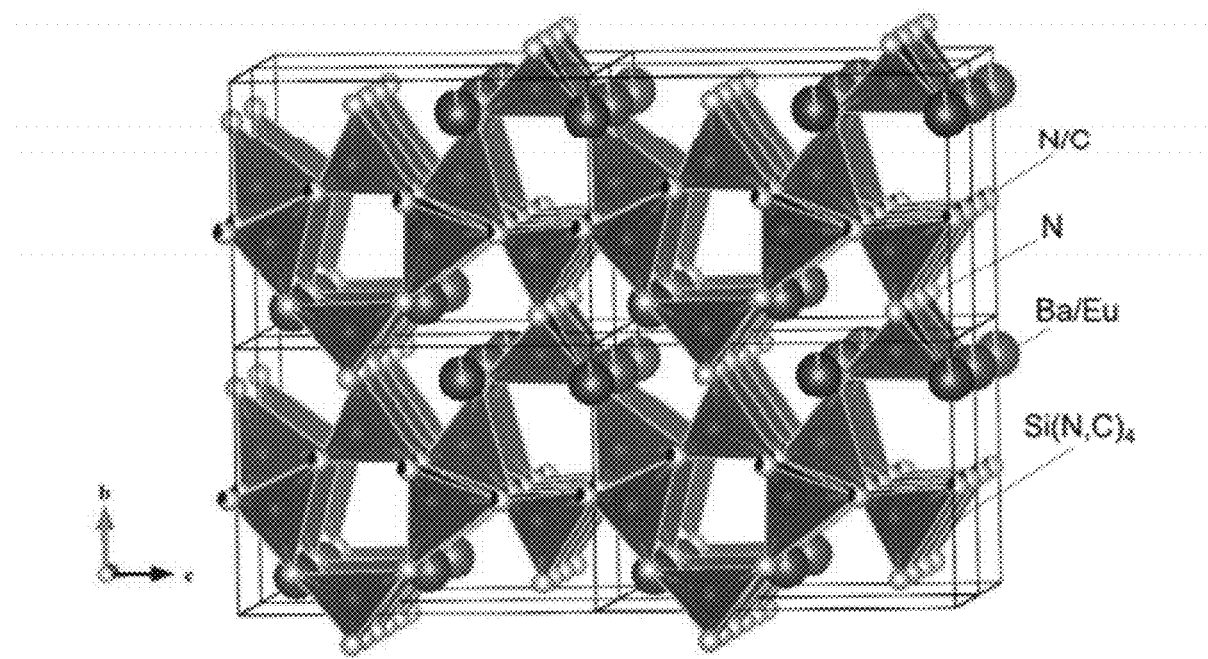
FIG. 14B depicts the projected crystal structure of sample 2.2.
Figure 15:
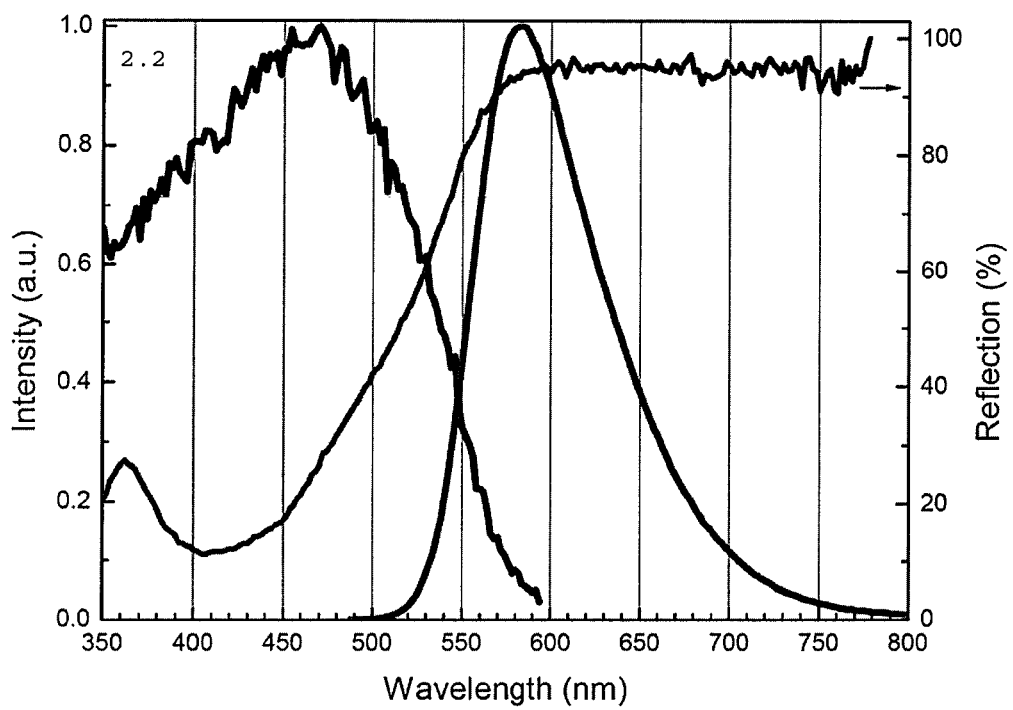
FIG. 15 depicts the excitation and emission spectra of sample 2.2, as well as the reflectance spectra, for a phosphor of $Ba_2Si_5N_{8-(4x/3)}C_x$:$Eu^{2+}$ (sample 2.2) under blue excitation at 453 nm.
Figure 16:
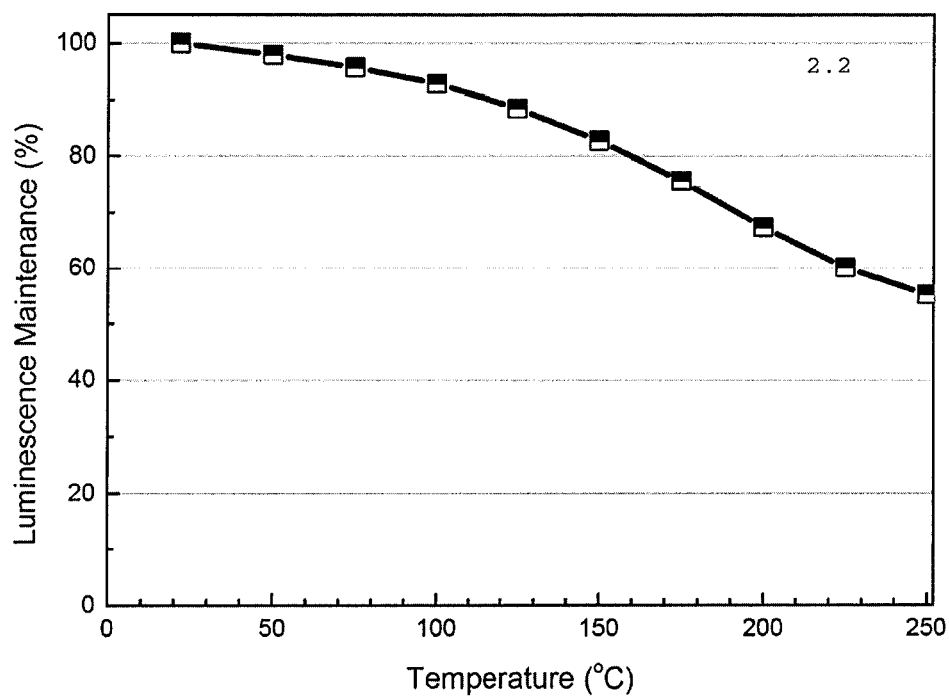
FIG. 16 depicts the thermal stability of sample 2.2 for phosphor composition (2) ($Ba_2Si_5N_{8-(4x/3)}C_x$:$Eu^{2+}$ under blue excitation at 453 nm.

$Ba_2Si_5N_{8-(4x/3)}C_x:Eu^{2+}$. The Rietveld refinement analysis (FIG. 14A) of the X-ray diffraction pattern demonstrates that the phosphor (sample 2.2) is a pure crystalline phase material and its crystal structure of $Ba_2Si_5N_{8-(4x/3)}C_8:Eu^{2+}$ (x=1) is similar to that of nitride compound $Ba_2Si_5N_8$. The crystal structure data are summarized in Table 10. FIG. 14B depicts the projected crystal structure of this sample. Under excitation in the wavelength range of 370-520 nm, this phosphor emits orangish-yellow or orange-red light in the range of 580-650 nm peaking at about 590 nm (FIG. 15). The emission peak wavelength is dependent on the concentration of Eu in the composition as observed in Tables 8 and 9. This phosphor exhibits a good thermal stability of luminescence. The lumen maintenance is more than 80% at 150° C. as shown in FIG. 16.

TABLE 10

Crystallographic data for sample 2.2, $Ba_2Si_5N_{8-(4x/3)}C_x:Eu^{2+}$ (x = 1, Eu = 5 mol %)

| Chemical formula | $Ba_{1.9}Eu_{0.1}Si_5N_{6.6667}C$ |
|---|---|
| Crystal system | Orthorhombic |
| Space group | $Pmn2_1$ (No. 31) |
| Z | 2 |
| Lattice parameters (Å) | a = 5.7679(1), b = 6.9338(1), c = 9.3675(1) |
| Unit cell volume (Å³) | 374.64(1) |

| Atom | x/a | y/b | z/c | $U_{iso}$ * 100 | Site | S.O.F |
|---|---|---|---|---|---|---|
| Ba1 | 0 | 0.85627 | −0.00204 | 1.17 | 2a | 0.970 |
| Eu1 | 0 | 0.85627 | −0.00204 | 1.17 | 2a | 0.030 |
| Ba2 | 0 | 0.87841 | 0.63231 | 1.50 | 2a | 0.970 |
| Eu2 | 0 | 0.87841 | 0.63231 | 1.50 | 2a | 0.030 |
| Si1 | 0.25263 | 0.66783 | 0.31997 | 0.72 | 4b | 1.000 |
| Si2 | 0 | 0.05543 | 0.31925 | 1.19 | 2a | 1.000 |
| Si3 | 0 | 0.42027 | 0.53981 | 0.62 | 2a | 1.000 |
| Si4 | 0 | 0.39673 | 0.10308 | 1.27 | 2a | 1.000 |
| N1 | 0 | 0.16896 | 0.47335 | 0.18 | 2a | 1.000 |
| N2 | 0.24705 | 0.90019 | 0.33090 | 0.16 | 4b | 1.000 |
| N3 | 0.25410 | 0.44685 | 0.99639 | 0.30 | 4b | 0.667 |
| C3 | 0.25410 | 0.44685 | 0.99639 | 0.30 | 4b | 0.250 |
| N4 | 0 | 0.57731 | 0.23237 | 0.24 | 2a | 0.667 |
| C4 | 0 | 0.57731 | 0.23237 | 0.24 | 2a | 0.250 |
| N5 | 0 | 0.15814 | 0.15053 | 0.13 | 2a | 1.000 |
| N6 | 0 | 0.42127 | 0.73598 | 0.14 | 2a | 0.667 |
| C6 | 0 | 0.42127 | 0.73598 | 0.14 | 2a | 0.250 |

Example 2.2

Figure 17A:
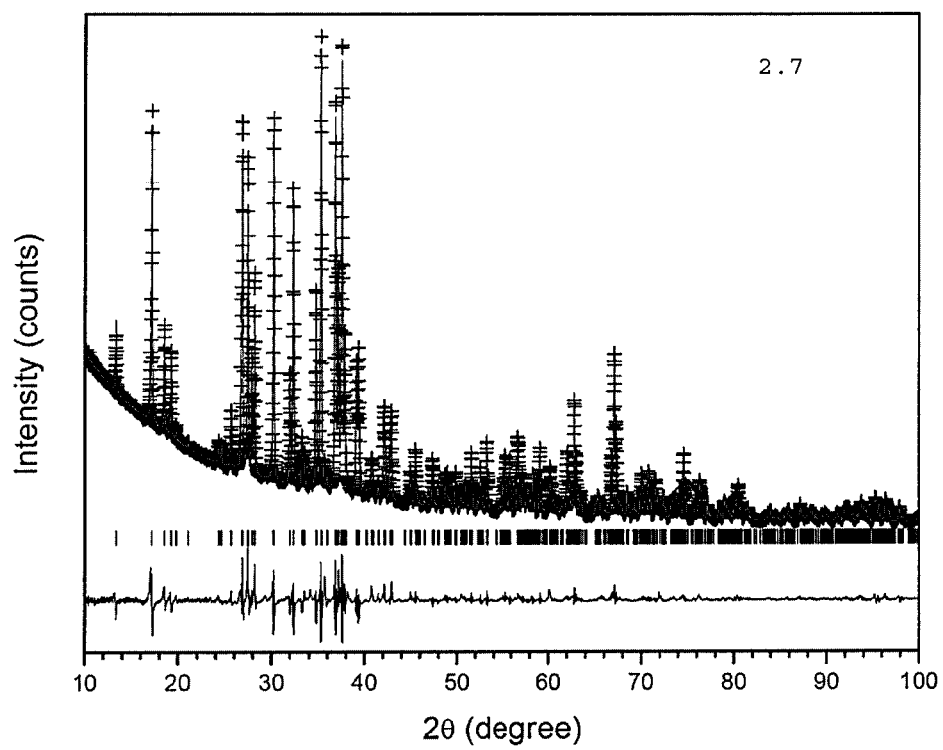
FIG. 17A depicts the Rietveld refinement of the XRD pattern of a phosphor of $Ca_2Si_5N_{8-(4x/3)}C_x$:$Eu^{2+}$ (sample 2.7).
Figure 17B:
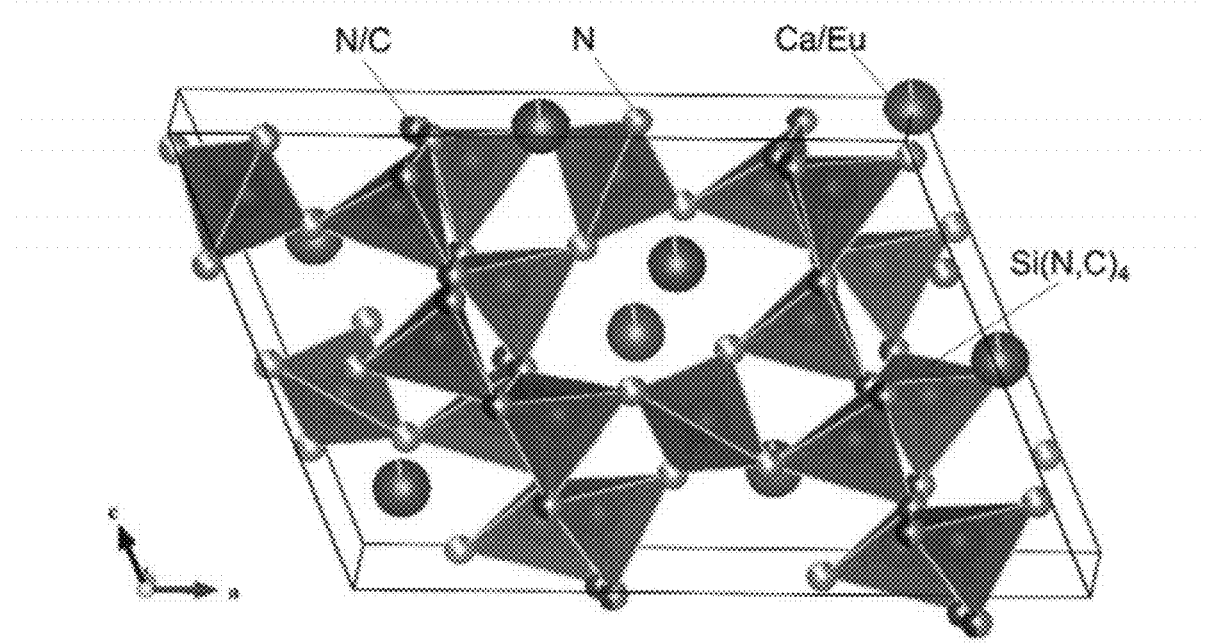
FIG. 17B depicts the projection of the crystal structure of sample 2.7.

$Ca_2Si_5N_{8-(4x/3)}C_x:Eu^{2+}$ ($Ca_2Si_5N_{8-[(4x/3)+z]}C_xO_{3z/2}:Eu^{2+}$ where z=0, x=2). The Rietveld refinement of the XRD pattern of this phosphor composition (sample 2.7) demonstrates that the resultant product is pure single phase carbidonitride whose XRD pattern is similar to that of $Ca_2Si_5N_8$ nitride compound, as shown in FIG. 17A. However, due to the incorporation of carbon into the lattice, the internal structure is deviated from the nitride lattice. The projection of the crystal structure is shown in FIG. 17B. The determined crystal structure data are summarized in Table 11. In the structure of this phosphor crystal, the carbon atom is partially occupied the N position with the form of $N^{[3]}$ in the lattice, as visualized in a model in FIG. 17B. Alternatively, the carbon atoms can also distribute statistically on all N ($N^{[3]}$ and $N^{[2]}$) in the structure of the phosphor. Therefore, the crystal structure data are not limited by the results given in the table.

TABLE 11

Crystallographic data for sample 2.7, $Ca_2Si_5N_{8-(4x/3)}C_x:Eu^{2+}$ (x = 2, Eu = 3 mol %)

| Chemical formula | $Ca_{1.94}Eu_{0.06}Si_5N_{5.3333}C_2$ |
|---|---|
| Crystal system | Monoclinic |
| Space group | Cc (No. 9) |
| Z | 4 |
| Lattice parameters (Å) | a = 14.3171(1), b = 5.5988(1), c = 9.6684(1) |
| | β = 112.08(1)° |
| Unit cell volume (Å³) | 718.18(1) |

| Atom | x/a | y/b | z/c | $U_{iso}$ * 100 | Site | S.O.F |
|---|---|---|---|---|---|---|
| Ca1 | −0.0007 | 0.7657 | −0.0010 | 1.35 | 4a | 0.97 |
| Eu1 | −0.0007 | 0.7657 | −0.0010 | 1.35 | 4a | 0.03 |
| Ca2 | 0.6117 | 0.7480 | 0.2005 | 1.80 | 4a | 0.97 |
| Eu2 | 0.6117 | 0.7480 | 0.2005 | 1.80 | 4a | 0.03 |
| Si1 | 0.0633 | 0.8055 | 0.3498 | 1.30 | 4a | 1.00 |
| Si2 | 0.7592 | 0.2146 | 0.3213 | 1.08 | 4a | 1.00 |
| Si3 | 0.7536 | 0.4962 | 0.0592 | 1.38 | 4a | 1.00 |
| Si4 | 0.3663 | 0.2038 | 0.3701 | 1.70 | 4a | 1.00 |
| Si5 | 0.8552 | 0.0024 | 0.1246 | 0.98 | 4a | 1.00 |
| N1 | 0.9848 | 0.6400 | 0.4297 | 0.14 | 4a | 0.8334 |
| N2 | 0.1270 | 0.0018 | 0.9890 | 0.19 | 4a | 0.8334 |
| N3 | 0.7979 | 0.2508 | 0.1711 | 0.18 | 4a | 0.50 |
| C3 | 0.7979 | 0.2508 | 0.1711 | 0.18 | 4a | 0.50 |
| N4 | 0.8012 | 0.7601 | 0.1673 | 0.26 | 4a | 0.50 |
| C4 | 0.8012 | 0.7601 | 0.1673 | 0.26 | 4a | 0.50 |
| N5 | 0.9807 | 0.9969 | 0.2122 | 0.48 | 4a | 0.8334 |
| N6 | 0.8314 | 0.0116 | 0.9410 | 0.47 | 4a | 0.50 |
| C6 | 0.8314 | 0.0116 | 0.9410 | 0.47 | 4a | 0.50 |
| N7 | 0.6294 | 0.1565 | 0.2699 | 0.12 | 4a | 0.8334 |
| N8 | 0.7971 | 0.4845 | 0.4119 | 0.12 | 4a | 0.50 |
| C8 | 0.7971 | 0.4845 | 0.4119 | 0.12 | 4a | 0.50 |

Figure 18:
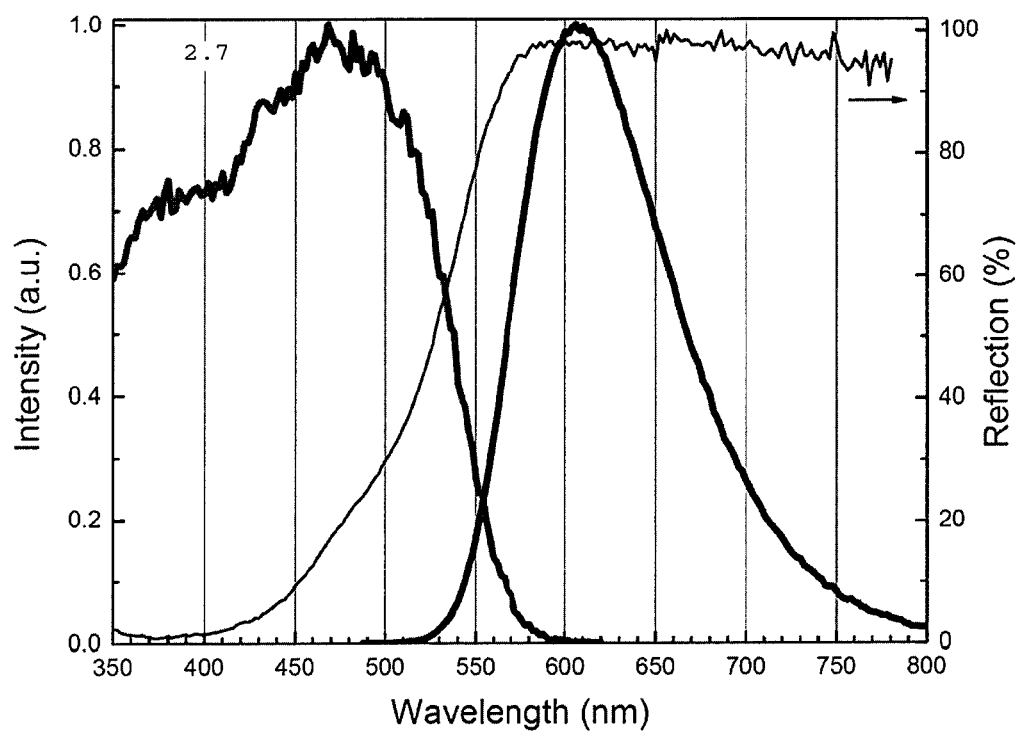
FIG. 18 depicts the excitation and emission spectra of sample 2.7, as well as the reflectance spectra, for a phosphor of $Ca_2Si_5N_{8-(4x/3)}C_x$:$Eu^{2+}$ (sample 2.7) under blue excitation at 453 nm.
Figure 19:
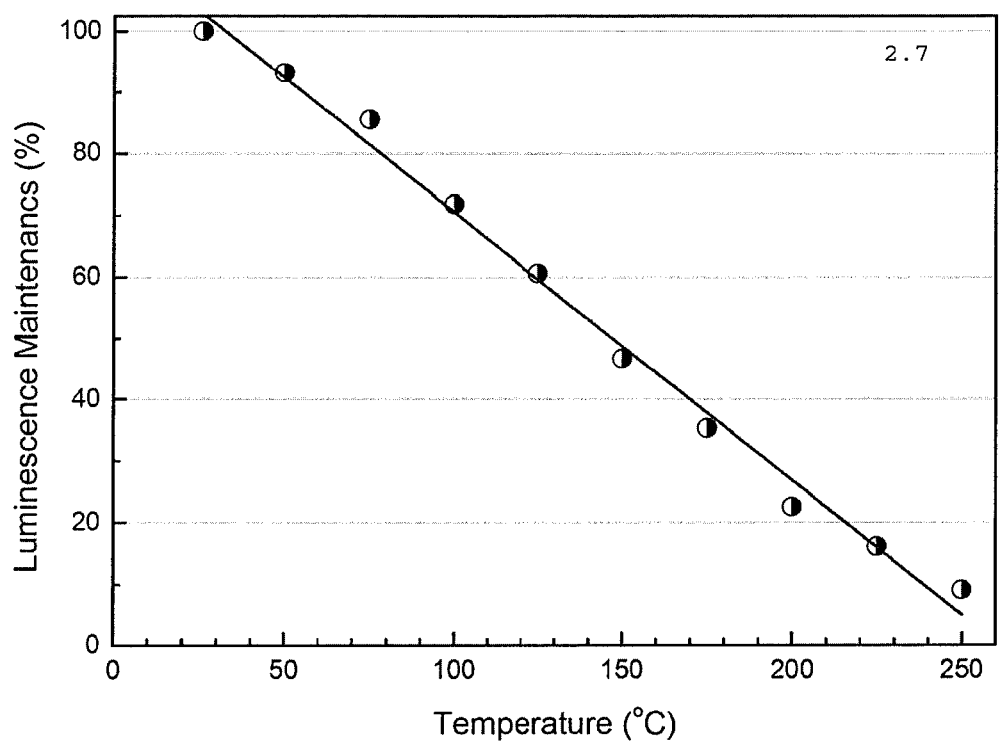
FIG. 19 depicts the thermal stability of sample 2.7 of phosphor composition (2) ($Ca_2Si_5N_{8-(4x/3)}C_x$:$Eu^{2+}$ under blue excitation at 453 nm.

The phosphor $Ca_2Si_5N_{8-(4x/3)}C_x:Eu^{2+}$ (x=2) is efficiently excited by visible light in the wavelength range of 370 nm to 540 nm (FIG. 18) and emits orange-red light with a broad emission band centered at about 610 nm. It is observed that the emission peak position of this phosphor is varied by Eu concentration and substitution of Ca by other metals such as Sr or Ba or mixture of both. The thermal quenching profile of the phosphor is shown in FIG. 19. The emission intensity of this phosphor decreases nonlinearly with the increase of temperature.

Example 2.3

Figure 20:
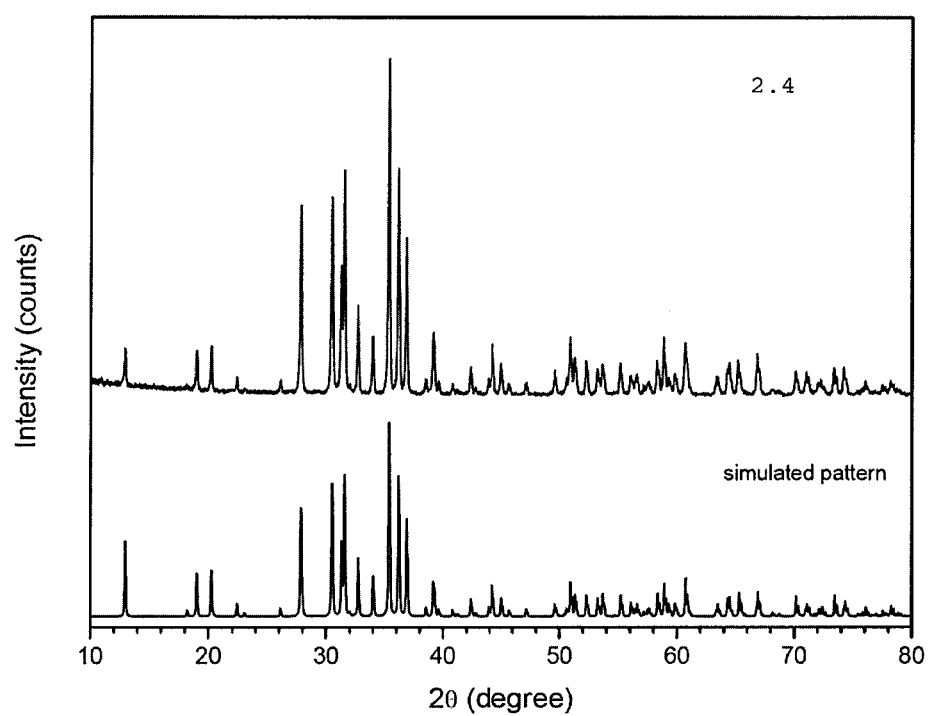
FIG. 20 depicts the XRD pattern of a phosphor (sample 2.4) of composition (2) $(Sr_{0.9}Ba_{0.1})_{1.9}Eu_{0.1}Si_5N_{8-(4x/3)}C_x$:$Eu^{2+}$.

$(Sr_{0.9}Ba_{0.1})_{1.9}Eu_{0.1}Si_5N_{8-(4x/3)}C_x:Eu^{2+}$. The XRD pattern of this phosphor composition (sample 2.4, $(Sr_{0.9}Ba_{0.1})_2$ $Si_5N_{8-[(4x/3)+z]}C_xO_{3z/2}:Eu^{2+}$ (z=0, x=1)) shows a pure crystalline phase (FIG. 20). The diffraction pattern approximately matches the simulated pattern of $Sr_2Si_5N_8$ as shown in FIG. 20. The diffractions shift to low diffraction angle (2θ) relative to those of the simulated pattern of $Sr_2Si_5N_8$. The shift of the diffractions are attributed to carbon content and Ba replacement for Sr in the crystal structure.

Figure 21:
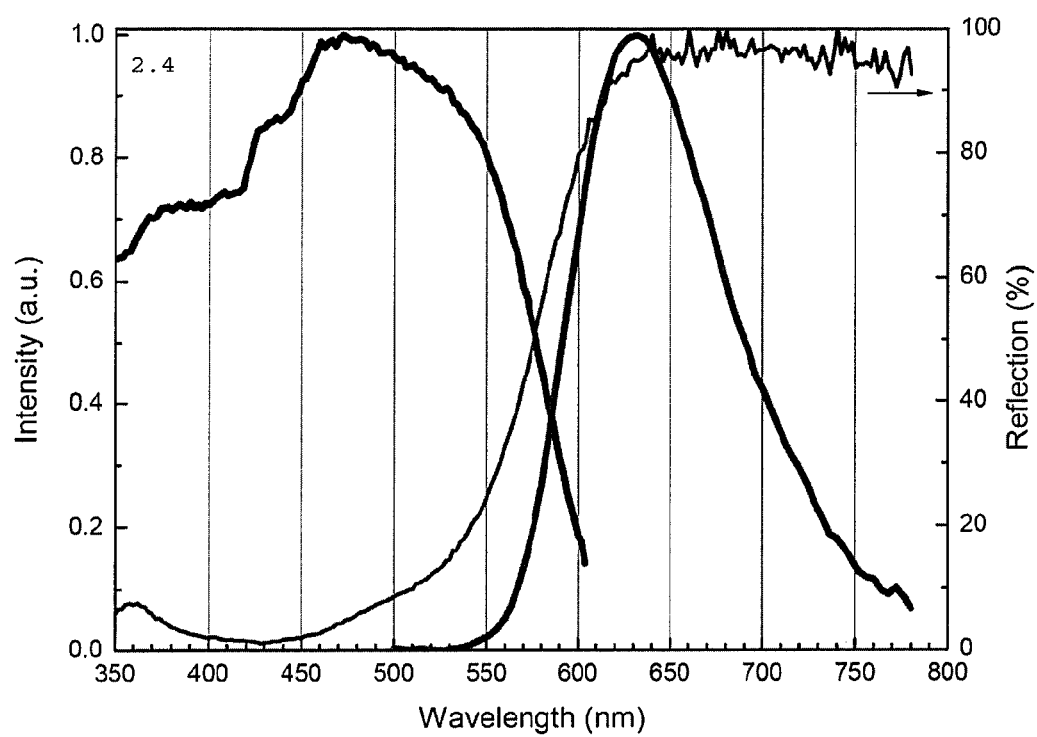
FIG. 21 depicts the excitation profile (left curve) and emission spectrum (right curve), as well as the reflectance spectra, of a phosphor (sample 2.4) for composition (2) $(Sr_{0.9}Ba_{0.1})_{1.9}Eu_{0.1}Si_5N_{8-(4x/3)}C_x$:$Eu^{2+}$ under blue excitation at 453 nm.

FIG. 21 shows the excitation and emission spectra (under blue excitation at 453 nm) the phosphor (sample 2.4) together with the reflectance profile of the phosphor. It is evident that the phosphor has a strong absorption in the spectral range of 370 to 550 nm, and can be efficiently excited by near-UV and blue lights. The absorbed energy from blue light can convert red light from the electron transition of $4f^65d^1 \rightarrow 4f^7$ of $Eu^{2+}$. The emission band is located at relatively longer wavelength at about 632 nm with the incorporation of Ba (or Ca) as expected for this phosphor, i.e., red shift, and the emission peak can also be tuned by the content $Eu^{2+}$ in the composition.

Figure 22:
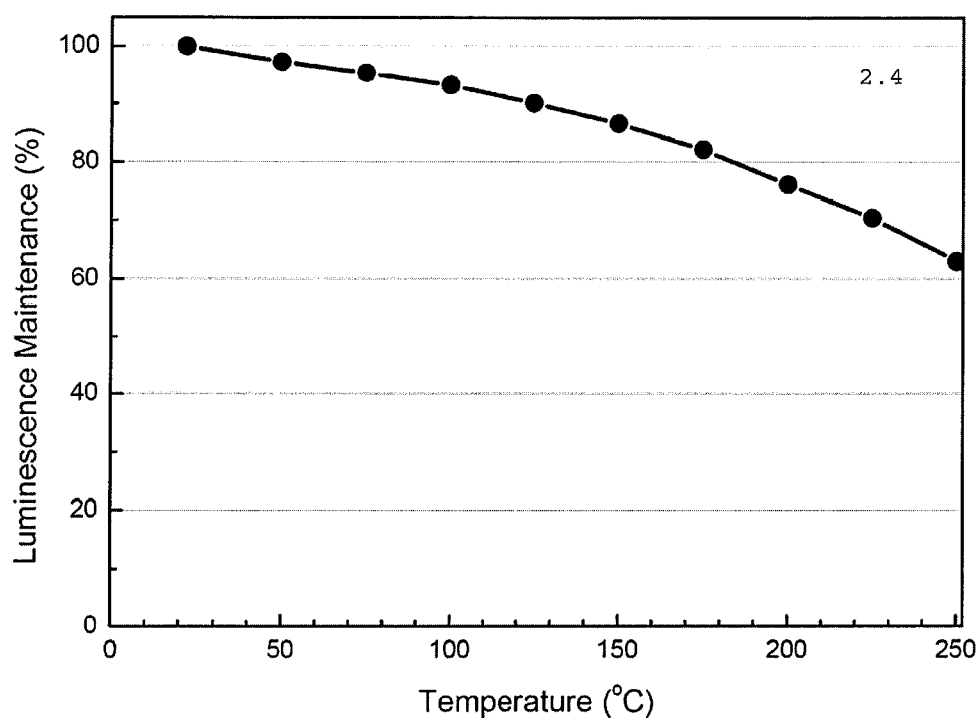
FIG. 22 depicts the thermal stability of sample 2.4 of phosphor composition (2) $((Sr_{0.9}Ba_{0.1})_2Si_5N_{8-(4x/3)}C_x:Eu^{2+})$ under blue excitation at 453 nm.

The temperature dependence curve of $(Sr_{0.9}Ba_{0.1})_2Si_5$ $N_{8-(4x/3)}C_x:Eu^{2+}$ (x=1, Eu=5 mol %) in FIG. 22 demonstrates this red phosphor possess high thermal stability at high temperature. The residual emission intensity is about 85% at 150° C. of its room temperature intensity.

Example 3

Preparation and properties of phosphor compositions of family (3) $M(II)_{2-w}M(I)_{2w}Si_5N_{8-[(4x/3)+z]}C_xO_{3z/2}:Eu^{2+}$ The samples of phosphor composition $M(II)_{2-w}M(I)_{2w}Si_5N_{8-[(4x/3)+z]}C_xO_{3z/2}:Eu^{2+}$ were produced by a solid state reaction with the starting materials of metal nitrides, pure metal, silicon nitride ($\alpha$—$Si_3N_4$ or $\beta$—$Si_3N_4$), silicon carbide ($\alpha$—SiC or $\beta$—SiC), europium nitride (EuN) and europium oxide ($Eu_2O_3$) in designed ratios listed in Table 12. The preparations followed the procedure of high temperature and post-firing treatments described above. The luminescence properties of the phosphor products along with the target chemical composition are listed in Table 13. Specific examples are further discussed below.

TABLE 12

Weight amounts of raw materials for preparing composition $M(II)_{2-w}M(I)_{2w}Si_5N_{8-[(4x/3)+z]}C_xO_{3z/2}:Eu_y^{2+}$ (M(II) = Ca, Sr, Ba; M(I) = Li, Na)

| | Weight of raw materials (g) | | | | | | | | |
|---|---|---|---|---|---|---|---|---|---|
| Example | $Sr_2N$ | $Ca_3N_2$ | $Ba_3N_2$ | $Si_3N_4$ | SiC | $Eu_2O_3$ | EuN | $Li_3N$ | Na |
| 3.1 | 1.2018 | 0 | 0 | 1.3357 | 0.2863 | 0 | 0.1185 | 0.0166 | 0 |
| 3.2 | 1.1858 | 0 | 0 | 1.3179 | 0.2825 | 0.1240 | 0 | 0.0164 | 0 |
| 3.3 | 1.2083 | 0 | 0 | 1.3066 | 0.2801 | 0.1229 | 0 | 0.0081 | 0 |
| 3.4 | 1.6219 | 0 | 0 | 1.3539 | 0.7740 | 0.1698 | 0 | 0.0224 | 0 |
| 3.5 | 1.3582 | 0 | 0 | 1.4577 | 0.8333 | 0.1828 | 0 | 0.1206 | 0 |
| 3.6 | 1.6484 | 0 | 0 | 0.9174 | 1.1799 | 0.1726 | 0 | 0.0228 | 0 |
| 3.7 | 1.6356 | 0 | 0 | 0.9102 | 1.1707 | 0.1713 | 0 | 0 | 0.0447 |
| 3.8 | 0 | 1.0499 | 0 | 2.4838 | 0.2366 | 0.2077 | 0 | 0.0274 | 0 |
| 3.9 | 0 | 0 | 2.0738 | 1.4598 | 0.3129 | 0 | 0.1036 | 0 | 0.0359 |

TABLE 13

Composition coefficient and luminescence properties of the phosphors composition $M(II)_{2-w}M(I)_{2w}Si_5N_{8-[(4x/3)+z]}C_xO_{3z/2}:Eu_y^{2+}$ (M(II) = Ca, Sr, Ba; M(I) = Li, Na)

| | | | | | Luminescence Characteristics ($\lambda_{exc}$ = 453 nm) | | | |
|---|---|---|---|---|---|---|---|---|
| | Composition coefficient | | | | QE | Emission | FWHM | $\lambda_{em}$ |
| Example | x | y | z | w | (%) | (%) | (nm) | (nm) |
| 3.1 | 1.0 | 0 | 0 | 0.1 | 92.1 | 104.5 | 114 | 641 |
| 3.2 | 1.0 | 0.1 | 0.1 | 0.1 | 86.7 | 99.1 | 113 | 643 |
| 3.3 | 1.0 | 0.1 | 0.1 | 0.05 | 100.4 | 114 | 114 | 638 |
| 3.4 | 2.0 | 0.1 | 0.1 | 0.1 | 92.8 | 98.1 | 95 | 629 |
| 3.5 | 2.0 | 0.1 | 0.1 | 0.5 | 85.3 | 78.7 | 102 | 632 |
| 3.6 | 3.0 | 0.1 | 0.1 | 0.1 | 85.1 | 91.7 | 96 | 627 |
| 3.7 | 3.0 | 0.1 | 0.1 | 0.1 | 86.6 | 90.9 | 100 | 627 |
| 3.8 | 0.5 | 0.1 | 0.1 | 0.1 | 32.6 | 36.7 | 103 | 618 |
| 3.9 | 1.0 | 0.08 | 0.08 | 0.1 | 60.4 | 64.7 | 112 | 626 |

Figure 23:
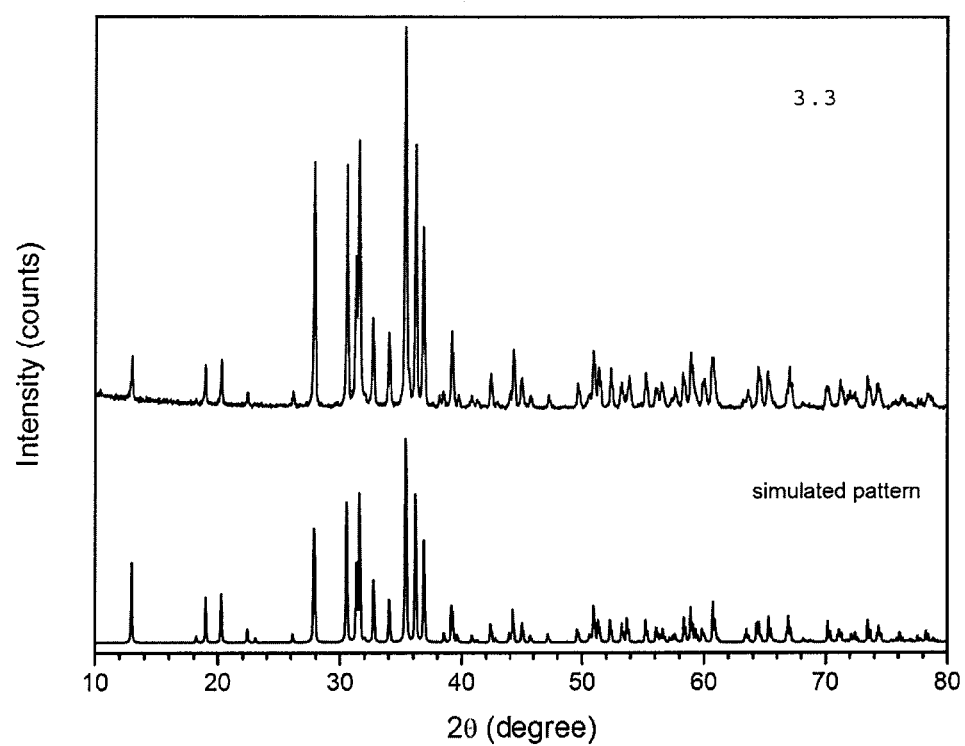
FIG. 23 depicts the XRD pattern of sample 3.3 of composition (3). The simulated pattern for $Sr_2Si_5N_8$ is shown for reference.

FIG. 23 shows the XRD pattern of phosphor sample 3.3. The diffraction pattern shows a pure single phase and is similar to that of the phosphors in Example 1.2., suggesting that Sr ions in the crystal structure are partially substituted by Li or Na. It is seen that the reflection peaks are shifted to higher diffraction angles (2θ) while the relative intensity of the peaks altered from those of $Sr_2Si_5N_8$ compound. This fact suggests the shrinkage of the unit cell of the crystal owing to the replacement of Sr by smaller sized ions, Li or Na, in the crystal structure.

Figure 24:
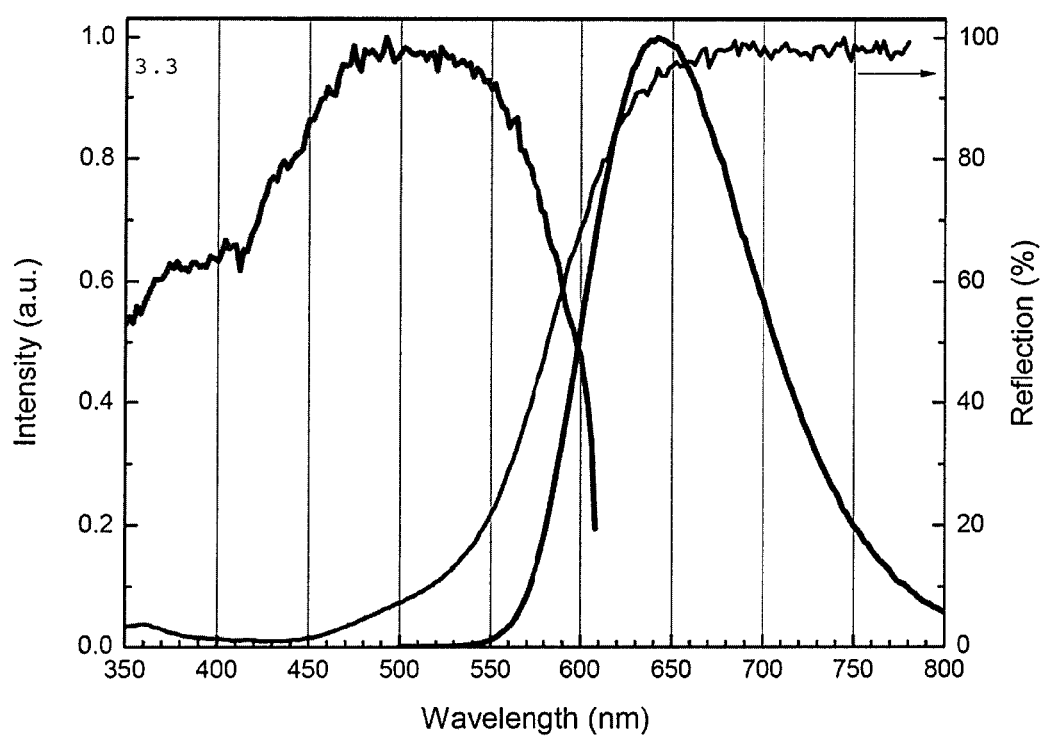
FIG. 24 depicts the excitation and emission spectra under blue excitation at 453 nm, as well as the reflectance spectra, for sample 3.3 of composition (3).
Figure 25:
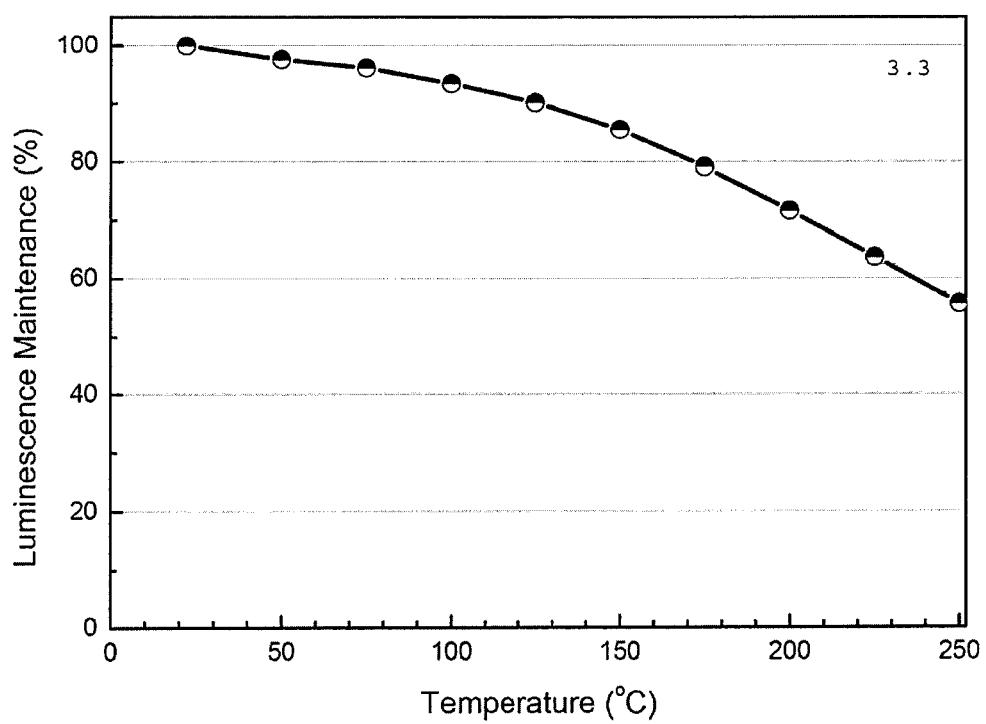
FIG. 25 depicts the thermal stability for sample 3.3 of composition (3) under blue excitation at 453 nm.

Under near-UV and blue light excitation, the phosphors emit red light in a wavelength range of 550-750 nm. The emission peak varied in a wavelength range from 618 to 643 nm (Table 13) depending on the content of Eu, C, Li and Na in the phosphor composition. The sample of phosphor 3.3 efficiently emits red light in the wavelength range of 550-750 nm having peak at about 643 nm as shown in FIG. 24. The thermal quenching of the luminescence emission of the phosphor is shown in FIG. 25. The lumen maintenance is about 85% at 150° C., indicating that the phosphor has high thermal stability of emission.

Example 4

Preparation and properties of phosphor compositions of family (4) $M(II)_{2-w}M(I)_{2w}Si_{5-m}M(III)_m N_{8-[(4x/3)+z+m]}C_xO_{(3z/2)+m}$:A The samples of phosphor composition $M(II)_{2-w}M(I)_{2w}Si_{5-m}M(III)_mN_{8-[(4x/3)+z+m]}C_xO_{(3z/2)+m}$:Eu were synthesized by a solid state reaction with the starting materials of the metal nitrides, the metal oxides, silicon nitride ($\alpha$—$Si_3N_4$ or $\beta$—$Si_3N_4$), silicon carbide ($\alpha$—SiC or $\beta$—SiC), europium nitride (EuN) or europium oxide ($Eu_2O_3$) and silicon oxide. The above starting materials were weighed out in designed amounts listed in Table 14 and then mixed and/or grinded in a glovebox under dried $N_2$ atmosphere. Subsequently, the powder mixture was fired at 1450-1750° C. for about 8-12 hrs in a high temperature furnace under $N_2/H_2$ atmosphere. After firing, the product was grinded and sieved, and washed with water. The composition coefficients and luminescence properties of the phosphor products are listed in Table 15.

TABLE 14

Weight amounts of raw materials for preparing composition
$M(II)_{2-w}M(I)_{2w}Si_{5-m}M(III)_mN_{8-[(4x/3)+z+m]}C_xO_{(3z/2)+m}$:Eu
[M(II) = Ca, Sr, Ba; M(I) = Li, Na; M(III) = B, Al]

| | Weight of raw materials (g) | | | | | | | | |
|---|---|---|---|---|---|---|---|---|---|
| Example | $Sr_2N$ | $Ca_3N_2$ | $Ba_3N_2$ | $Si_3N_4$ | SiC | $Eu_2O_3$ (EuN) | $Li_3N$ (Na) | $Al_2O_3$ | $SiO_2$ | AlN (BN) |
| 4.1 | 1.6556 | 0 | 0 | 1.7021 | 0.3742 | 0.1642 | 0 | 0.0476 | 0 | 0 |
| 4.2 | 1.6648 | 0 | 0 | 1.6141 | 0.3741 | 0.1642 | 0 | 0.1427 | 0 | 0 |
| 4.3 | 1.6354 | 0 | 0 | 1.6725 | 0.3774 | 0.1656 | 0.0109 | 0.0960 | 0 | 0 |
| 4.4 | 1.6681 | 0 | 0 | 1.5845 | 0.3748 | 0.1645 | 0 | 0.0983 | 0.0953 | 0 |
| 4.5 | 1.5805 | 0 | 0 | 1.7049 | 0.3749 | 0.1645 | 0.0217 | 0.0477 | 0 | 0 |
| 4.6 | 1.6920 | 0 | 0 | 1.2410 | 0.7601 | 0.1668 | 0 | 0.0644 | 0 | 0.0259 |
| 4.7 | 1.7188 | 0 | 0 | 0.7654 | 1.1582 | 0.1694 | 0 | 0.0982 | 0 | 0.0395 |
| 4.8 | 0 | 1.0747 | 0 | 2.4186 | 0.2357 | 0.2069 | 0.0136 | 0.0599 | 0 | 0 |
| 4.9 | 0 | 1.0610 | 0 | 2.4273 | 0.2365 | (0.1566) | 0.0274 | 0.0601 | 0 | 0 |
| 4.10 | 0 | 0 | 2.0363 | 1.5943 | 0.1553 | 0.1286 | (0.0356) | 0.0395 | 0 | 0 |
| 4.11 | 0 | 0 | 2.0596 | 1.5042 | 0.2331 | (0.1029) | 0.0180 | 0.0395 | 0 | 0 |
| 4.12 | 1.4150 | 0 | 0.2443 | 1.6520 | 0.3728 | 0.1636 | 0.0216 | 0.0632 | 0 | 0.0254 |
| 4.13 | 1.6784 | 0 | 0 | 1.6267 | 0.3770 | 0.1654 | 0 | 0 | 0.0565 | (0.0467) |
| 4.14 | 1.6966 | 0 | 0 | 1.4444 | 0.3811 | 0.1672 | 0 | 0 | 0.1428 | (0.1179) |
| 4.15 | 1.6368 | 0 | 0 | 1.5402 | 0.3694 | 0.1621 | 0 | 0 | 0.2353 | 0 |
| 4.16 | 1.5847 | 0 | 0 | 1.5336 | 0.3757 | 0.1649 | 0.0218 | 0.0478 | 0.2252 | 0 |
| 4.17 | 1.5850 | 0 | 0 | 0.9094 | 0.7516 | 0.1649 | 0.0218 | 0 | 0.5209 | 0 |
| 4.18 | 1.3969 | 0 | 0.2412 | 1.5021 | 0.3680 | 0.1615 | 0.0213 | 0.0468 | 0.2206 | 0 |

TABLE 15

Composition coefficient and luminescence properties of the phosphors
$M(II)_{2-w}M(I)_{2w}Si_{5-m}M(III)_mN_{8-[(4x/3)+z+m]}C_xO_{(3z/2)+m}$:Eu
[M(II) = Ca, Sr, Ba; M(I) = Li, Na; M(III) = B, Al]

| | Composition coefficient | | | | Luminescence Characteristics ($\lambda_{exc}$ = 453 nm) | | | |
|---|---|---|---|---|---|---|---|---|
| Example | x | z | w | m | QE (%) | Emission (%) | FWHM (nm) | $\lambda_{em}$ (nm) |
| 4.1 | 1.0 | 0.1 | 0 | 0 | 96.0 | 106.1 | 95 | 630 |
| 4.2 | 1.0 | 0.1 | 0 | 0.3 | 98.0 | 111.0 | 103 | 632 |
| 4.3 | 1.0 | 0.1 | 0.05 | 0.2 | 98.3 | 105.4 | 99 | 635 |
| 4.4 | 1.0 | 0.1 | 0 | 0.2 | 103.7 | 116.8 | 102 | 638 |
| 4.5 | 0.98 | 0.1 | 0.1 | 0.1 | 101.9 | 111.2 | 100 | 632 |
| 4.6 | 2 | 0.1 | 0 | 0.2 | 74.6 | 80.9 | 103 | 634 |
| 4.7 | 3 | 0.1 | 0 | 0.3 | 58.5 | 64.7 | 101 | 628 |
| 4.8 | 0.5 | 0.1 | 0.05 | 0.1 | 7.5 | 8.3 | 83 | 616 |
| 4.9 | 0.5 | 0.08 | 0.1 | 0.1 | 15.4 | 17.3 | 97 | 618 |
| 4.10 | 0.5 | 0.1 | 0.1 | 0.1 | 53.3 | 56.8 | 117 | 629 |
| 4.11 | 0.75 | 0.08 | 0.1 | 0.1 | 43.9 | 46.6 | 115 | 628 |
| 4.12 | 1.0 | 0.1 | 0.1 | 0.2 | 91.4 | 96.5 | 102 | 631 |
| 4.13 | 1.0 | 0.1 | 0 | 0.2 | 103.2 | 112.5 | 96 | 628 |
| 4.14 | 1.0 | 0.1 | 0 | 0.5 | 99.9 | 108.9 | 98 | 627 |
| 4.15 | 1.0 | 0.667 | 0 | 0 | 93.4 | 101.7 | 102 | 631 |
| 4.16 | 1.0 | 0.667 | 0.1 | 0.1 | 98.6 | 107.5 | 108 | 632 |
| 4.17 | 2 | 1.333 | 0.1 | 0 | 83.4 | 88.4 | 111 | 638 |
| 4.18 | 1 | 0.667 | 0.1 | 0.1 | 89.0 | 97.5 | 108 | 637 |

Example 4.1

Figure 26:
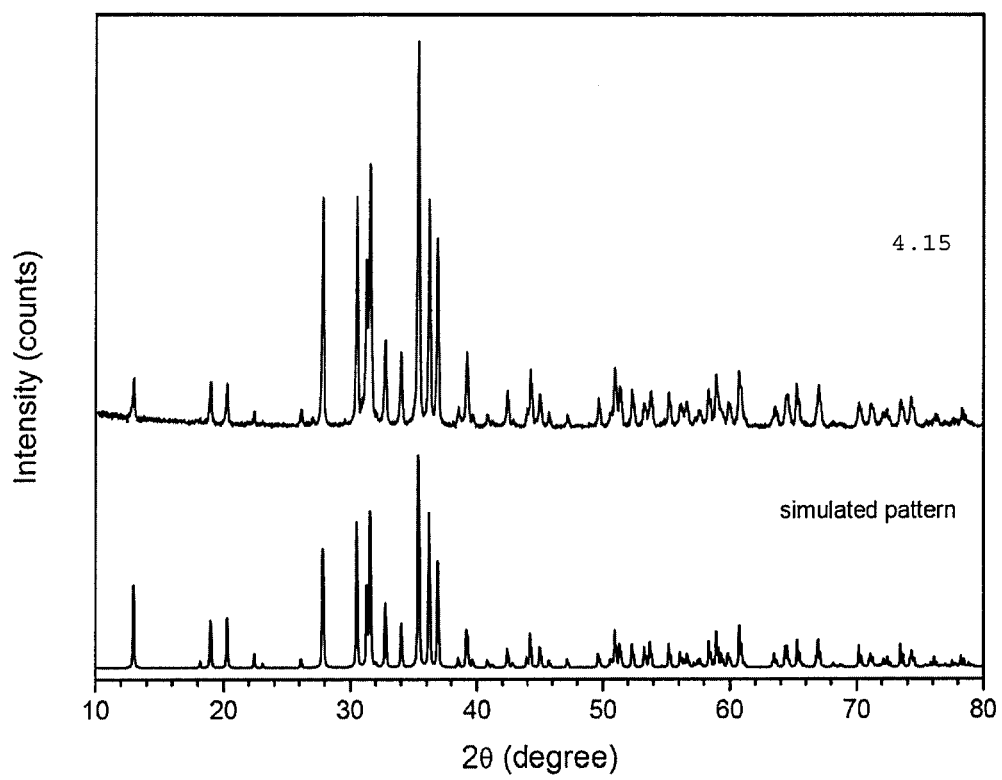
FIG. 26 depicts the XRD pattern for sample 4.15 of composition (4) $Sr_{1.9}Si_5N_6CO:Eu$. The simulated pattern for $Sr_2Si_5N_8$ is shown for reference.
Figure 27:
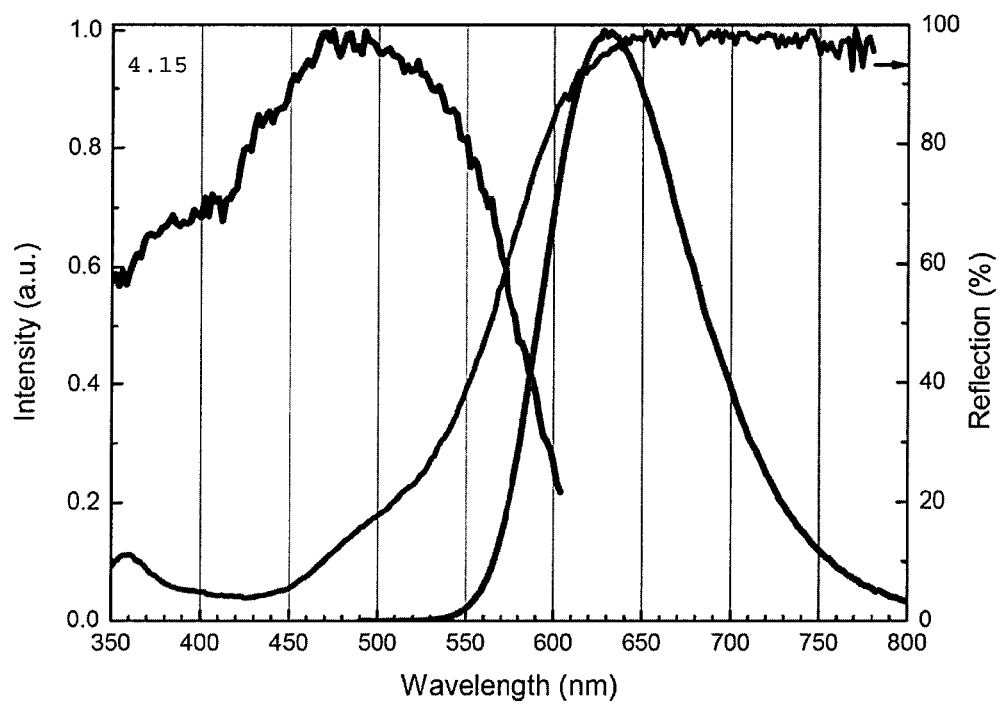
FIG. 27 depicts the excitation and emission spectra under blue excitation at 453 nm, as well as the reflection spectra, for sample 4.15 of composition (4) $Sr_{1.9}Si_5N_6CO:Eu$.

$Sr_{2-w}Li_{2w}Si_5N_{8-[(4x/3)+z]}C_xO_{3z/2}$:Eu. This phosphor composition (sample 4.15) was designed to have equal molar amount of oxygen and carbon, i.e., x=3z/2, in the composition. In such a composition, the cross-substitution of $(CO)^{6-} \rightarrow 2N^{3-}$ is targeted to introduce less defects than those phosphor compositions having x≠3z/2. It is clearly seen in the XRD pattern shown in FIG. 26 that the phosphor product is a pure single phase crystal. The crystal structure of the phosphor is similar to that compound $Sr_2Si_5N_8$. This phosphor has high absorption in the spectral range of 370-550 nm and can be efficiently excited by near-UV and blue light, as shown in FIG. 27, which emits red light with a emission peak at about 631 nm. On the other hand, the emission band of Eu can also be tuned by the incorporation of Al, B, and Li/Na, as well as changing C/N/O ratio.

Figure 28:
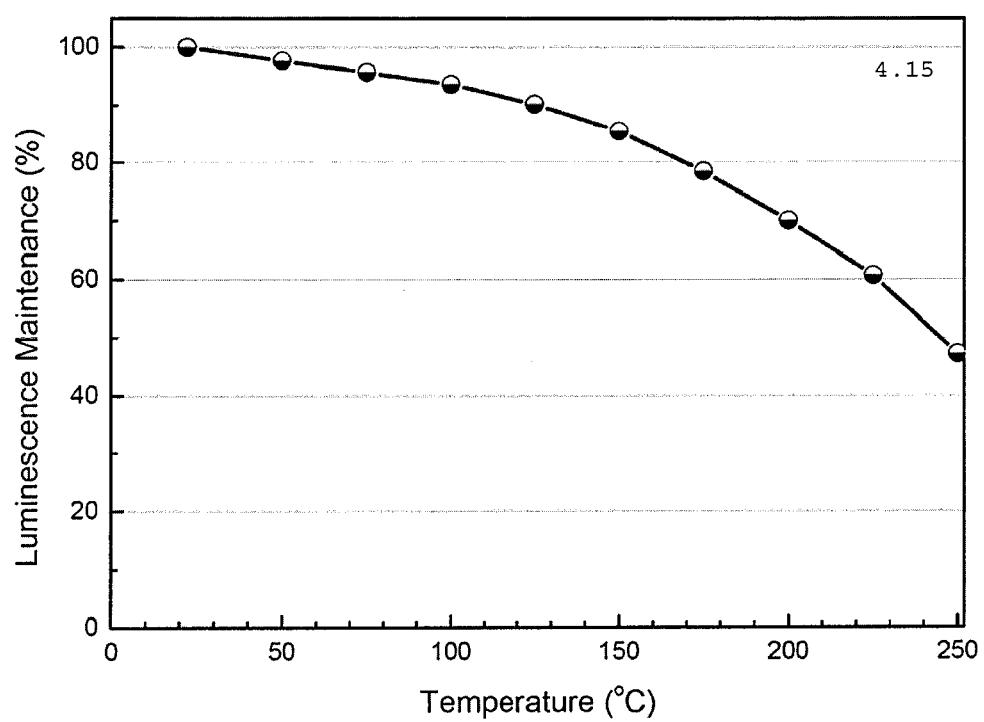
FIG. 28 depicts the thermal stability for sample 4.15 of composition (4) $Sr_{1.9}Si_5N_6CO:Eu$ under blue excitation at 453 nm.

The temperature dependence of the luminescence of this silicon carbidonitride (FIG. 28) shows that the luminescence maintenance at 150° C. is above 80% of initial intensity at room temperature, suggesting high thermal stability of this phosphor.

Example 4.2

Figure 29:
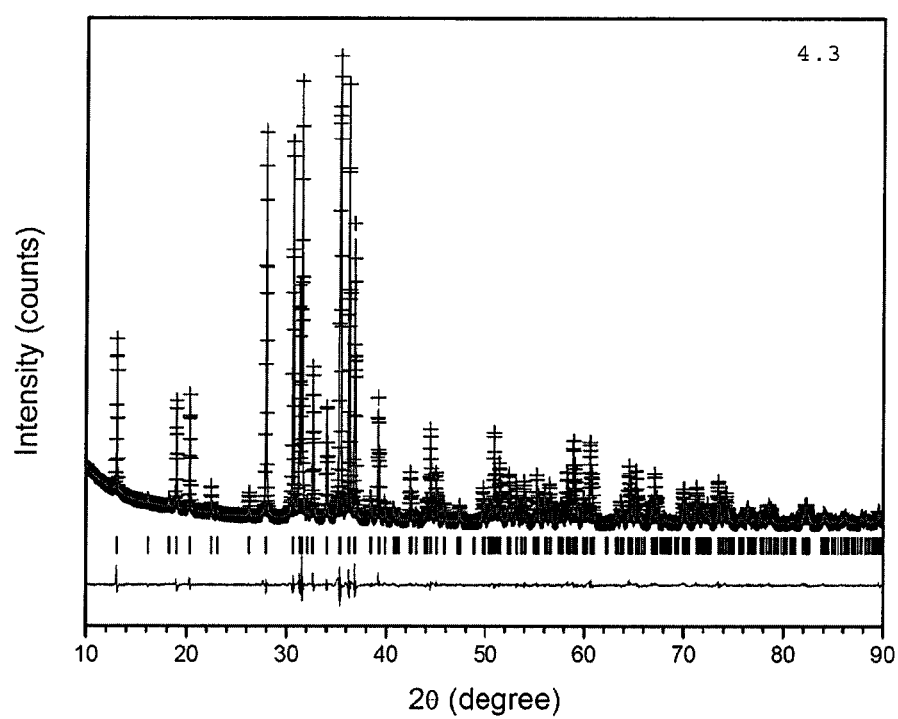
FIG. 29 depicts the Rietveld Refinement of the XRD pattern for sample 4.3 of composition (4) $Sr_{2-w}Li_{2w}Si_{5-m}Al_mN_{8-[(4x/3)+z+m]}C_xO_{(3z/2)+m}:Eu^{2+}$.
Figure 30:
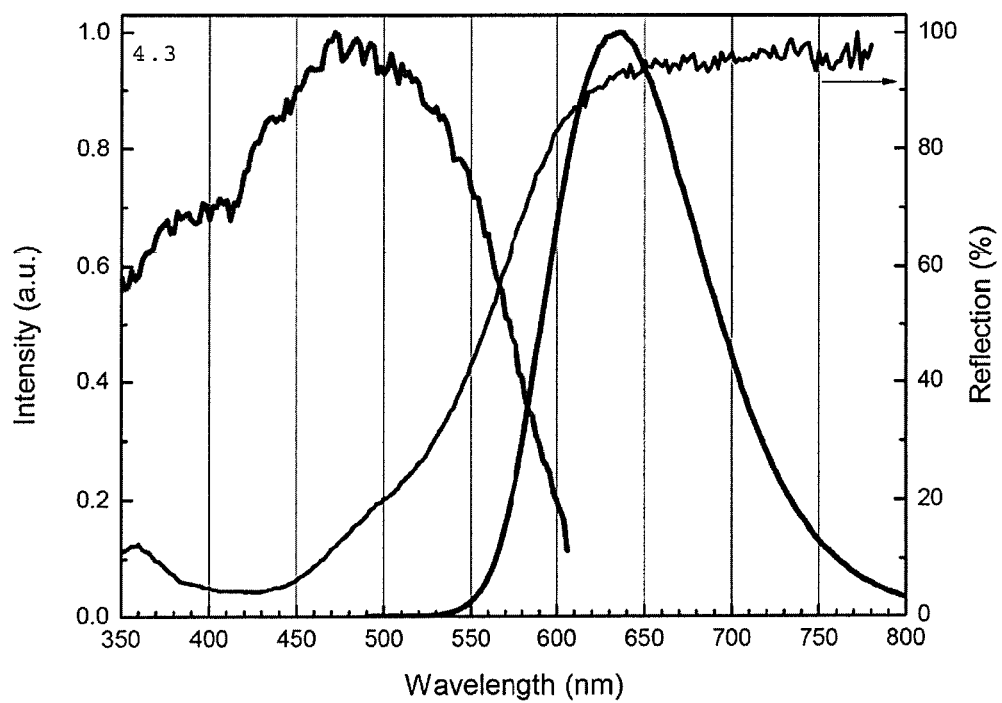
FIG. 30 depicts the excitation and emission spectra under blue excitation at 453 nm, as well as the reflection spectra, for sample 4.3 of composition (4).
Figure 31:
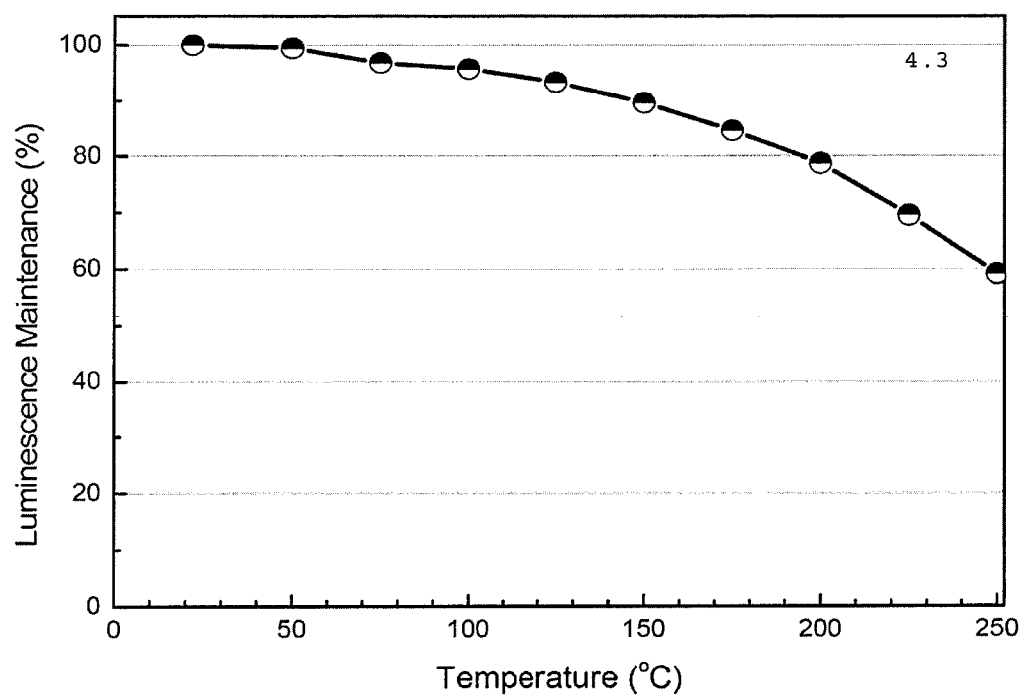
FIG. 31 depicts the thermal stability for sample 4.3 of composition (4) under blue excitation at 453 nm.

$Sr_{2-w}Li_{2w}Si_{5-m}Al_mN_{8-[(4x/3)+z+m]}C_xO_{(3z/2)+m}$:Eu. FIG. 29 shows the Rietveld refinement of the powder XRD pattern for an example of this phosphor (sample 4.3). It is clear that the obtained product is a pure single phase solid solution of silicon carbidonitride phosphor, whose structure is similar to that of $Sr_2Si_5N_8$ nitride material. In this type of structure, Li and Al atoms are distributed on Sr and Si sites, respectively. FIG. 30 illustrates the excitation, emission and diffuse reflection spectra of phosphor sample 4.3. This red emitting phosphor can be efficiently excited by near-UV and blue light and yields high quantum efficiency. Additionally, this kind of the phosphors processes high thermal stability, as shown in FIG. 31, with a small degradation of the emission intensity (<15% at 150° C. vs. the initial intensity at room temperature).

TABLE 16

Crystallographic data for sample 4.3,
$Sr_{2-w}Li_{2w}Si_{5-m}Al_mN_{8-[(4x/3)+z+m]}C_xO_{(3z/2)+m}$:$Eu^{2+}$
(x = 1, w = 0.05, z = 0.1, m = 0.2)

| | |
|---|---|
| Chemical formula | $Sr_{1.85}Li_{0.1}Eu_{0.1}Si_{4.8}Al_{0.2}N_{6.3667}CO_{0.35}$ |
| Crystal system | Orthorhombic |
| Space group | $Pmn2_1$ (No. 31) |
| Z | 2 |
| Lattice parameters (Å) | a = 5.7169(1), b = 6.7901(1), c = 9.3657(1) |
| Unit cell volume (Å³) | 363.55(1) |

In comparison with other silicon carbidonitride materials without Li—Al addition, the emission band of $Eu^{2+}$ is located at relatively long wavelength.

Example 4.3

Figure 32:
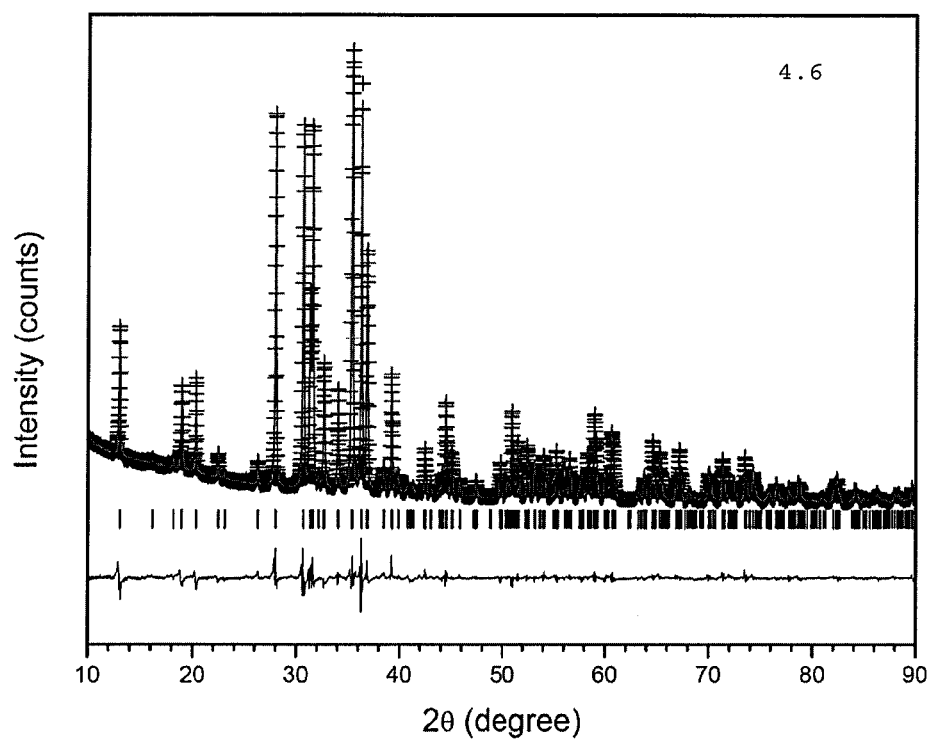
FIG. 32 depicts the Rietveld Refinement of the XRD pattern for sample 4.6 of composition (4) $Sr_{2-w}Li_{2w}Si_{5-m}Al_mN_{8-[(4x/3)+z+m]}C_xO_{(3z/2)+m}:Eu^{2+}$ (x=2, w=0, z=0.1, m=0.2).
Figure 33:
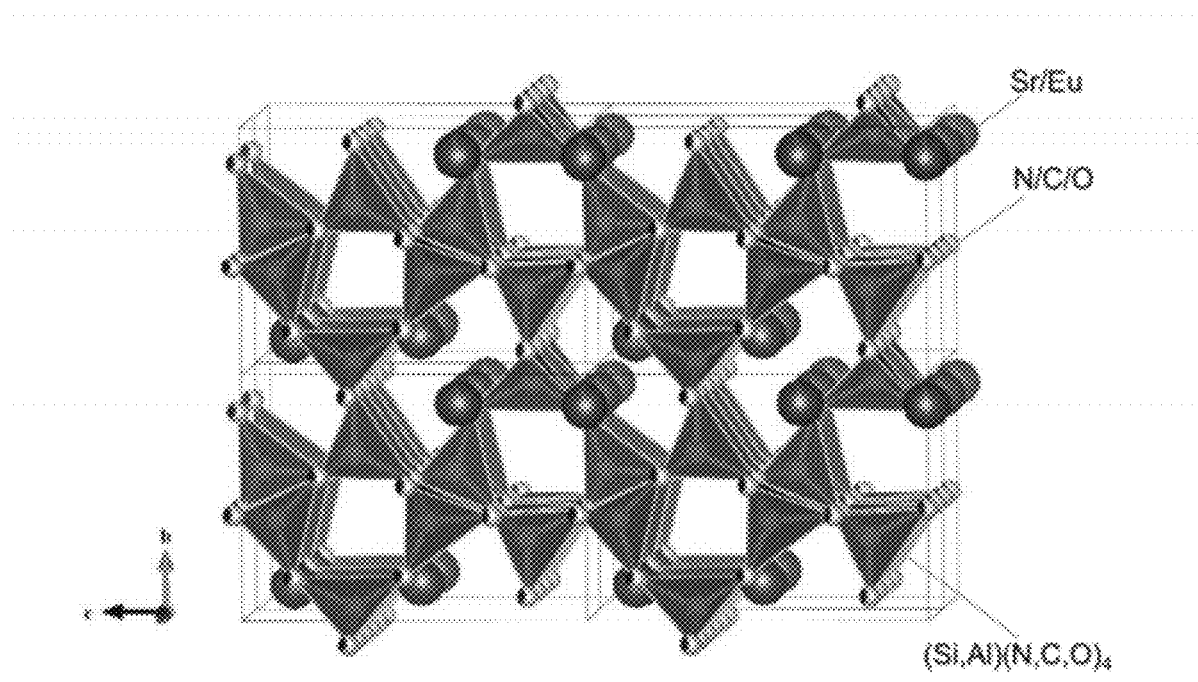
FIG. 33 depicts the projected crystal structure of sample 4.7 for $Sr_{2-w}Li_{2w}Si_{5-m}Al_mN_{8-[(4x/3)+z+m]}C_xO_{(3z/2)+m}:Eu^{2+}$ (x=2, w=0, z=0.1, m=0.2).
Figure 34:
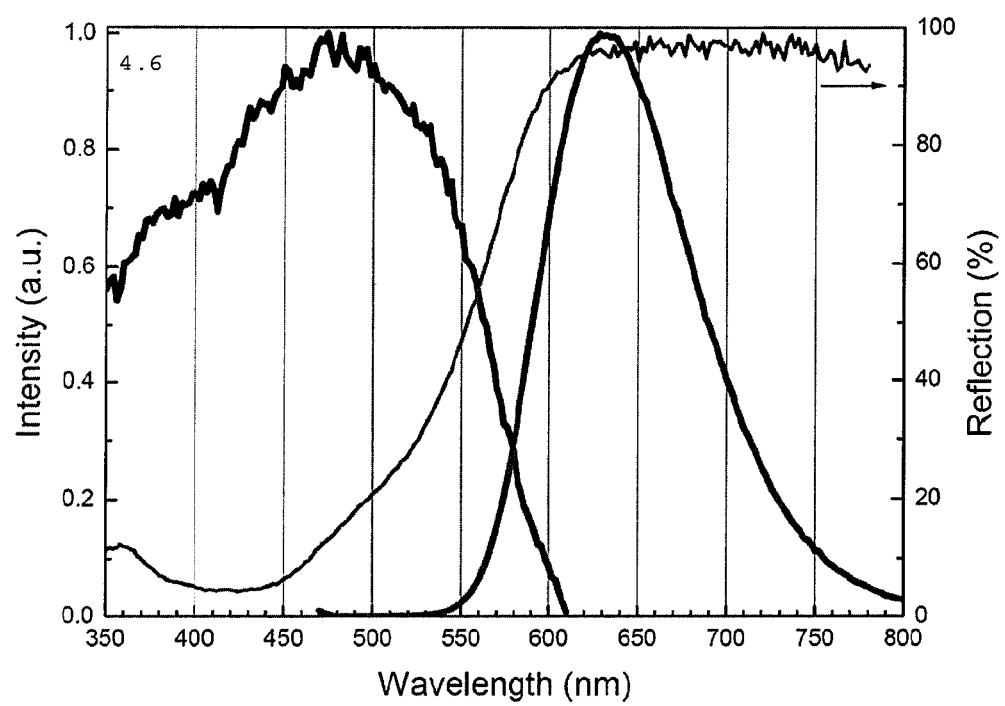
FIG. 34 depicts the excitation and emission spectra (under blue excitation at 453 nm), as well as the reflectance spectra, of $Sr_{2-w}Li_{2w}Si_{5-m}Al_mN_{8-[(4x/3)+z+m]}C_xO_{(3z/2)+m}:Eu^{2+}$ (x=2, w=0, z=0.1, m=0.2) (sample 4.6).
Figure 35:
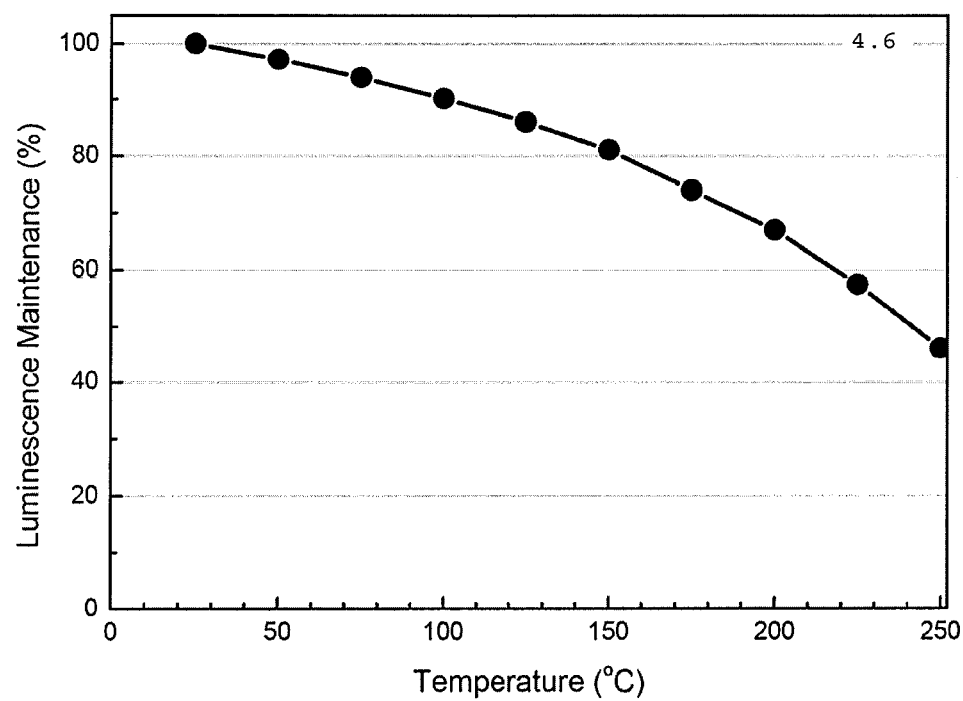
FIG. 35 depicts the thermal stability for sample 4.6 of composition (4) under blue excitation at 453 nm.
Figure 36:
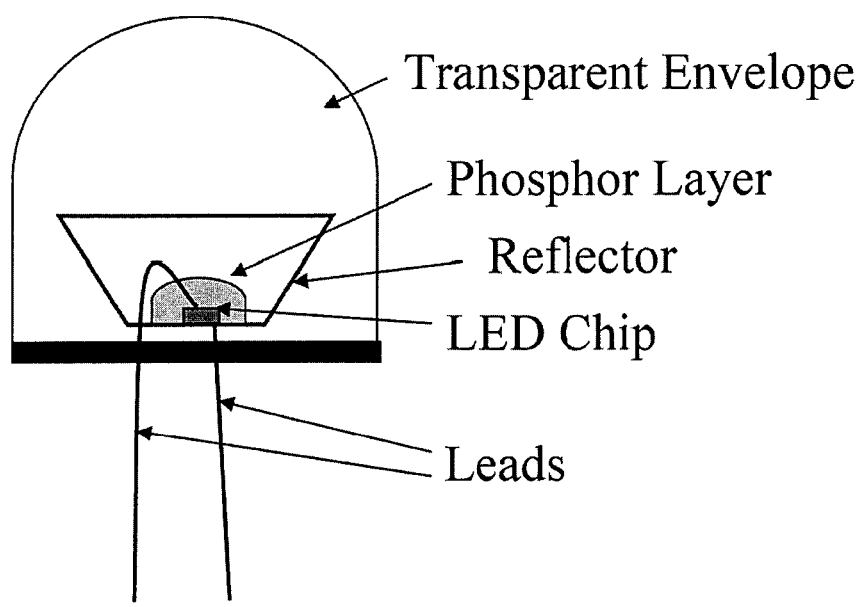
FIG. 36 depicts an embodiment of the light emitting device of the present invention.
Figure 37:
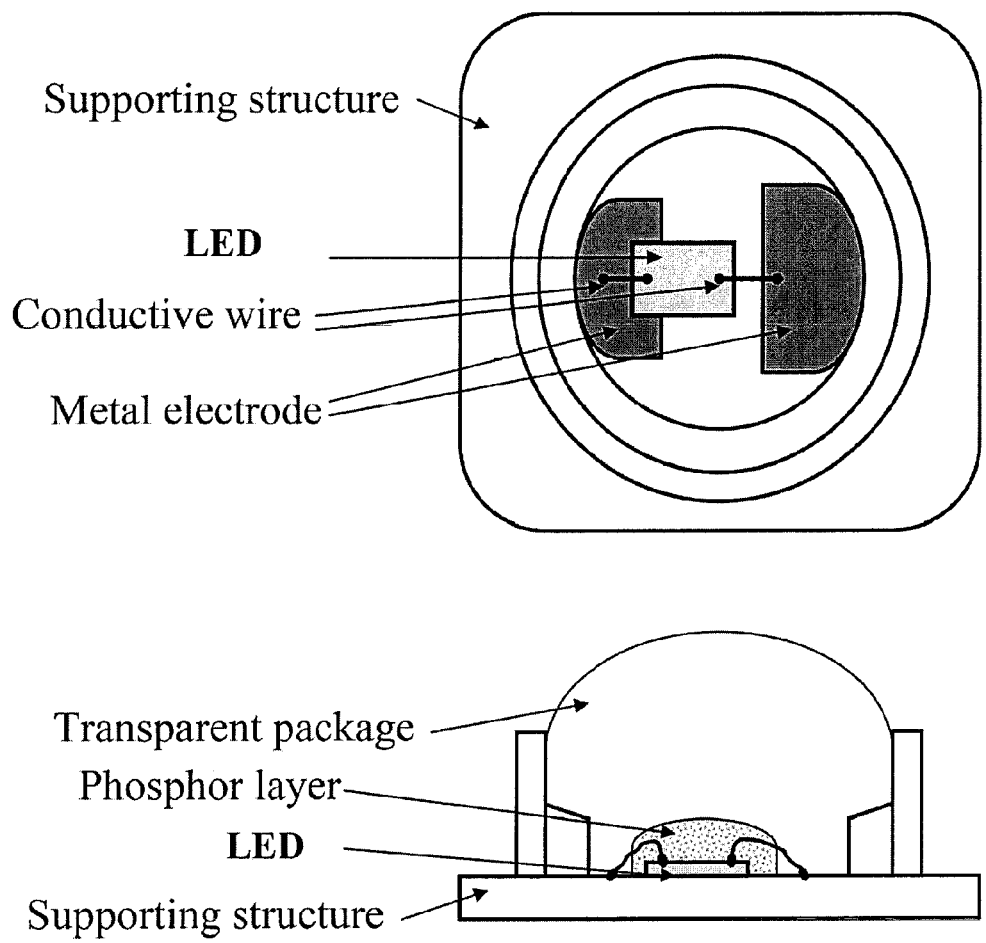
FIG. 37 depicts an embodiment of the light emitting device of the present invention.

$Sr_{2-w}Li_{2w}Si_{5-m}Al_mN_{8-[(4x/3)+z+m]}C_xO_{(3z/2)+m}$:Eu (w=0). Rietveld refinement of the XRD pattern of this sample (sample 4.6) indicates that this product is a high purity single phase phosphor (see FIG. 32). The structure of the phosphor is similar to that compound $Sr_2Si_5N_8$ with slight divergence from the nitride structure due to the incorporation of C and Al—O in the lattice. The crystal structure data are summarized in Table 17, and the projected crystal structure is shown in FIG. 33. FIG. 34 illustrates the excitation, emission and diffuse reflection spectra of the phosphor (sample 4.6) of phosphor composition $Sr_{2-w}Li_{2w}Si_{5-m}Al_mN_{8-[(4x/3)+z+m]}C_xO_{(3z/2)+m}$:$Eu^{2+}$ (x=2, w=0, z=0.1, m=0.2). This kind of phosphor composition $Sr_{2-w}Li_{2w}Si_{5-m}Al_mN_{8-[(4x/3)+z+m]}C_xO_{(3z/2)+m}$:$Eu^{2+}$ (x=2, w=0, z=0.1, m=0.2) has a strong absorption band in the range of 370-550 nm and emits red light with broad emission peak at about 630 nm as shown in FIG. 34. The thermal quenching of the phosphor is shown in FIG. 35. The lumen maintenance is above 80% at 150° C., indicating that this kind of phosphors has high thermal stability of $Eu^{2+}$ emission.

TABLE 17

Crystallographic data for sample 4.6,
$Sr_{2-w}Li_{2w}Si_{5-m}Al_mN_{8-[(4x/3)+z+m]}C_xO_{(3z/2)+m}$:$Eu^{2+}$
(x = 2, w = 0, z = 0.1, m = 0.2)

| | |
|---|---|
| Chemical formula | $Sr_{1.9}Eu_{0.1}Si_{4.8}Al_{0.2}N_{5.0333}C_2O_{0.35}$ |
| Crystal system | Orthorhombic |
| Space group | $Pmn2_1$ (No. 31) |
| Z | 2 |
| Lattice parameters (Å) | a = 5.7129(1), b = 6.7827(1), c = 9.3634(1) |
| Unit cell volume (Å³) | 362.82(1) |

| Atom | x/a | y/b | z/c | $U_{iso}$ * 100 | Site | S.O.F |
|---|---|---|---|---|---|---|
| Sr1 | 0.00000 | 0.86795 | 0.00132 | 1.47 | 2a | 0.950 |
| Eu1 | 0.00000 | 0.86795 | 0.00132 | 1.47 | 2a | 0.050 |
| Sr2 | 0.00000 | 0.87845 | 0.36952 | 1.06 | 2a | 0.950 |
| Eu2 | 0.00000 | 0.87845 | 0.36952 | 1.06 | 2a | 0.050 |
| Si1 | 0.25395 | 0.66779 | 0.68346 | 1.28 | 4b | 0.960 |
| Al1 | 0.25395 | 0.66779 | 0.68346 | 1.28 | 4b | 0.040 |
| Si2 | 0.00000 | 0.05444 | 0.67351 | 0.94 | 2a | 0.960 |
| Al2 | 0.00000 | 0.05444 | 0.67351 | 0.94 | 2a | 0.040 |
| Si3 | 0.00000 | 0.40771 | 0.46049 | 1.09 | 2a | 0.960 |
| Al3 | 0.00000 | 0.40771 | 0.46049 | 1.09 | 2a | 0.040 |
| Si4 | 0.00000 | 0.41556 | 0.90158 | 1.01 | 2a | 0.960 |
| Al4 | 0.00000 | 0.41556 | 0.90158 | 1.01 | 2a | 0.040 |
| N1 | 0.00000 | 0.17903 | 0.52933 | 0.13 | 2a | 0.629 |
| C1 | 0.00000 | 0.17903 | 0.52933 | 0.13 | 2a | 0.250 |
| O1 | 0.00000 | 0.17903 | 0.52933 | 0.13 | 2a | 0.044 |
| N2 | 0.24756 | 0.91496 | 0.68147 | 0.86 | 4b | 0.629 |
| C2 | 0.24756 | 0.91496 | 0.68147 | 0.86 | 4b | 0.250 |
| O2 | 0.24756 | 0.91496 | 0.68147 | 0.86 | 4b | 0.044 |
| N3 | 0.25151 | 0.44139 | 0.01164 | 0.98 | 4b | 0.629 |
| C3 | 0.25151 | 0.44139 | 0.01164 | 0.98 | 4b | 0.250 |
| O3 | 0.25151 | 0.44139 | 0.01164 | 0.98 | 4b | 0.044 |
| N4 | 0.00000 | 0.58312 | 0.77866 | 0.90 | 2a | 0.629 |
| C4 | 0.00000 | 0.58312 | 0.77866 | 0.90 | 2a | 0.250 |
| O4 | 0.00000 | 0.58312 | 0.77866 | 0.90 | 2a | 0.044 |
| N5 | 0.00000 | 0.17092 | 0.84992 | 0.75 | 2a | 0.629 |
| C5 | 0.00000 | 0.17092 | 0.84992 | 0.75 | 2a | 0.250 |
| O5 | 0.00000 | 0.17092 | 0.84992 | 0.75 | 2a | 0.044 |
| N6 | 0.00000 | 0.42643 | 0.27510 | 0.95 | 2a | 0.629 |
| C6 | 0.00000 | 0.42643 | 0.27510 | 0.95 | 2a | 0.250 |
| O6 | 0.00000 | 0.42643 | 0.27510 | 0.95 | 2a | 0.044 |

Example 5

Preparation and properties of a phosphor composition of family (5) $M(II)_aM(I)_bM(III)_cD_dE_eC_fF_gH_h$:A A sample of phosphor composition $M(II)_aM(I)_bM(III)_cD_dE_eC_fF_gH_h$:A (where M(II)=Sr, D=Si, E=N, and H=F; a=1.9, b=0, c=0, d=5, e=6.9, f=1, g=0, h=0.3) was made by a solid state reaction with the starting materials $Sr_2N$, $Si_3N_4$, SiC, and $EuF_3$ in the designed rations listed in Table 18.

TABLE 18

Weight amount of the raw materials for preparing composition $M(II)_aM(I)_bM(III)_cD_dE_eC_fF_gH_h$:A.

| | Weight of raw materials (g) | | | |
|---|---|---|---|---|
| Example | $Sr_2N$ | $Si_3N_4$ | SiC | $EuF_3$ |
| 5.1 | 1.2211 | 1.2857 | 0.2756 | 0.1436 |

TABLE 19

Luminescence properties for M(II)$_a$M(I)$_b$M(III)$_c$D$_d$E$_e$C$_f$F$_g$H$_h$:A

| | Luminescence Characteristics ($\lambda_{exc}$ = 453 nm) | | | |
|---|---|---|---|---|
| Example | QE (%) | Emission (%) | FWHM(nm) | $\lambda_{em}$ (nm) |
| 5.1 | 92.7 | 91.3 | 107 | 633 |

Example 6

Preparation of PcLEDs

The phosphor compositions of the present invention can be combined with a light emitting diode (LED) to form a lighting device. The lighting device generally generates a light emission with a color adjusted from that of the LED. A red-emitting carbidonitride phosphor composition of the present invention, for example and without limitation, was mixed with a resin encapsulant to form a phosphor-filled slurry. The slurry was then applied onto a blue-emitting LED chip in the design shown in FIGS. 36-39. In practice, the phosphors were mixed with a silicone resin (silicone, Shin-Etsu LPS-2511). The phosphor-filled encapsulant slurry was then injected onto an AlGaN-based, blue-emitting LED chip followed by a curing treatment according to the manufacturer's curing schedule.

Example 6.1

Figure 40:
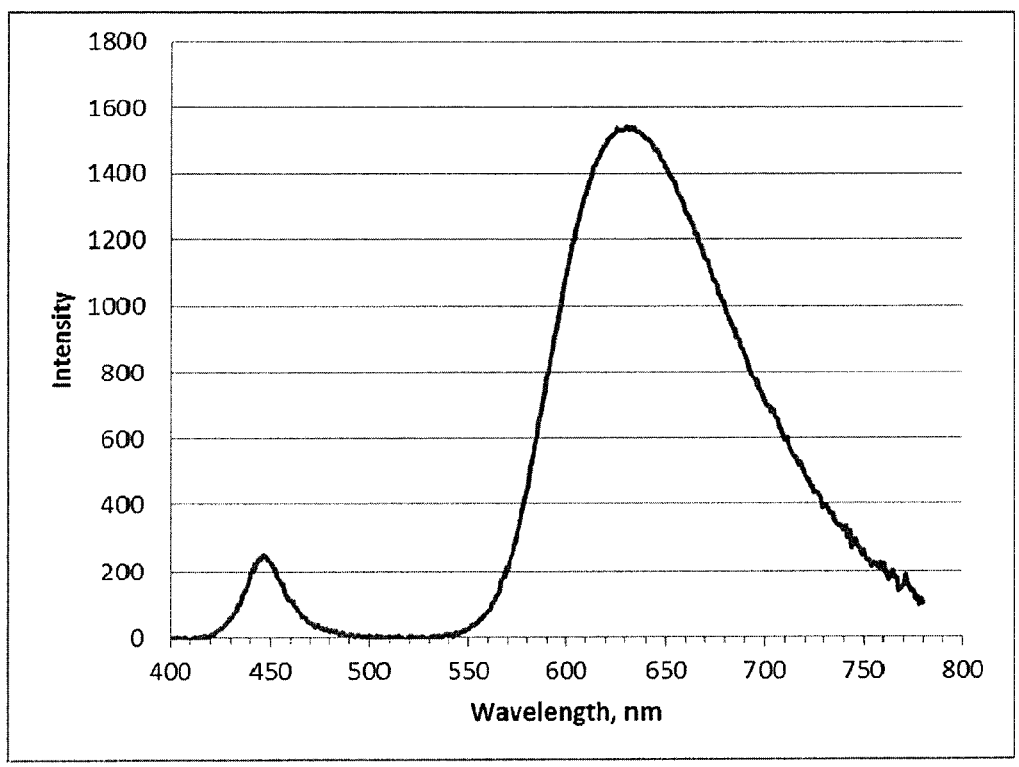
FIG. 40 depicts the emission spectrum of a pcLED comprising a blue-emitting LED emitting at 453 nm and a red-emitting phosphor of composition (1) (sample 1.29).

A pcLED consisting of a blue-emitting LED and a red emitting phosphor. FIG. 40 shows the emission spectrum of the lighting device in which a red-emitting phosphor of the composition (1) (sample 1.29) is packaged with a blue-emitting LED in the lamp structure of FIG. 37. The emission light has a pink color.

Example 6.2

Figure 41:
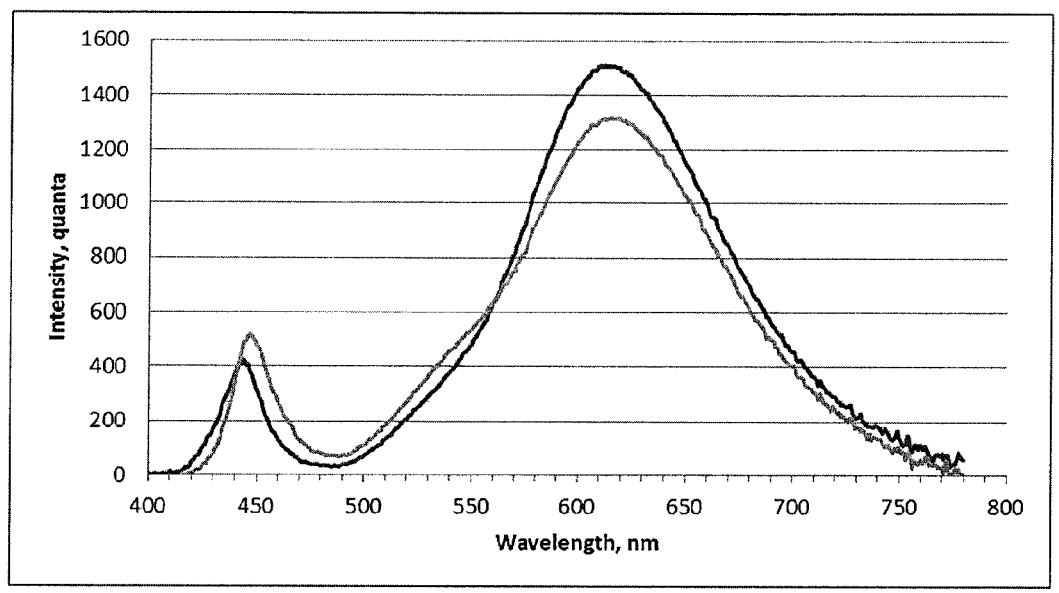
FIG. 41 depicts the emission spectra of the pcLEDs of Example 6.2. The curve with the higher peak is for Device I of Example 6.2. The curve with the lower peak is for Device II of Example 6.2.

White light pcLEDs. White light pcLEDs were prepared by combining a red-emitting phosphor of composition (1) (sample 1.29) and a yellow- or green-emitting phosphor (2nd phosphor in table below) with a blue-emitting LED in the device structure shown in FIG. 37. The phosphor blend is mixed in a silicone resin in the ratios listed in Table 20. The emission spectra of the pcLEDs are shown in FIG. 41. The luminance performance of the pcLEDs are shown in Table 21. The results demonstrate that the emission of the phosphor of composition (1) helps to achieve a warm white lighting device with CCT=2016K and 2311K in the pcLEDs.

TABLE 20

The phosphor loading amount in pcLEDs of Example 6.2.

| | Loading of sample 1.29 | Loading of 2nd phosphor | Total Phosphor Loading, wt % of slurry |
|---|---|---|---|
| Device I | 25 wt % | Yellow-emitting YAG: Ce 75 wt % | 7.41 |
| Device II | 25 wt % | Green-emitting Sr$_{6.72}$Eu$_{0.28}$Si$_{12}$O$_{13}$N$_{11}$C 75 wt % | 7.41 |

TABLE 21

The luminance performance of the pcLEDs.

| | luminous flux, lm | luminous efficacy (lm/elec W) | pcLED Chromaticity | | CRI | CCT | Duv |
|---|---|---|---|---|---|---|---|
| | | | x | y | | | |
| Device I | 26.3 | 31.0 | 0.499 | 0.378 | 76 | 2016K | 0.012 |
| Device II | 25.4 | 29.9 | 0.467 | 0.374 | 84 | 2311K | 0.014 |

The present invention is not to be limited in scope by the specific embodiments disclosed in the examples which are intended as illustrations of a few aspects of the invention and any embodiments that are functionally equivalent are within the scope of this invention. Indeed, various modifications of the invention in addition to those shown and described herein will become apparent to those skilled in the art and are intended to fall within the scope of the appended claims.

We claim:

1. A composition comprising a phosphor having the formula $$Sr_2Si_5N_{8-[(4x/3)+z]}C_xO_{3z/2}:A$$

wherein 0<x≦5.0; wherein 0.06≦z≦0.1; wherein ((4x/3)+z)<8; wherein x≠3z/2; and wherein A comprises a luminescence activator doped in the host crystal of the phosphor.

2. A composition comprising a phosphor having the formula $$M(II)_2Si_5N_{8-[(4x/3)+z]}C_xO_{3z/2}:A$$

wherein 1.0≦x≦2.0; wherein 0≦z≦0.1; wherein ((4x/3)+z)<8; wherein x≠3z/2, wherein M(II) comprises at least one divalent cation; and, wherein A comprises a luminescence activator doped in the host crystal of the phosphor.

3. A composition comprising a phosphor having the formula $$M(II)_{2-w}M(I)_{2w}Si_5N_{8-[(4x/3)+z]}C_xO_{3z/2}:A$$

wherein 0.5≦x≦3.0; wherein 0≦z≦0.1; wherein 0.05≦w≦0.5; wherein ((4x/3)+z)<8;
    wherein x≠3z/2; wherein M(II) comprises at least one divalent cation; wherein M(I) comprises at least one monovalent cation; and, wherein A comprises a luminescence activator doped in the host crystal of the phosphor.

4. A light emitting device comprising:
a light source emitting a first luminescence spectrum; and
a phosphor composition, which, when irradiated with light from the light source, emits light having a second luminescence spectrum;
wherein the phosphor composition comprises at, least one phosphor having a formula selected from the group consisting of:
(a) $Sr_2Si_5N_{8-[(4x/3)+z]}C_xO_{3z/2}$:A, wherein 0<x≦5.0; wherein 0.06≦z≦0.1; wherein ((4x/3)+z)<8; and, wherein x≠3z/2;
(b) M(II)$_2$Si$_5$N$_{8-[(4x/3)+z]}$C$_x$O$_{3z/2}$:A, wherein 1.0≦x≦2.0; wherein 0≦z≦0.1; wherein ((4x/3)+z)<8; and, wherein x≠3Z/2;
(c) M(II)$_{2-w}$M(I)$_{2w}$Si$_5$N$_{8-[(4x/3)+z]}$C$_x$O$_{3z/2}$:A, wherein 0.5≦x≦3.0; wherein 0≦z≦0.1; wherein 0.05≦w≦0.5; wherein ((4x/3)+z)<8; and, wherein x≠3z/2;
wherein M(II) comprises at least one divalent cation;
wherein M(I) comprises at least one monovalent cation;

wherein C comprises a tetravalent anion of carbon; and,
wherein A comprises, a luminescence activator doped in the host crystal.

5. The composition of claim 1, wherein A comprises a luminescence activator selected from the group consisting of Ce, Pr, Nd, Sm, Eu, Gd, Tb, Dy, Ho, Er, Tm, Yb, Lu, Mn, Bi, and Sb.

6. The composition of claim 1, wherein A is Eu.

7. The composition of claim 1, wherein A is doped in the host crystal of the phosphor at a concentration level of from about 0.001 mol % to about 20 mol % relative to the mole amount of Sr.

8. The composition of claim 1, further comprising one or more additional phosphors.

9. The composition of claim 1, wherein the phosphor comprises a crystal of an orthorhombic or a monoclinic system.

10. The composition of claim 2, wherein M(II) comprises at least one divalent cation selected from the group consisting of Be, Mg, Ca, Sr, Ba, Cu, Co, Ni, Pd, Zn, and Cd.

11. The composition of claim 2, wherein M(II) comprises at least one divalent cation selected from the group consisting of Ca, Sr, and Ba.

12. The composition of claim 10, wherein M(II) comprises two or more divalent cations.

13. The composition of claim 2, wherein A comprises a luminescence activator selected from the group consisting of Ce, Pr, Nd, Sm, Eu, Gd, Tb, Dy, Ho, Er, Tm, Yb, Lu, Mn, Bi, and Sb.

14. The composition of claim 2, wherein A is Eu.

15. The composition of claim 2, wherein A is doped in the host crystal of the phosphor at a concentration level of from about 0.001 mol % to about 20 mol % relative to the mole amount of M(II).

16. The composition of claim 2, further comprising one or more additional phosphors.

17. The composition of claim 2, wherein the phosphor comprises a crystal of an orthorhombic or a monoclinic system.

18. The composition of claim 3, wherein M(II) comprises at least one divalent cation selected from the group consisting of Be, Mg, Ca, Sr, Ba, Cu, Co, Ni, Pd, Zn, and Cd.

19. The composition of claim 3, wherein M(II) comprises at least one divalent cation selected from the group consisting of Ca, Sr, and Ba.

20. The composition of claim 18, wherein M(II) comprises two or more divalent cations.

21. The composition of claim 3, wherein M(I) comprises at least one monovalent cation selected from the group consisting of Li, Na, K, Rb, Cu, Ag and Au.

22. The composition of claim 3, wherein M(I) comprises at least one monovalent cation selected from the group consisting of Li, Na, and K.

23. The composition of claim 21, wherein M(I) comprises two or more monovalent cations.

24. The composition of claim 3, wherein A comprises a luminescence activator selected from the group consisting of Ce, Pr, Nd, Sm, Eu, Gd, Tb, Dy, Ho, Er, Tm, Yb, Lu, Mn, Bi, and Sb.

25. The composition of claim 3, wherein A is Eu.

26. The composition of claim 3, wherein A is doped in the host crystal of the phosphor at a concentration level of from about 0.001 mol % to about 20 mol % relative to the total mole amount of M(II) and M(I).

27. The composition of claim 3, further comprising one or more additional phosphors.

28. The composition of claim 3, wherein the phosphor comprises a crystal of an orthorhombic or a monoclinic system.

29. The light emitting device of claim 4, wherein:
M(II) comprises at least one divalent cation selected from the group consisting of Be, Mg, Ca, Sr, Bo, Cu, Co, Ni, Pd, Zn, and Cd;
M(I) comprises at least one monovalent cation selected from the group consisting of Li, Na, K, Rb, Cu, Ag and Au;
C comprises a tetravalent anion of carbon; and,
A comprises at least one luminescence activator selected from the group consisting of Ce, Pr, Nd, Sm, Eu, Gd, Tb, Dy, Ho, Er, Tm, Yb, Lu, Mn, Bi, and Sb.

30. The light emitting device of claim 4, wherein the first luminescence spectrum has a peak in wavelength range from about 250 nm to about 700 nm.

31. The light emitting device of claim 4, wherein the first luminescence spectrum has a peak in wavelength range from about 400 nm to about 550 nm.

32. The light emitting device of claim 4, wherein the light source is a light emitting diode or a laser diode.

33. The light emitting device of claim 4, further comprising one or more additional phosphors.

34. The light emitting device of claim claim 4, wherein the additional phosphor emits red, yellow, orange, green, or blue light when excited by a light source.

35. The light emitting device of claim claim 4, further comprising a second phosphor having a formula selected from the group consisting of: $Ca_{1-x}Sr_xGa_2S_4:Eu^{2+}$ ($0 \leq x \leq 1$), $Ca_{1-x-y-z}Mg_xSr_yBa_zSiO_4:Eu^{2+}$ ($0 \leq x \leq 1$, $0 \leq y \leq 1$, $0 \leq z \leq 1$, $x+y+z \leq 1$), $BaMgAl_{10}O_{17}:Eu^{2+},Mn^{2+}$, $MYSi_4N_7:Eu^{2+}$ (M=Ca, Sr, Ba), β-sialon:$Eu^{2+}$, $MSi_2O_2N_2:Eu^{2+}$ (M=Mg, Ca, Sr, Ba), $Ba_3Si_6O_{12}N_2:Eu^{2+}$, $M_2Si_5N_8:Ce^{3+}$ (M=Ca, Sr, Ba), $Y_2Si_4N_6C:Ce^{3+}$, α-sialon:$Yb^{2+}$, $(MSiO_3)_m\cdot(SiO_2)_n:Eu^{2+}$, X (M=Mg, Ca, Sr, Ba; X=F, Cl, Br, I), where m is 1 or 0, and either (i) n>3 if m=1 or (ii) n=1 if m=0, $MAl_2O_4:Eu^{2+}$ (M=Mg, Ca, Sr, Ba), $BaMgAl_{10}O_{17}:Eu^{2+}$, $Y_3Al_5O_{12}:Ce^{3+}$, and α-sialon:$Eu^{2+}$.

36. The light emitting device of claim 4, further comprising a second phosphor having a formula selected from the group consisting of:
(a) $M(II)_aSi_bO_cN_dC_e:A$, wherein 6<a<8, 8<b<14, 13<c<17, 5<d<9, 0<e<2;
(b) $M(II)_7Al_{12-x-y}Si_{x+y}O_{25-x}N_{x-y}C_y:A$, wherein 0<x≤12, 0<y<x, and 0<x+y≤12;
(c) $M(II)_7M(III)_{12-x-y}Si_{x+y}O_{25-x}N_{x-y}C_y:A$, wherein 0<x≤12, 0<x+y≤12, and 0<y<x;
(d) $M(II)_7M(III)_{12-x-y}Si_{x+y}O_{25-x\pm3\delta/2}N_{x\mp\delta-y}C_y:A$, wherein 0<x<12, 0≤y<x, 0<x+y≤12, 0<δ≤3, and δ<x+y;
(e) $M(II)_7M(III)_{12-x-y}Si_{x+y}O_{25-x\pm\delta/2}N_{x\mp\delta-y}C_{y\pm\delta/2}:A$, wherein 0<x<12, 0≤y<x, 0<x+y≤12, 0<δ≤3, and δ<x+y;
(f) $M(II)_{7-y}M(I)_yM(III)_{12-x-y-z}Si_{x+y+z}O_{25-x\pm3\delta/2}N_{x\mp\delta-z}C_z:A$, wherein 0<x<12, 0≤y<x, 0<z<x, 0<x+y+z≤12, z<x+δ, and 0<δ≤3;
(g) $M(II)_{7-y}M(I)_yM(III)_{12-x-y-z}Si_{x+y+z}O_{25-x\pm\delta/2}N_{x\mp\delta-z}C_{z\pm\delta/2}:A$, wherein 0<x<12, 0≤y<x, 0<z<x, 0<x+y+z≤12, z<x+δ, and 0<δ≤3;
(h) $M(II)_{7-y}M(I)_yM(III)_{12-x-y-z}Si_{x+y+z}O_{25-x\pm3\delta/2-v/2}N_{x\mp\delta-z}C_zH_v:A$, wherein 0<x<12, 0≤y<1, 0<z<x, z<x+δ, 0<δ≤3, 0≤v<1, and 0<x+y+z≤12; and
(i) $M(II)_{7-y}M(I)_yM(III)_{12-x-y-z}Si_{x+y+z}O_{25-x\pm\delta/2-v/2}N_{x\mp\delta-z}C_{z\pm\delta/2}H_v:A$, wherein 0<x<12, 0≤y<1, 0<z<x, z<x+δ, 0<δ≤3, 0≤v<1, and 0<x+y+z≤12;

wherein:
M(II) comprises at least one divalent cation;
M(I) comprises at least one monovalent cation;
M(III) comprises at least one trivalent cation;
H comprises at least one monovalent anion; and
A comprises a luminescence activator doped in the host crystal.

37. The light emitting device of claim 4, further comprising at least two additional phosphors, 38. The light emitting device of claim 4, further comprising at least one additional phosphor that emits light having a peak in wavelength range from about 350 nm to about 700 nm.

39. The light emitting device of claim 4, further comprising at least one additional phosphor that emits light having a peak in wavelength range from about 480 nm to about 640 nm.

40. The light emitting device of claim 4, further comprising at least one additional phosphor that emits light having a peak in wavelength range from about 520 nm to about 600 nm.

41. The light emitting device of claim 4, wherein the device emits white light.

42. The light emitting device of claim 4, wherein the device emits cool white light.

43. The light emitting device of claim 4, wherein the device emits warm white light.

44. The light emitting device of claim 4, wherein the device emits light having a peak in wavelength range from about 400 nm to about 600 nm.

45. The light emitting device of claim 4, wherein the device emits light having a peak in wavelength range from about 520 nm to about 600 nm.

46. The light emitting device of claim 4, wherein the device emits light having a peak in wavelength range from about 380 nm to about 750 nm.

47. The light emitting device of claim 4, wherein the device emits light having, a peak in wavelength range from about 400 nm to about 700 nm.

* * * * *